US006054854A

United States Patent [19]

Kawamoto

[11] Patent Number: 6,054,854

[45] Date of Patent: Apr. 25, 2000

[54] ARRANGEMENT OF COIL WINDINGS FOR MR SYSTEMS

[75] Inventor: Hiromi Kawamoto, Yaita, Japan

[73] Assignee: Kabushiki Kaisha Toshiba, Kawasaki, Japan

[21] Appl. No.: 08/903,689

[22] Filed: Jul. 31, 1997

[30] Foreign Application Priority Data

Jul. 31, 1996 [JP] Japan .................................... 8-202650
Jul. 29, 1997 [JP] Japan .................................... 9-203529

[51] Int. Cl.[7] ........................................ G01V 3/00

[52] U.S. Cl. ........................... 324/318; 324/319; 600/410

[58] Field of Search .................................... 324/318, 322, 324/309, 312, 319; 600/410, 422; 335/296

[56] References Cited

U.S. PATENT DOCUMENTS 5,334,937 8/1994 Peck et al. .............................. 324/318
5,512,828 4/1996 Pausch et al. .......................... 324/309

FOREIGN PATENT DOCUMENTS 60-132303 7/1985 Japan .
62-143012 6/1987 Japan .

OTHER PUBLICATIONS

Turner, "Gradient Coil Design: A Review of Methods", Magnetic Resonance Imaging, vol. 11, pp. 903–920, 1993.

Carlson et al, "Design and Evaluation of Shielded Gradient Coils", Magenetic Resonance in Medicine, vol. 26, pp. 191–206, 1992.

*Primary Examiner*—Christine K. Oda
*Assistant Examiner*—Brij B. Shrivastav
*Attorney, Agent, or Firm*—Nixon & Vanderhye P.C.

[57] ABSTRACT

Although magnet coil windings are distributed discontinuously, the distribution of magnetic fields generated actually approaches a desired continuous distribution. The desired continuous distribution is defined analytically, as closely as possible. A system for acquiring magnetic resonance data has a coil segment formed by winding a conductor on a bobbin representing an axial direction. A magnetic field is generated by supplying current into the conductor. Winding positions at which the conductor is wound turn-by-turn on the bobbin are determined in agreement with a specified current step value and sequentially from a winding positioned at an outermost end of the coil segment in the axial direction. Additionally, a shunt element for shunting the current carried turn-by-turn is arranged in the coil segment in relation to a pattern of turns of the coil segment by winding the conductor into a plurality of current flows through a plurality of shunt paths.

70 Claims, 42 Drawing Sheets

| (a) | | (b) | |
|---|---|---|---|
| MAIN COIL WINDING POSITION (m) | Ic=99.345(A) CURRENT BY TURN (XIc(A)) | SHIELD COIL WINDING POSITION (m) | Is=99.345(A) CURRENT BY TURN (XIs(A)) |
| 0.06096 | 1 | 0.06887 | -1 |
| 0.10474 | 1 | 0.11857 | -1 |
| 0.13424 | 1 | 0.15224 | -1 |
| 0.15778 | 1 | 0.17926 | -1 |
| 0.17781 | 1 | 0.20238 | -1 |
| 0.19547 | 1 | 0.22287 | -1 |
| 0.21140 | 1 | 0.24144 | -1 |
| 0.22598 | 1 | 0.25853 | -1 |
| 0.23950 | 1 | 0.27446 | -1 |
| 0.25215 | 1 | 0.28944 | -1 |
| 0.26407 | 1 | 0.30362 | -1 |
| 0.27536 | 1 | 0.31715 | -1 |
| 0.28613 | 1 | 0.33010 | -1 |
| 0.29643 | 1 | 0.34257 | -1 |
| 0.30632 | 1 | 0.35462 | -1 |
| 0.31586 | 1 | 0.36631 | -1 |
| 0.32507 | 1 | 0.37767 | -1 |
| 0.33400 | 1 | 0.38875 | -1 |
| 0.34268 | 1 | 0.39959 | -1 |
| 0.35112 | 1 | 0.41021 | -1 |
| 0.35935 | 1 | 0.42064 | -1 |
| 0.36739 | 1 | 0.43092 | -1 |
| 0.37527 | 1 | 0.44105 | -1 |
| 0.38298 | 1 | 0.45107 | -1 |
| 0.39055 | 1 | 0.46098 | -1 |
| 0.39799 | 1 | 0.47082 | -1 |
| 0.40532 | 1 | 0.48060 | -1 |
| 0.41253 | 1 | 0.49033 | -1 |
| 0.41965 | 1 | 0.50004 | -1 |
| 0.42667 | 1 | 0.50973 | -1 |
| 0.43362 | 1 | 0.51944 | -1 |
| 0.44049 | 1 | 0.52917 | -1 |
| 0.44729 | 1 | 0.53895 | -1 |
| 0.45404 | 1 | 0.54879 | -1 |
| 0.46073 | 1 | 0.55872 | -1 |

(continued to right column))

(continued from left column)

| | | | |
|---|---|---|---|
| 0.46738 | 1 | 0.56876 | -1 |
| 0.47398 | 1 | 0.57893 | -1 |
| 0.48055 | 1 | 0.58927 | -1 |
| 0.48710 | 1 | 0.59981 | -1 |
| 0.49362 | 1 | 0.61060 | -1 |
| 0.50012 | 1 | 0.62166 | -1 |
| 0.50661 | 1 | 0.63308 | -1 |
| 0.51310 | 1 | 0.64490 | -1 |
| 0.51959 | 1 | 0.65724 | -1 |
| 0.52608 | 1 | 0.67019 | -1 |
| 0.53258 | 1 | 0.68393 | -1 |
| 0.53910 | 1 | 0.69868 | -1 |
| 0.54565 | 1 | 0.71477 | -1 |
| 0.55222 | 1 | 0.73277 | -1 |
| 0.55884 | 1 | 0.75368 | -1 |
| 0.56550 | 1 | 0.77967 | -1 |
| 0.57221 | 1 | 0.81726 | -1 |
| 0.57898 | 1 | 0.90554 | -1 |
| 0.58583 | 1 | | |
| 0.59275 | 1 | | |
| 0.59977 | 1 | | |
| 0.60689 | 1 | | |
| 0.61414 | 1 | | |
| 0.62152 | 1 | | |
| 0.62905 | 1 | | |
| 0.63677 | 1 | | |
| 0.64468 | 1 | | |
| 0.65283 | 1 | | |
| 0.66125 | 1 | | |
| 0.66999 | 1 | | |
| 0.67911 | 1 | | |
| 0.68869 | 1 | | |
| 0.69882 | 1 | | |
| 0.70966 | 1 | | |
| 0.72143 | 1 | | |
| 0.73446 | 1 | | |
| 0.74940 | 1 | | |
| 0.76760 | 1 | | |
| 0.79378 | 1 | | |

FIG. 11

| (a) | | (b) | |
|---|---|---|---|
| MAIN COIL WINDING POSITION (m) | Ic=99.345(A) CURRENT BY TURN (XIc(A)) | SHIELD COIL WINDING POSITION (m) | Is=99.345(A) CURRENT BY TURN (XIs(A)) |
| 0.06096 | 1 | 0.09404 | -1 |
| 0.10474 | 1 | 0.13414 | -1 |
| 0.13424 | 1 | 0.16421 | -1 |
| 0.15778 | 1 | 0.18918 | -1 |
| 0.17781 | 1 | 0.21093 | -1 |
| 0.19547 | 1 | 0.23042 | -1 |
| 0.21140 | 1 | 0.24821 | -1 |
| 0.22598 | 1 | 0.26469 | -1 |
| 0.23950 | 1 | 0.28011 | -1 |
| 0.25215 | 1 | 0.29466 | -1 |
| 0.26407 | 1 | 0.30848 | -1 |
| 0.27536 | 1 | 0.32169 | -1 |
| 0.28613 | 1 | 0.33436 | -1 |
| 0.29643 | 1 | 0.34658 | -1 |
| 0.30632 | 1 | 0.35841 | -1 |
| 0.31586 | 1 | 0.36989 | -1 |
| 0.32507 | 1 | 0.38106 | -1 |
| 0.33400 | 1 | 0.39198 | -1 |
| 0.34268 | 1 | 0.40266 | -1 |
| 0.35112 | 1 | 0.41314 | -1 |
| 0.35935 | 1 | 0.42344 | -1 |
| 0.36739 | 1 | 0.43359 | -1 |
| 0.37527 | 1 | 0.44361 | -1 |
| 0.38298 | 1 | 0.45351 | -1 |
| 0.39055 | 1 | 0.46333 | -1 |
| 0.39799 | 1 | 0.47307 | -1 |
| 0.40532 | 1 | 0.48275 | -1 |
| 0.41253 | 1 | 0.49240 | -1 |
| 0.41965 | 1 | 0.50202 | -1 |
| 0.42667 | 1 | 0.51163 | -1 |
| 0.43362 | 1 | 0.52126 | -1 |
| 0.44049 | 1 | 0.53092 | -1 |
| 0.44729 | 1 | 0.54062 | -1 |
| 0.45404 | 1 | 0.55039 | -1 |
| 0.46073 | 1 | 0.56026 | -1 |

(continued to right column)

(continued from left column)

| | | | |
|---|---|---|---|
| 0.46738 | 1 | 0.57023 | -1 |
| 0.47398 | 1 | 0.58034 | -1 |
| 0.48055 | 1 | 0.59062 | -1 |
| 0.48710 | 1 | 0.60110 | -1 |
| 0.49362 | 1 | 0.61183 | -1 |
| 0.50012 | 1 | 0.62284 | -1 |
| 0.50661 | 1 | 0.63419 | -1 |
| 0.51310 | 1 | 0.64596 | -1 |
| 0.51959 | 1 | 0.65824 | -1 |
| 0.52608 | 1 | 0.67114 | -1 |
| 0.53258 | 1 | 0.68482 | -1 |
| 0.53910 | 1 | 0.69951 | -1 |
| 0.54565 | 1 | 0.71555 | -1 |
| 0.55222 | 1 | 0.73350 | -1 |
| 0.55884 | 1 | 0.75435 | -1 |
| 0.56550 | 1 | 0.78030 | -1 |
| 0.57221 | 1 | 0.81788 | -1 |
| 0.57898 | 1 | 0.90628 | -1 |
| 0.58583 | 1 | | |
| 0.59275 | 1 | | |
| 0.59977 | 1 | | |
| 0.60689 | 1 | | |
| 0.61414 | 1 | | |
| 0.62152 | 1 | | |
| 0.62905 | 1 | | |
| 0.63677 | 1 | | |
| 0.64468 | 1 | | |
| 0.65283 | 1 | | |
| 0.66125 | 1 | | |
| 0.66999 | 1 | | |
| 0.67911 | 1 | | |
| 0.68869 | 1 | | |
| 0.69882 | 1 | | |
| 0.70966 | 1 | | |
| 0.72143 | 1 | | |
| 0.73446 | | | |
| 0.74940 | | | |
| 0.76760 | | | |
| 0.79378 | | | |

FIG. 13

PSI [A*turn]

SECTION OF COIL

| (a) | | (b) | |
|---|---|---|---|
| MAIN COIL WINDING POSITION (m) | Ic=99.345(A) CURRENT BY TURN (XIc(A)) | SHIELD COIL WINDING POSITION (m) | Is=99.345(A) CURRENT BY TURN (XIs(A)) |
| 0.06096 | 1 | 0.00000 | -0.5 |
| 0.10474 | 1 | 0.04000 | -0.5 |
| 0.13424 | 1 | 0.09404 | -1 |
| 0.15778 | 1 | 0.13414 | -1 |
| 0.17781 | 1 | 0.16421 | -1 |
| 0.19547 | 1 | 0.18918 | -1 |
| 0.21140 | 1 | 0.21093 | -1 |
| 0.22598 | 1 | 0.23042 | -1 |
| 0.23950 | 1 | 0.24821 | -1 |
| 0.25215 | 1 | 0.26469 | -1 |
| 0.26407 | 1 | 0.28011 | -1 |
| 0.27536 | 1 | 0.29466 | -1 |
| 0.28613 | 1 | 0.30848 | -1 |
| 0.29643 | 1 | 0.32169 | -1 |
| 0.30632 | 1 | 0.33436 | -1 |
| 0.31586 | 1 | 0.34658 | -1 |
| 0.32507 | 1 | 0.35841 | -1 |
| 0.33400 | 1 | 0.36989 | -1 |
| 0.34268 | 1 | 0.38106 | -1 |
| 0.35112 | 1 | 0.39198 | -1 |
| 0.35935 | 1 | 0.40266 | -1 |
| 0.36739 | 1 | 0.41314 | -1 |
| 0.37527 | 1 | 0.42344 | -1 |
| 0.38298 | 1 | 0.43359 | -1 |
| 0.39055 | 1 | 0.44361 | -1 |
| 0.39799 | 1 | 0.45351 | -1 |
| 0.40532 | 1 | 0.46333 | -1 |
| 0.41253 | 1 | 0.47307 | -1 |
| 0.41965 | 1 | 0.48275 | -1 |
| 0.42667 | 1 | 0.49240 | -1 |
| 0.43362 | 1 | 0.50202 | -1 |
| 0.44049 | 1 | 0.51163 | -1 |
| 0.44729 | 1 | 0.52126 | -1 |
| 0.45404 | 1 | 0.53092 | -1 |
| 0.46073 | 1 | 0.54062 | -1 |

(continued to right column)

(continued from left column)

| | | | |
|---|---|---|---|
| 0.46738 | 1 | 0.55039 | -1 |
| 0.47398 | 1 | 0.56026 | -1 |
| 0.48055 | 1 | 0.57023 | -1 |
| 0.48710 | 1 | 0.58034 | -1 |
| 0.49362 | 1 | 0.59062 | -1 |
| 0.50012 | 1 | 0.60110 | -1 |
| 0.50661 | 1 | 0.61183 | -1 |
| 0.51310 | 1 | 0.62284 | -1 |
| 0.51959 | 1 | 0.63419 | -1 |
| 0.52608 | 1 | 0.64596 | -1 |
| 0.53258 | 1 | 0.65824 | -1 |
| 0.53910 | 1 | 0.67114 | -1 |
| 0.54565 | 1 | 0.68482 | -1 |
| 0.55222 | 1 | 0.69951 | -1 |
| 0.55884 | 1 | 0.71555 | -1 |
| 0.56550 | 1 | 0.73350 | -1 |
| 0.57221 | 1 | 0.75435 | -1 |
| 0.57898 | 1 | 0.78030 | -1 |
| 0.58583 | 1 | 0.81788 | -1 |
| 0.59275 | 1 | 0.87164 | -0.5 |
| 0.59977 | 1 | 0.97011 | -0.5 |
| 0.60689 | 1 | | |
| 0.61414 | 1 | | |
| 0.62152 | 1 | | |
| 0.62905 | 1 | | |
| 0.63677 | 1 | | |
| 0.64468 | 1 | | |
| 0.65283 | 1 | | |
| 0.66125 | 1 | | |
| 0.66999 | 1 | | |
| 0.67911 | 1 | | |
| 0.68869 | 1 | | |
| 0.69882 | 1 | | |
| 0.70966 | 1 | | |
| 0.72143 | 1 | | |
| 0.73446 | 1 | | |
| 0.74940 | 1 | | |
| 0.76760 | 1 | | |
| 0.79378 | 1 | | |

FIG. 20

FIG. 23a
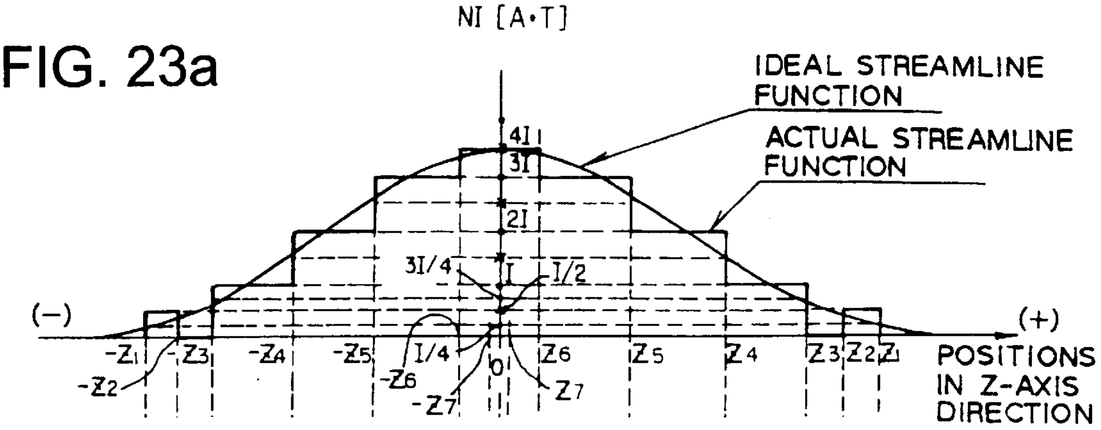
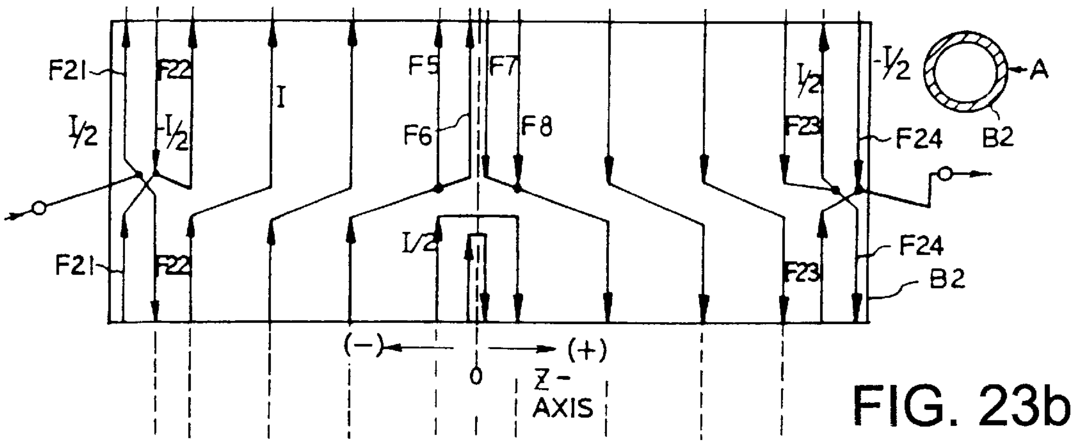
FIG. 23b
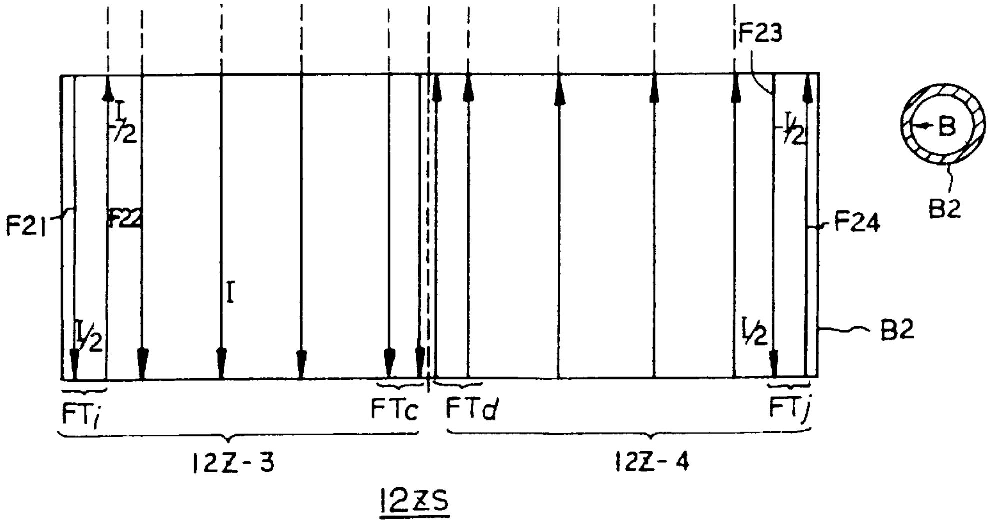
FIG. 23c

| (a) | | (b) | |
|---|---|---|---|
| MAIN COIL WINDING POSITION (m) | Ic=99.345(A) CURRENT BY TURN (XIc(A)) | SHIELD COIL WINDING POSITION (m) | Is=99.345(A) CURRENT BY TURN (XIs(A)) |
| 0.06096 | 1 | 0.00000 | -0.5 |
| 0.10474 | 1 | 0.04000 | -0.5 |
| 0.13424 | 1 | 0.09404 | -1 |
| 0.15778 | 1 | 0.13414 | -1 |
| 0.17781 | 1 | 0.16421 | -1 |
| 0.19547 | 1 | 0.18918 | -1 |
| 0.21140 | 1 | 0.21093 | -1 |
| 0.22598 | 1 | 0.23042 | -1 |
| 0.23950 | 1 | 0.24821 | -1 |
| 0.25215 | 1 | 0.26469 | -1 |
| 0.26407 | 1 | 0.28011 | -1 |
| 0.27536 | 1 | 0.29466 | -1 |
| 0.28613 | 1 | 0.30848 | -1 |
| 0.29643 | 1 | 0.32169 | -1 |
| 0.30632 | 1 | 0.33436 | -1 |
| 0.31586 | 1 | 0.34658 | -1 |
| 0.32507 | 1 | 0.35841 | -1 |
| 0.33400 | 1 | 0.36989 | -1 |
| 0.34268 | 1 | 0.38106 | -1 |
| 0.35112 | 1 | 0.39198 | -1 |
| 0.35935 | 1 | 0.40266 | -1 |
| 0.36739 | 1 | 0.41314 | -1 |
| 0.37527 | 1 | 0.42344 | -1 |
| 0.38298 | 1 | 0.43359 | -1 |
| 0.39055 | 1 | 0.44361 | -1 |
| 0.39799 | 1 | 0.45351 | -1 |
| 0.40532 | 1 | 0.46333 | -1 |
| 0.41253 | 1 | 0.47307 | -1 |
| 0.41965 | 1 | 0.48275 | -1 |
| 0.42667 | 1 | 0.49240 | -1 |
| 0.43362 | 1 | 0.50202 | -1 |
| 0.44049 | 1 | 0.51163 | -1 |
| 0.44729 | 1 | 0.52126 | -1 |
| 0.45404 | 1 | 0.53092 | -1 |
| 0.46073 | 1 | 0.54062 | -1 |

(continued to right column)

(continued from left column)

| | | | |
|---|---|---|---|
| 0.46738 | 1 | 0.55039 | -1 |
| 0.47398 | 1 | 0.56026 | -1 |
| 0.48055 | 1 | 0.57023 | -1 |
| 0.48710 | 1 | 0.58034 | -1 |
| 0.49362 | 1 | 0.59062 | -1 |
| 0.50012 | 1 | 0.60110 | -1 |
| 0.50661 | 1 | 0.61183 | -1 |
| 0.51310 | 1 | 0.62284 | -1 |
| 0.51959 | 1 | 0.63419 | -1 |
| 0.52608 | 1 | 0.64596 | -1 |
| 0.53258 | 1 | 0.65824 | -1 |
| 0.539 0 | 1 | 0.67114 | -1 |
| 0.545 6 | 1 | 0.68482 | -1 |
| 0.552 2 | 1 | 0.69951 | -1 |
| 0.558 8 | 1 | 0.71555 | -1 |
| 0.565 0 | 1 | 0.73350 | -1 |
| 0.572 2 | 1 | 0.75435 | -1 |
| 0.57898 | 1 | 0.78030 | -1 |
| 0.58583 | 1 | 0.81788 | -1 |
| 0.59275 | 1 | 0.90628 | -1 |
| 0.59977 | 1 | 0.97500 | 0.5 |
| 0.60689 | 1 | 1.03500 | -0.5 |
| 0.61414 | 1 | | |
| 0.62152 | 1 | | |
| 0.62905 | 1 | | |
| 0.63677 | 1 | | |
| 0.64468 | 1 | | |
| 0.65283 | 1 | | |
| 0.66125 | 1 | | |
| 0.66999 | 1 | | |
| 0.67911 | 1 | | |
| 0.68869 | 1 | | |
| 0.69882 | 1 | | |
| 0.70966 | 1 | | |
| 0.72143 | 1 | | |
| 0.73446 | 1 | | |
| 0.74940 | 1 | | |
| 0.76760 | 1 | | |
| 0.79378 | 1 | | |

FIG. 24

FIG. 27a
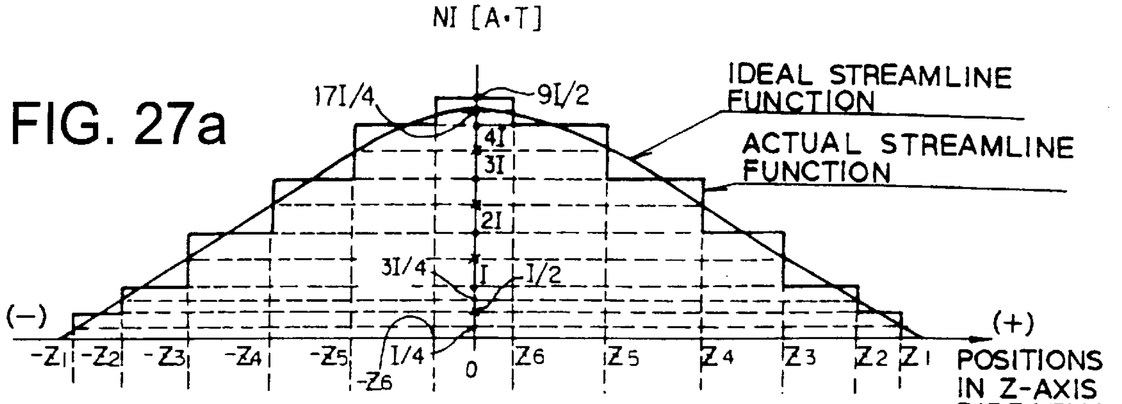
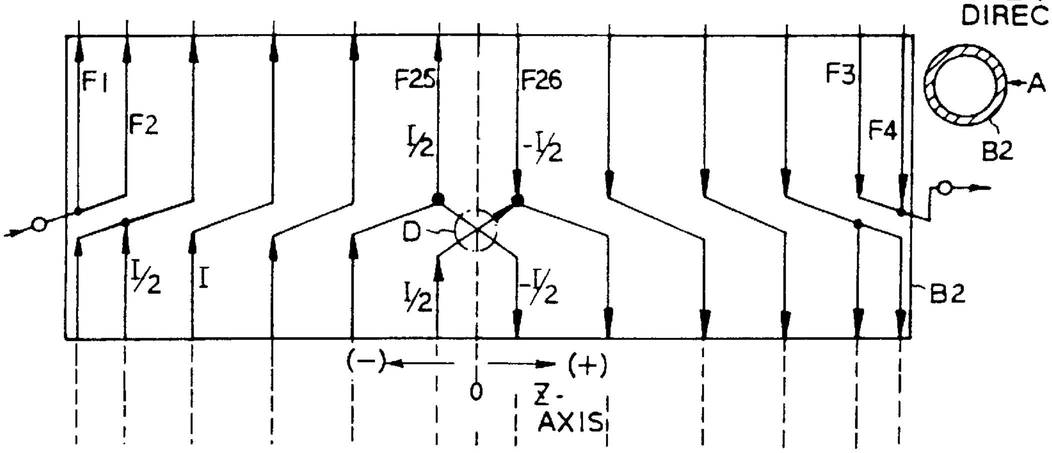
FIG. 27b
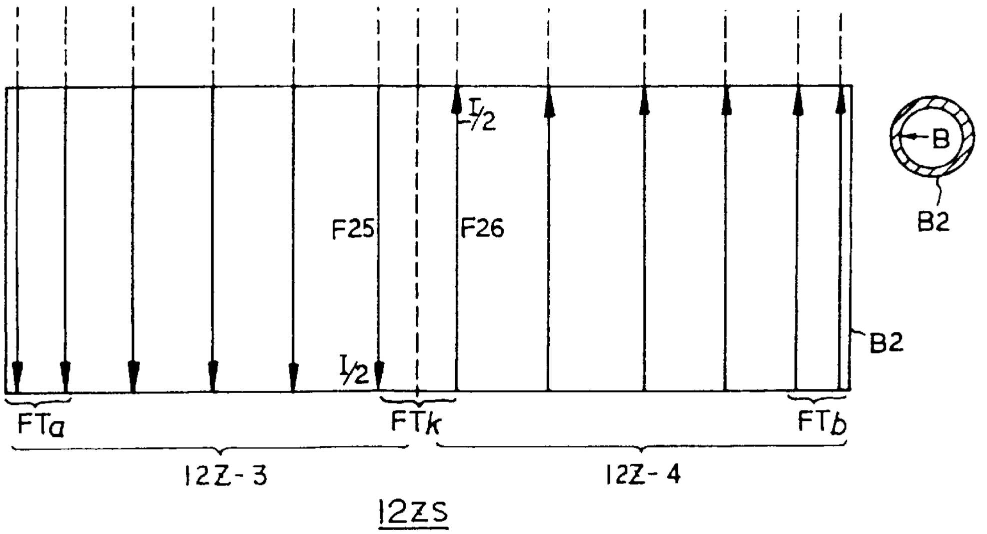
FIG. 27c

FIG. 28a
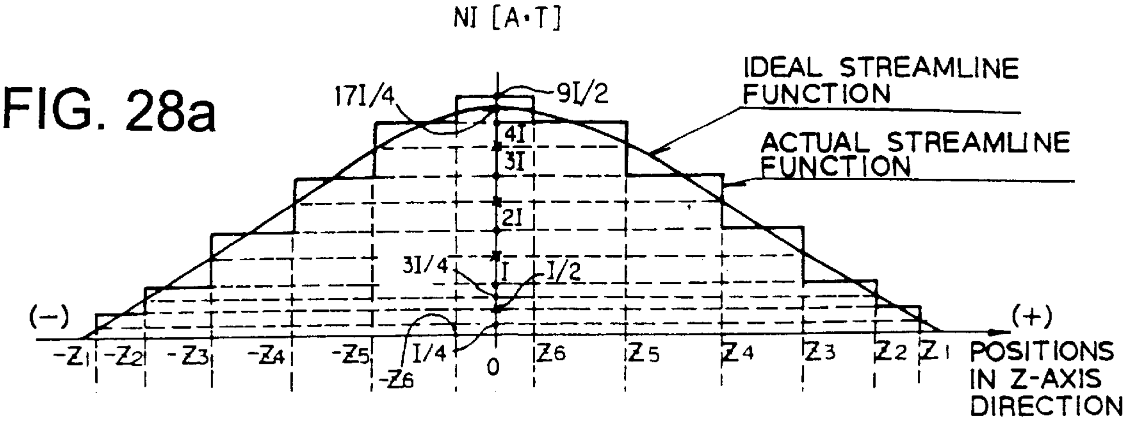
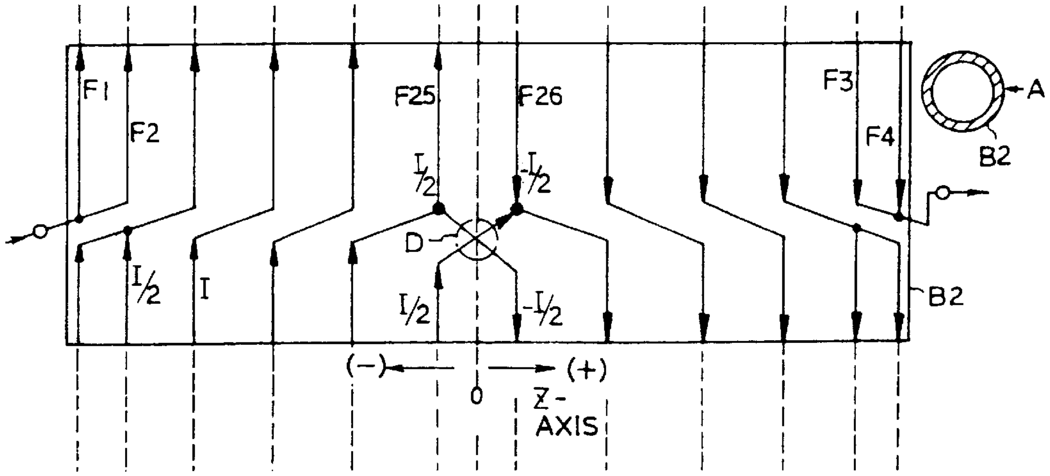
FIG. 28b
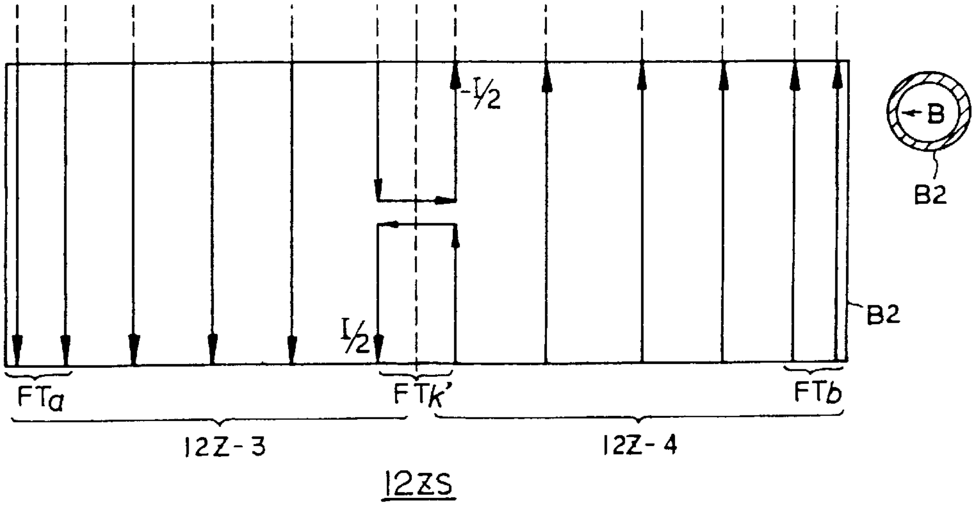
FIG. 28c

OR

ARRANGEMENT OF COIL WINDINGS FOR MR SYSTEMS

BACKGROUND OF THE INVENTION

1. Field of the Invention

The present invention relates to a coil unit for generating magnetic fields exhibiting desired spatial distribution. More particularly, this invention is concerned with an epoch-making way of winding a coil to be included in a magnetic-field generation coil unit preferably of a magnetic resonance imaging (MRI) system or magnetic resonance spectroscopy (MRS) system that utilizes a resonance phenomenon exhibited by nuclear spins of a subject.

2. Description of the Related Art

A coil for generating a magnetic field is an indispensable element for many electric circuits or electric equipment. The gantry of a medical-purpose magnetic resonance imaging (MRI) system or magnetic resonance spectroscopy (MRS) system is one such system. A static coil for generating a static magnetic field, shim coils used to compensate for inhomogeneities in the static magnetic field, gradient coils for generating a magnetic field gradient to be superposed on the static magnetic field, and a radio-frequency coil used to transmit or receive radio-frequency signals are used as magnetic-field generation coils.

These coils employed in an MRI or MRS system are, unlike an inductive element in an ordinary electric circuit, requested to meet another requirement that they must generate magnetic fields exhibiting a spatially desired distribution (also having a desired magnetic field strength). In particular, the gradient coils to which a pulsating current is fed are supposed to meet requirements defining switching characteristics such as the rise time required until a maximum magnetic field gradient strength is attained.

A space in which a subject and the radio-frequency coil are inserted must be preserved inside the gantry of the MRI or MRS system. Various coils are arranged around the space. The gantry itself therefore tends to get large in size. Currently, it is sought to improve the ability to generate magnetic fields while avoiding an increase in size. A coil layer containing the static coil, shim coils, and gradient coils must be wound as thinly as possible. Especially, in the case of gradient coils to be stored in an already-defined-size bore of the static coil (for example, a superconducting magnet), the coil layer must be wound in a layer.

With respect to the gradient coils, shielded coils capable of preventing magnetic leakage have been widely adopted in recent years. One of the shielded gradient coils is an actively (self-) shielded gradient coil (ASGC). This coil assembly has a dual coil structure having a main coil enclosed with a shield coil. It is therefore required that the main coil and shield coil are each wound in a layer in order to realize a thin coil assembly.

As far as a coil assembly employed in an MRI or MRS system is concerned, the positions of windings forming a coil must be determined so that a spatially desired distribution of magnetic fields can be attained. As a known method of designing a coil, a technique using a continuous distribution or function to design a coil that exhibits a desired distribution of magnetic field is well-known. Also known is a technique described in "Gradient Coil Design: A Review of Methods" written by R. Turner (Magnetic Resonance Imaging, Vol. 11, pp.903–920, 1993). According to Turner's proposal, "integrated currents (amp-turns)" are calculated by integrating a distribution of current densities (See FIG. 7(A) in p. 911 in the same thesis). Spatial positions associated with the integrated values of current densities are defined as coil positions by increasing the same value on a curve indicating the integrated values. This technique is called "target field approach in Turner's proposal.

Still, as a conventional coil arrangement design technique, a distribution of current densities is used to determine the positions of windings, which is described, for example, in "Designing an NMR Actively Shielded Gradient Coil" written by Kiyoshi Yoda (T. IEE Japan, Vol. 110-A, No. 4, p.275–281, 1990), is known. This technique is such that a desired distribution of current densities is calculated for an axial distance on a cylindrical bobbin of a coil, the distribution is integrated sequentially from the axial center of the bobbin toward each axial end thereof, and the positions of windings (turns) are determined from the axial center toward each axial end by examining axial points where the integrated values become I/2, I, . . . , I,I/2 (I: coil drive current value).

Thus, in the known method proposed by Yoda, an ideal continuous distribution of currents obtained analytically is replaced with a discontinuous distribution of currents externalized as windings (changed into a discrete distribution) in order to create a coil assembly having a wire wound in a layer.

However, in the foregoing method of designing a coil, since an ideal continuous distribution obtained analytically is replaced with discontinuous coil positions, an error occurring in an actual distribution of currents is basically unavoidable. For this reason, a desired ideal distribution of magnetic fields cannot be attained in many cases. Taking a gradient coil for instance, the linearities of magnetic field gradients realized with the continuous distribution deteriorate. Even the static coil and shim coils are designed according to the foregoing technique. For the same reason, there arises a problem that a distribution of magnetic fields deviates from a desired ideal state, and the homogeneities in a static magnetic field cannot be attained as expected. When an actual distribution of magnetic fields deviates from an ideal state, an adverse effect imposed on the qualities of MR images becomes serious, and the reliabilities of the images are impaired. From this viewpoint, there is a need for attaining a desired ideal distribution of magnetic fields.

In addition to basic problems concerning the change from continuity to discontinuity for attaining a discrete distribution, there are problems in the arrangement of coil windings proposed by A Yoda, which are described below.

A Yoda-proposed arrangement design needs a prerequisite that the design is carried out under strict restrictions including a condition where the peak value of a streamline function curve calculated based on a distribution of current densities supplied to a shield coil of Z channel is exactly an integer-times the coil drive current I. In the actual design, however, it will hardly happen that a solution to meet such condition will have found, in most cases, a remaining current which cannot covered by the windings being left. The remaining current thus appears at and have influence on the axial ends of a shield coil, because the positions of windings are determined from the axial center of the shield coil to the axial ends thereof. In consequence, at the axial end portions of a shield coil is provided a vacant gap which is relatively large and has no turns. Magnetic fluxes will leak because of the gap, causing eddy currents to flow on and in surrounding metal frames. In particular, the eddy currents thus-caused at the axial end portions have unfavorable deteriorating effects on the quality of MR images. On one hand, analytically designing the positions of windings of a coil based on Yoda's proposal should sacrifice its performance such as linearity. Additionally, the inductance and resistance values of the coil becomes large in Yoda's proposal, resulting in a larger-sized (i.e. enhanced power output) gradient coil. The coil design by Yoda's proposal is thus faced with various difficulties for practical use.

Still, in addition to the basic problem in changing into discrete winding positions described above, the conventional coil design techniques including the foregoing Yoda's proposal have problems as below.

First, there is a problem of physical restrictions to be imposed on an arrangement of windings forming a coil. Assuming that a coil having a wire is created by winding a wire, which has a certain width, about a cylindrical bobbin, the actual width of the coil is determined with the width over windings of the area most crowded with windings (turns) (area in which windings are most dense). In other words, there is the restriction that a wire wider than the width over windings of an area most crowded with windings cannot be used. Because of this restriction, when an ideal continuous distribution of currents is replaced with a discontinuous distribution of currents, a wide gap in which no wire exists is created between windings of a coil.

The gap between windings poses a serious problem on, especially, an actively shielded gradient coil. Whether a gradient coil is of a saddle type or solenoid type, the size of the gap varies depending on the position in a coil unit. A wide gap between windings allows magnetic fluxes to leak out. As a result, eddy currents are induced in an external conductor. Despite the actively shielded gradient coil, the magnetic fields affected by the eddy currents invite deterioration of qualities of MR images. This has become a serious problem in recent years.

The above situation will be described further. With the advancements of various electronic technologies and superconducting technologies, echo planar imaging (EPI) is one fast imaging technique enabling fast imaging that is faster than known spin echo (SE) imaging and fast spin echo (FAST SE) imaging and it has come to be a mainstream imaging technique in recent years. Spin echo imaging requires certain performance in relation to magnetic field gradients, for example, a maximum magnetic field gradient strength of 10 mT/m and a rise time of 1 msec required until the maximum magnetic field gradient strength is attained. By contrast, echo planar imaging requires certain performance in relation to magnetic field gradients, for example, a maximum magnetic field gradient strength of 30 mT/m and a rise time of 0.1 msec required until the maximum magnetic field gradient strength is attained.

With such increases in maximum magnetic field gradient strength and decreases in rise time, magnetic leakage increases. The increase in magnetic leakage brings about various deteriorations in image quality. This problem has become especially significant in recent years.

Even when the structure of an ASGC is adopted, the problem that eddy currents are induced is pointed out even in "Design and Evaluation of Shielded Gradient Coils" written by J. W. Carlson et al. (Magnetic Resonance Imaging, Vol. 26, pp.191–206, 1992). As for the problem that eddy currents are induced, various countermeasures have been proposed. The problem of eddy currents is solved by improving a pulse sequence used to acquire an MR signal or by optimizing the phase of an radio-frequency pulse to be applied.

However, when any of such proposed countermeasures is adopted, sequence control becomes complex. Besides, the practical efficacy is very low. The reasons are as follows: if magnetic fields affected by eddy currents exhibit the same spatial distribution (are the same magnetic field components) as magnetic field gradients, correction through pulse sequence control can be achieved. However, in reality, almost all magnetic fields affected by eddy currents contain magnetic components different from magnetic field gradients. It is, in principle, impossible to correct such magnetic fields affected by eddy currents on an ex post facto basis by controlling magnetic field gradients, a radio-frequency pulse, and a pulse sequence. In short, there is no better measure other than suppressing induction of eddy currents themselves. At present, eddy currents resultant from a gap between shielding windings included in a self-shielded gradient coil are thought to be unavoidable. This problem has remained unsolved.

For smoothing a distribution of actually generated magnetic fields and approximating it to a desired distribution of magnetic fields, it is thought that a markedly thin wire is used in order to increase the number of turns. However, such a coil has a markedly high resistance and inductance. Unless the current-carrying capacity of a power supply increases enormously, a current cannot be supplied to the coil. It is actually very hard to manufacture such a large-capacity power supply. At present, it is rather unfeasible to manufacture such a large-capacity power supply.

SUMMARY OF THE INVENTION

The present invention attempts to break through the aforesaid various difficulties underlying the prior art.

An object of the present invention is to provide, in particular, a system for acquiring magnetic resonance data comprising an ASGC having a coil segment generating a desired magnetic distribution, wherein at the axial end portions of a bobbin on which the coil segment is wound, the generation of eddy currents due to flux leakage can be minimized, avoiding excess deterioration in MR image quality.

Another object of the present invention is to provide a system for acquiring MR data, which is capable of approaching a distribution of magnetic fields to be generated actually to a desired continuous distribution obtained analytically while maintaining a structure in which windings (wire) are distributed discontinuously.

Another object of the present invention is to provide a system for acquiring MR data, which makes it possible to employ a power supply having a current-carrying capacity of a level accepted at present without the necessity of increasing the capacity of the power supply for feeding a current to a coil unit, and capable of approaching a distribution of magnetic fields to be generated actually to a desired continuous distribution obtained analytically while maintaining a structure, in which windings (wire) are distributed discontinuously, under the conditions for the power supply.

Yet another object of the present invention is to provide a system for acquiring MR data, which is preferably adaptable to a static coil, shim coils, and gradient coils.

Yet another object of the present invention is to provide a system for acquiring MR data, which when provided with a shielding ability, can fulfill the shielding ability by suppressing magnetic leakage or magnetostriction, and suppress unwanted eddy currents induced in surrounding metals.

Still another object of the present invention is to provide a system for acquiring MR data, in which ex post facto data correction may be used as a countermeasure, which is intended to eliminate the adverse effect of eddy currents, while approaching a distribution of magnetic fields to be generated actually to a desired spatial magnetic distribution and suppressing induction of the unwanted eddy currents in surrounding metals.

The present invention has been devised when the present inventor is motivated in pursuit of the structure of an MRI or MRA system which can provide a desired distribution of magnetic fields (that is, desired performance of a coil) and which can be realized using power supply and manufacturing facilities whose current-carrying capacity and scale are of levels accepted at present.

First, the first aspect of the present invention concerning coil winding techniques will be explained in comparison with the conventional technique proposed by Yoda.

An ASGC, the total current amount supplied through a main coil generating a gradient field can be expressed as follows;

$$Ic \times Nc$$

where Ic is a value of current flowing through the main coil and Nc is the total number of windings of the main coil. A shield coil, which is placed in a radially outer space of the main coil and generates a shielding magnetic field for the gradient field generated by the main coil, should have the total number of windings which is an integer, like the main coil. A value of current supplied into the shield coil can be obtained by dividing the analytically-requested total amount of current by a given total number of windings. This current value obtained by the division becomes a current step value for determining the winding positions (turn positions) of the shield coil. This is the basic principle of conventional techniques including Yoda's proposal.

Like the main coil, the total amount of current through the shield coil can be expressed by $$Is \times Ns$$

where Is is a current value through the shield coil and Ns is the total number of windings thereof.

When driven by the same power source, both the main and shield coils are electrically connected in series, and it is desirable that the currents Ic equal Is. Yoda's proposal is based on a specific restriction that Ic=Is and there is no remaining current which cannot be covered by the turns. This restriction offers a severe obstacle to designers. Thus, a more generalized coil arrangement design technique, which provides well-defined positions of windings of a coil without such specific restriction, has long been desired.

The present inventor paid attention to the direction to determine the positions of windings of a coil, since in the case of a Z channel, for example, it is a fact that the influence of eddy currents (caused by flux leakage) on MR image quality is less at the axial center portion of the coil than at the axial end portions thereof. Therefore, the present invention provides a technique, which gives priority to the axial end portions, by which the positions of windings are sequentially and turn by turn determined from each axially outermost winding position toward the axial center with the current step value for the main coil (or, a current step value for the shield coil, determined on the determination of the number of windings of the shield coil).

When representing the analytically-requested total current amount for shield coil by the current Is and total winding number Ns determined in the foregoing conventional manner, representing the total winding number Ns40 of the shield coil determined on the present invention, and representing a remaining current amount by dNI, $$Is \times Ns = Ic \times Ns' + dNI$$

is established.

Determining the positions of windings from each axial end position toward the axial center will cause the remaining current dNI to be collected to and concentrate in the axial center portion. In the Z channel, flows of the remaining current collected from each axial side are opposite to each other at the axial center portion, resulting in less magnetic field components in charge of the remaining current.

When a specific condition is realized which the remaining current dNI=O[A], the conventional Yoda's proposal is identical to the present invention in finally-determined winding positions. However, as described above, the remaining current amount dNI does not become zero in most cases. Therefore, using the generalized manner of the present invention makes it possible to determine the positions of windings for the shield coil connected to the main coil in series, regardless of a situation the remaining current amount dNI is equal to zero or not. Coil designers thus gain increased degrees of freedom in design.

On the above first aspect, there are provided features of the present invention as follows.

There is provided a system for acquiring magnetic resonance data having a coil segment formed by winding a conductor on a bobbin representing an axial direction, a magnetic field being generated by supplying current into the conductor. In the system, winding positions at which the conductor is wound turn by turn on the bobbin is determined in agreement with a specified current step value and sequentially from a winding positioned at an outermost end of the coil segment in the axial direction.

Preferably, the system further comprises an actively shielded gradient coil (ASGC) incorporating therein a Z coil having a main and shield coils and generating a gradient in a Z-direction defined by an XYZ-coordinate set for the system, and the coil segment being installed in the shield coil. It is also preferred that the shield coil having a coil segment group consisting of two of the coil segments wound around the bobbin in series electrical connection and series spatial arrangement states, the winding positions are sequentially determined from each winding positioned at each of outermost both ends of the coil segment in the axial direction toward a center of the coil segment in the axial direction. As an example, the specified current step value equals a value of current being supplied into the main coil.

Concerning coil winding, the second aspect of the present invention will be described below, which can compensate the foregoing first aspect or can solely be practiced.

For designing and manufacturing an actual coil unit, the coil unit must have a size enabling the coil unit to lie in a limited space. Moreover, there are manufacturing-related restrictions. Although a single-layer winding is not always necessary, it is therefore preferable that each channel of the coil unit is formed by winding a wire in a layer. (A return wire of each channel is routed through a space between channels, and the one-layered wound state is ensured for even one channel.)

In a magnetic-field generation coil, assuming that a wire having a certain width is used as a coil element, when a continuous desired function of current densities is changed to discontinuous or discrete positions of windings, a distribution of magnetic fields is, as mentioned above, deviated from an ideal distribution of magnetic fields. Moreover, the gap between windings gets larger. This is because a turn at each of discrete windings conducts a desired current I. The present inventor has noted this fact.

A major structure of a solving means proposed by the present inventor is such that one turn (winding) for conducting a desired current I is divided into a plurality, n, of turns. The winding or turn for shunting the current I into n windings shall be referred to as a "fractional turn." The fractional turn is used in the following form. In one use form, one turn (winding) that has a wider gap relative to an adjoining one than the other turns and that conducts a desired current I is branched into n windings each conducting a current I/n (n is an integer equal to or larger than 2), whereby a distribution of magnetic fields is approached to a desired distribution, and the gap of the winding relative to an adjoining one is narrowed. Otherwise, the fractional turn may be added to a gap between windings that is wider than the other gaps. Incidentally, a current flowing into a plurality of windings constituting a fractional turn may, for example, be a current 2I/3 or I/3, or in other words, may be differentiated according to a desired distribution of magnetic fields. Thus, a current need not always be distributed into the plurality of turns by an equal amount.

An exemplary structure satisfying the foregoing basic purport in accordance with the present invention will be described below.

According to the second aspect of the present invention, there are provided various features as follows.

A shunt element for shunting the current carried turn by turn by winding the conductor into a plurality of current flows though a plurality of shunt paths is arranged in a coil segment in relation to a pattern of turns of the coil segment.

As an example, the plurality of shunt paths are two in number and the two shunt paths are branched at a position in the middle of the conductor and joined together at another position in the middle of the conductor. Preferably, the shunt element is inserted into the conductor as an alternative to part of the conductor wound in agreement with the pattern of turns. For example, the conductor of the coil segment is wound on the same plane of one layer. The coil segment is one of a plurality of coil segments constituting a saddle type coil.

As another example, the shunt element is additionally attached to the coil segment as part of the conductor and wound in agreement with the pattern of turns. In this case, for example, the coil segment is formed into a solenoid type coil.

It is preferred that the system comprises a gradient coil unit incorporating the coil segment therein. Preferably, the gradient coil unit comprises X, Y, and Z coil assemblies generating gradients in X-, Y-, and Z-directions respectively, and at least one of the coil assemblies includes the coil segment. For example, the gradient coil unit is an actively shielded gradient coil (ASGC) and the at least one coil assembly comprises a main coil generating a gradient and a shield coil generating a magnetic field for shielding the gradient. Preferably, the at least one coil assembly is the Z coil assembly having the main and shield coils and at least one of the main and shield coils has the coil segment.

In this case, it is preferred that the shield coil has the coil segment. Also, preferably, each of the main and shield coils are formed into a solenoid type coil made up of two solenoid-type coil segments arranged in series on the bobbin and the shunt element is attached to the shield coil at an axial position of at least one of axial end portions and an axial center portion of the shield coil. Preferably, the shunt element consists of two shunt paths branched at a position in the middle of the conductor and joined together at another position in the middle of the conductor.

As another feature, there is provided a configuration that, for example, the two shunt paths are wound so as to produce two shunt current flows therethrough in the same turn direction in accord with the pattern of turns. In contrast, there is provided another configuration that the two shunt paths are wound so as to produce two shunt current flows therethrough in mutually-opposite directions in accord with the pattern of turns.

BRIEF DESCRIPTION OF THE DRAWINGS

In the accompanying drawings:

FIG. 11 is a table showing in detail simulated examples of the positions of windings forming a main and shield coils of a comparative Z coil assembly;

FIG. 13 is a table showing in detail simulated examples of the positions of windings forming a main coil and a shield coil of the Z coil assembly according to the first embodiment;

FIG. 20 is a table showing the positions of windings forming a main coil and a shield coil to which the second embodiment is adapted;

FIG. 23 is a diagram showing streamline functions exhibited by the shield coil of a Z coil assembly of the third embodiment, and the positions of windings thereof;

FIG. 24 is a table showing in detail simulated examples of the positions of windings forming a main and shield coils of the Z coil assembly of the third embodiment;

FIG. 27 is a simulated graph showing a streamline function of eddy currents caused due to the shield coil of the fourth embodiment;

FIG. 28 is a simulated graph showing a streamline function of eddy currents caused due to the shield coil of a variant of the fourth embodiment;

DESCRIPTION OF THE PREFERRED EMBODIMENTS

Magnetic-field generation coils in accordance with the embodiments of the present invention will be described below.

First Embodiment

The first embodiment of the present invention will now be described with reference to FIGS. 1 to 16.

In the first embodiment, a coil unit forming Z channel (Z coil) of an actively shielded gradient coil (ASGC) unit for an MRl system will be exemplified as a magnetic-field generation coil unit. The present invention can be adapted to an X channel (X coil) and Y channel (Y coil) of the ASGC unit. Moreover, the present invention can preferably be adapted to a static coil and shim coils.

A magnetic-field generation coil unit of the present invention can be implemented irrespective of the shape of a coil and the method of generating magnetic fields; that is, can be implemented in a cylindrical coil, an opposed type coil, a surface type coil, or an open type coil.

Figure 1:
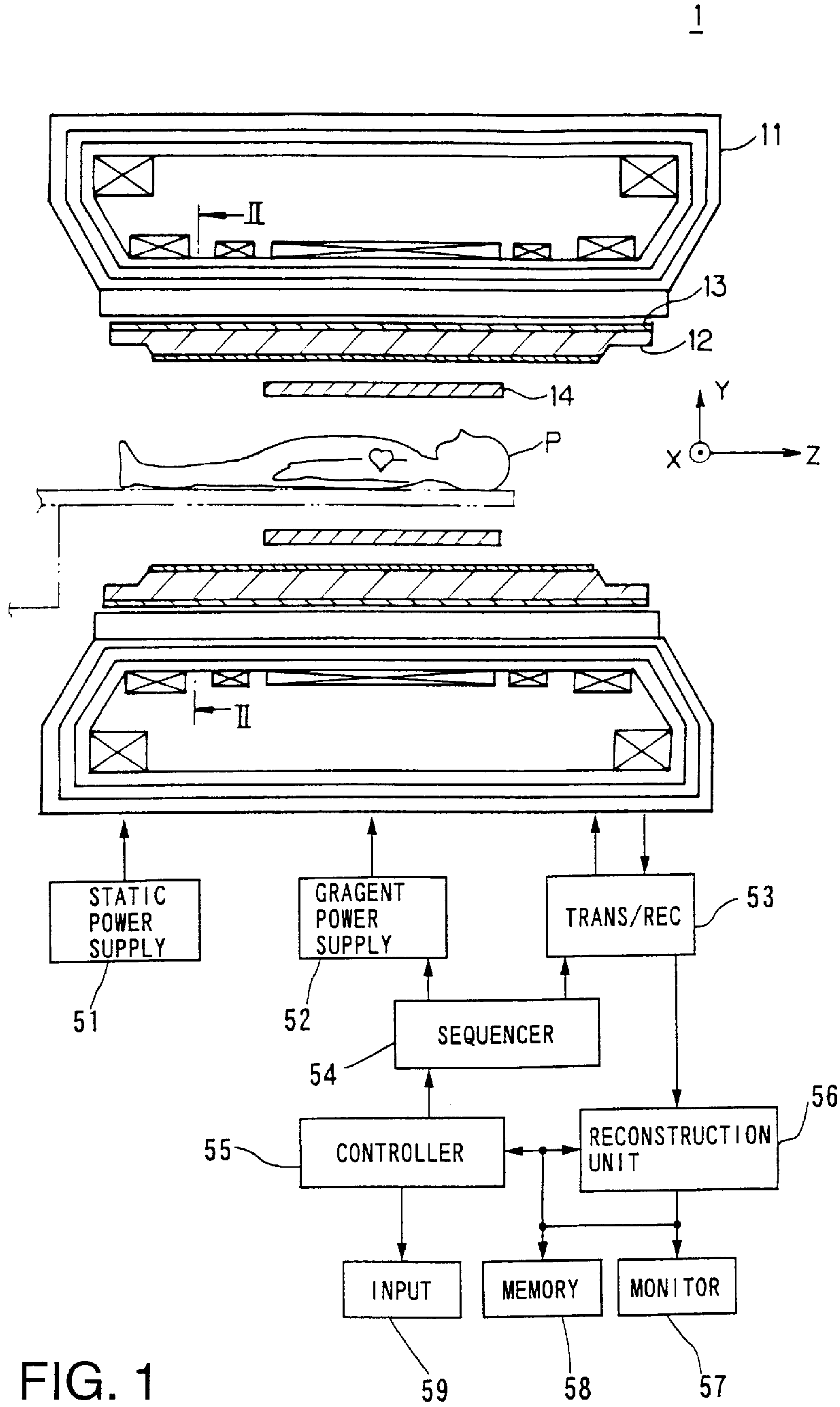
FIG. 1 is a schematic sectional view of a gantry of an MRI system in which the present invention is implemented.

FIG. 1 schematically shows a longitudinal section of a gantry 1 of an MRl system. The gantry 1 is shaped like a cylinder as a whole. A central bore of the gantry 1 serves as a diagnostic space. For diagnosis, a subject P can be inserted in the bore.

The gantry 1 comprises a substantially-cylindrical static coil unit 11, a substantially-cylindrical gradient coil unit 12 located on the bore side of the coil unit 11, a shim coil unit 13 mounted on, for example, the outer circumference of the unit 12, and an radio-frequency coil 14 located in the bore inside the gradient coil unit 12. The subject P is asked to lie down on the couchtop of a patient couch that is not shown, and inserted into the bore (diagnostic space) defined by the radio-frequency coil 14.

The static coil unit 11 is made of a superconducting magnet. That is to say, a plurality of heat radiation-shielded containers and a single liquid helium container are stowed in an outer vacuum container. A superconducting coil is wound and placed in the liquid helium container.

The gradient coil unit 12 is actively shielded. The coil unit 12 has a coil assembly for forming each of the X, Y, and Z channels so as to generate gradient pulses in each of the X-axis, Y-axis, and Z-axis directions. The coil assemblies have a shielded structure allowing only very little magnetic field gradients to leak out along each channel.

The MRl system, as shown in FIG. 1, comprises a static power supply 51 supplying power to the static coil unit 11, a gradient power supply 52 supplying current to the gradient coil unit 12, a transmitter/receiver 53 not only transmitting an RF signal to the RF coil 14 but also receiving an MR signal from the RF coil 14, and a sequencer 54 controlling operation of the gradient power supply and transmitter/receiver on the basis of a given sequence. The system further comprises a controller 55 controlling the whole system and a unit 56 for reconstructing MR images from the MR signal, in addition to a monitor 57, memory 58, and input device 59.

Figure 2:
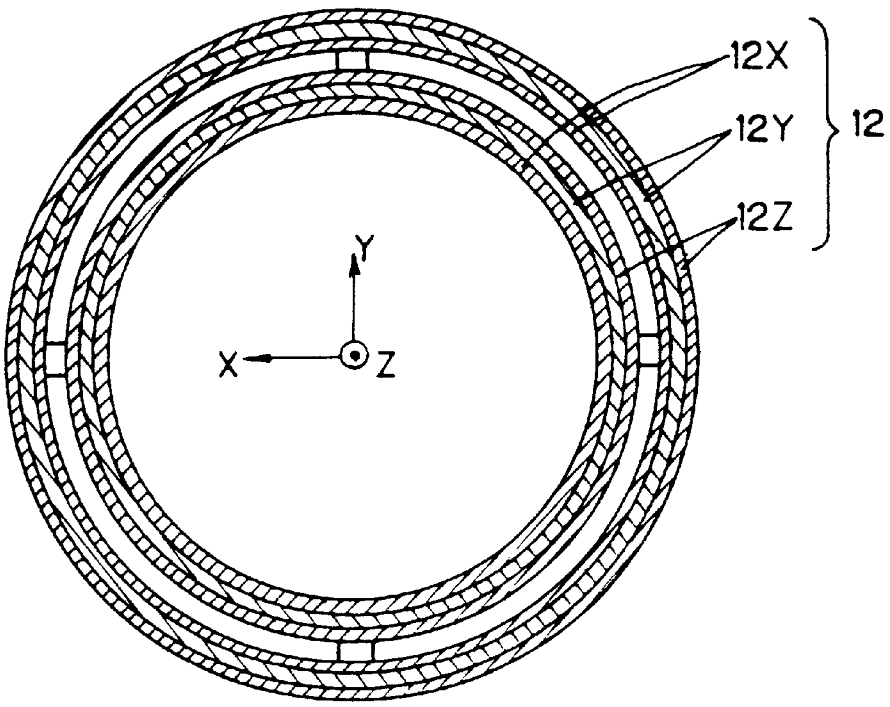
FIG. 2 is a schematic sectional view of a plane orthogonal to the Z-axis direction of a gradient coil unit.

The actively shielded gradient coil (ASGC) unit 12 has, as shown in FIG. 2, an X coil assembly 12X, Y coil assembly 12Y, and Z coil assembly 12Z, which form the X, Y, and Z channels respectively, isolated layer by layer and laminated, and is shaped substantially like a cylinder as a whole. The X coil assembly 12X, Y coil assembly 12Y, and Z coil assembly 12Z each include a main coil and a shield coil. Each of the main and shield coils is provided with a plurality of coil segments. This enables each coil assembly to not only generate magnetic fields changing in each axial direction but also achieve a shielding structure that does not allow most magnetic field gradients to leak out.

To begin with, the Z coil assembly 12Z forming the Z channel will be described in conjunction with FIGS. 3 and 4. The Z coil assembly 12Z includes two bobbins B1 and B2 arranged as coaxial cylinders and having different inner diameters, and a main coil 12ZM having main coil segments 12Z-1 and 12Z-2, and a shield coil 12ZS having shield coil segments 12Z-3 and 12Z-4 which are paired and created by winding a wire in a layer. The assembly of the shield coil 12ZS is placed on the bobbin whose diameter is larger than the bobbin on which the main coil 12ZM is placed. The shield coil is covering the outer circumferences of the main coil. The paired main coil segments 12Z-1 and 12Z-2 are created by winding a wire so that pulsating currents flow in mutually opposite directions. Another pair or the paired shield coil segments 12Z-3 and 12Z-4 are created by winding a wire so that pulsating currents flow in mutually opposite directions. As for a main coil and shield coil which are mutually opposed in a radial direction, currents flow in mutually opposite directions between one pair of the main coil segment 12Z-1 and shield coil segment 12Z-3, and currents flow in mutually opposite directions between another pair of the main coil segment 12Z-2 and shield coil segment 12Z-4.

Figure 5:
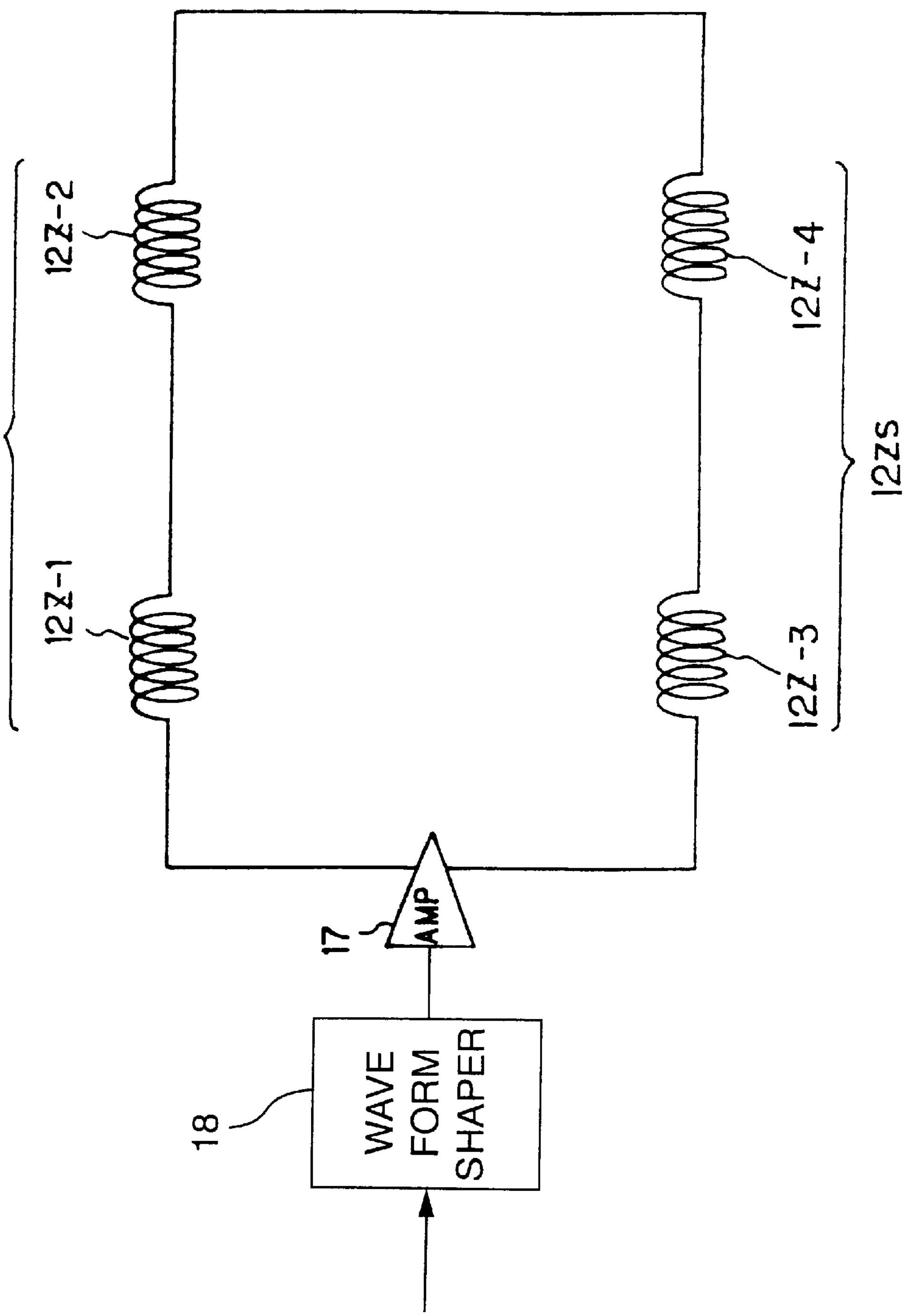
FIG. 5 is a diagram of an equivalent circuit of the Z coil assembly.

FIG. 5 shows an electrically equivalent circuit of the whole Z coil assembly 12Z. Two main coil segments 12Z-1 and 12Z-2 and two shield coil segments 12Z-3 and 12Z-4 are connected in series respectively. A desired current I is supplied from a single gradient power supply 17 used to generate magnetic field gradients at the same time. A waveform shaper 18 is connected to the power supply 17. The waveform shaper 18 receives waveform data concerning magnetic field gradients to be generated by the Z channel, which reflects a command issued from a sequencer that is not shown, and outputs a waveform control signal proportional to the data to the power supply 17. With the waveform control signal, the power supply 17 outputs a pulsating current I, which is used by the Z channel for generating magnetic field gradients intended by the sequencer, to the group of coil segments connected in series.

The positions of windings forming the main coil 12ZM in the Z-axis direction on the bobbin B1 are determined according to a known technique. A wire is wound exactly at the positions in the form of a solenoid (however, the winding method of the present invention that will be described later can be adopted for the main coil segments 12Z-1 and 12Z-2).

By contrast, the positions of the windings forming the shield coil 12ZS are determined in this embodiment as mentioned below.

Figure 6:
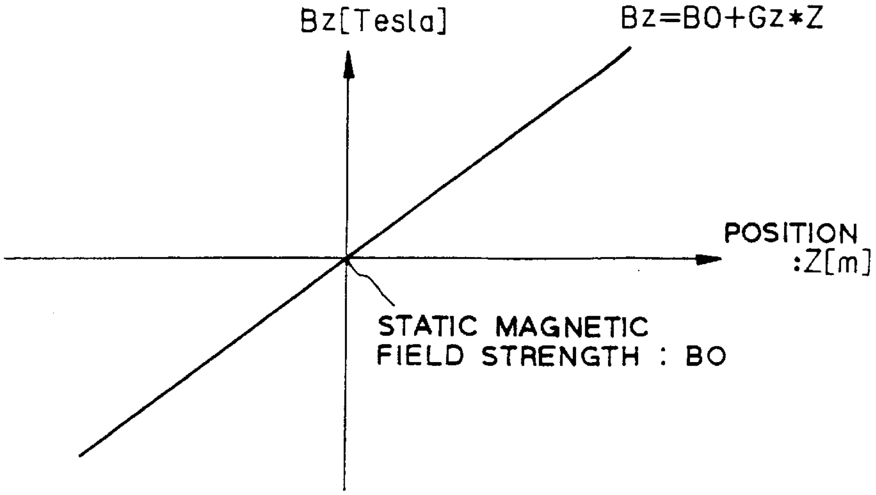
FIG. 6 is a graph showing an example of a characteristic relevant to a magnetic field gradient which the Z coil assembly is required to exhibit.
Figure 7:
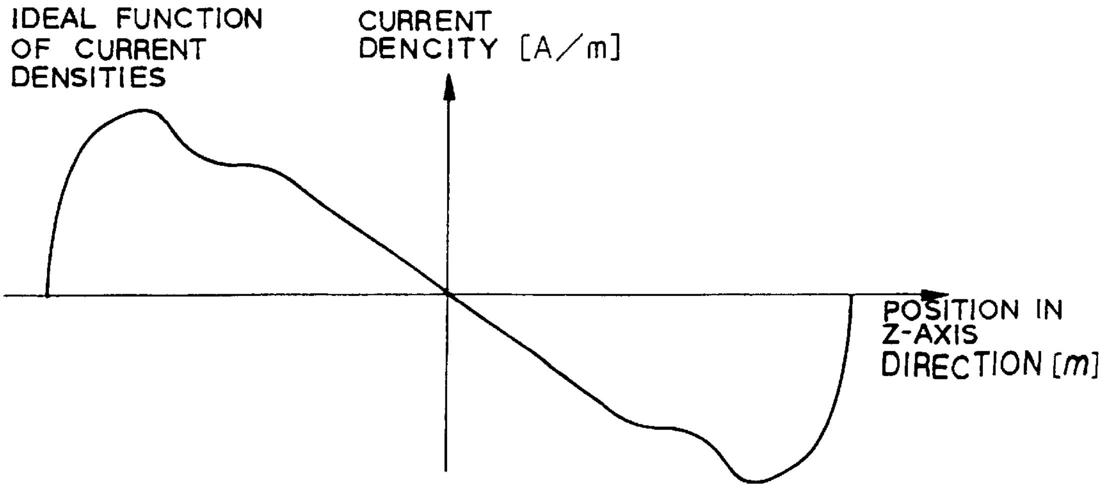
FIG. 7 is a graph showing an example of an ideal function of current densities which the shield coil of the Z coil assembly are required to exhibit.

To begin with, the spatially linear characteristic Bz relevant to magnetic field gradients that change in the Z-axis direction is determined analytically as shown in FIG. 6. The relationship of an ideal function of current densities [A/m] to positions in the Z-axis direction, which satisfies the characteristic and applies to the shield coil segments 12Z-3 and 12Z-4, is obtained by carrying out known computation. An example of the ideal function of current densities is shown in FIG. 7.

Figure 8A:
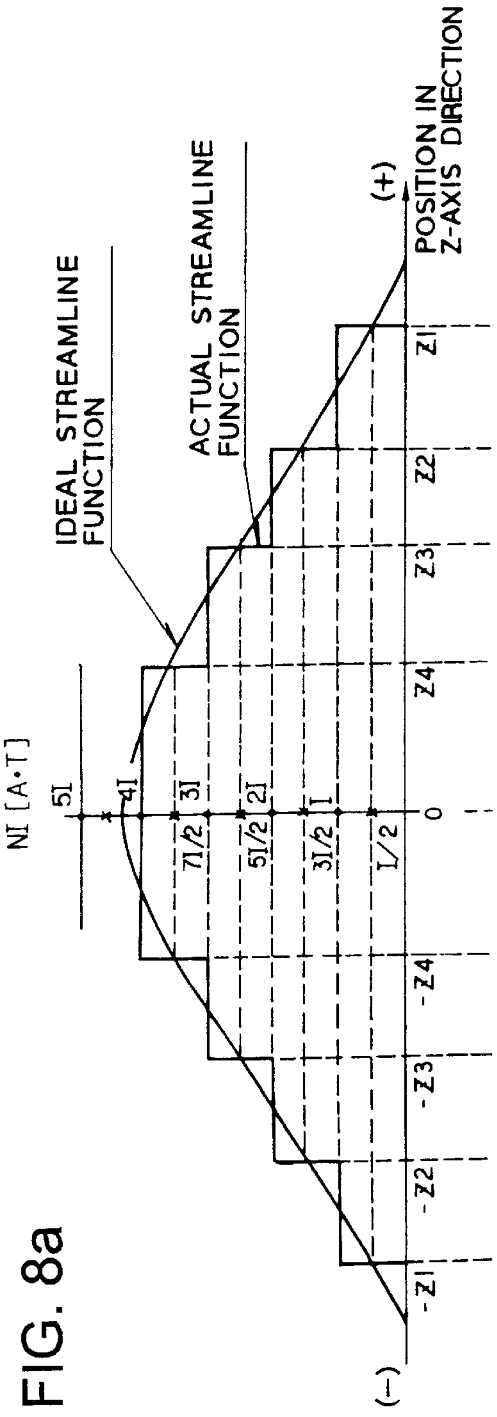
FIG. 8 is a diagram showing streamline functions and the arrangement of windings of the shield coil of a Z coil assembly according to the first embodiment.
Figure 8B:
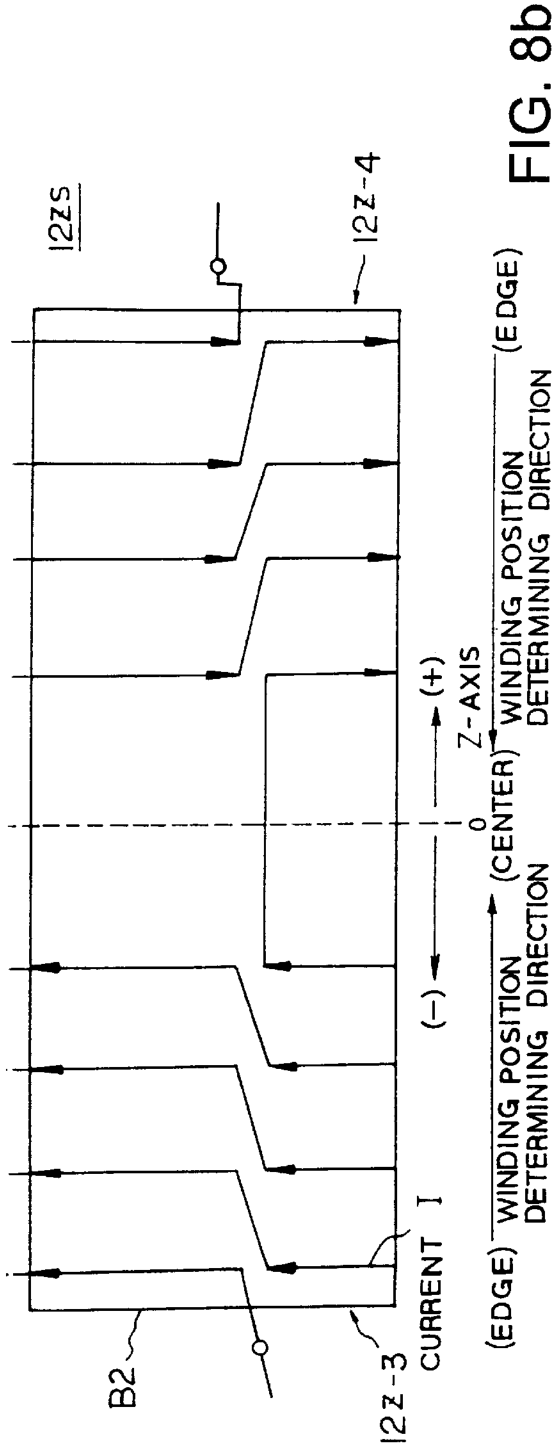

Next, the ideal function of current densities is integrated relative to a specific range of the positions in the Z-axis direction, whereby an ideal streamline function is obtained. An example of an obtained ideal streamline function is shown in FIG. 8(*a*).

Next, the obtained ideal streamlined function is used to determine positions of windings forming the shield coil segments 12Z-3 and 12Z-4. In other words, on this stage, an analytically-obtained continuous distribution of currents is replaced with a discontinuous distribution of currents externalized by physical entities that are windings (changed into a discrete distribution).

The positions of the windings of the shield coil segments 12Z-3 and 12Z-4 is determined in sequence from each outermost position in the axial direction of the bobbin B2 to its axial center with a current step value I (=Ic=Is), where Ic is a value of current passing the main coil segments 12Z-1 and 12Z-2 (their total number of windings is Nc) and Is is a value of current passing the shield coil segments 12Z-3 and 12Z-4 (with total number of windings is Ns).

First, at both the axial end portions, specific position $-Z1$ and $Z1$ of the outermost two windings are given on the bobbin B2. Each of the outermost windings is wound, as shown in FIG. 8(*b*), by one turn at each of the outermost positions $-Z1$ and $Z1$, thus raising stepwise the actual (discrete) streamline function by the current step value I, as shown in FIG. 8(*b*). Any positions may be selected as the specific positions $-Z1$ and $Z1$ in consideration with the curves of a given ideal streamline function and a stepwise actual streamline function to be formed by the positions $-Z1$ and $Z1$ and the current step value I; for example, the positions $-Z1$ and $Z1$ are selected so that both the curves of the actual and ideal streamline functions crosses with each other at a point of I/2.

In response to this initial determination, for example, the winding positions $-Z2$, $-Z3$, and $-Z4$ and $Z2$, $Z3$ and $Z4$ corresponding to $3I/2$, $5I/2$ and $7I/2$ on the longitudinal axis expressing NI are sequentially determined toward the axial center of the bobbin.

This winding method by which determination of the winding positions first starts at the axial outermost ones and then goes sequentially to the axial center makes it possible to give priority to winding positions in the axial end portions, where ideal winding positions can be set according to curvature in the foot range of an ideal streamline function curve. Thus, leakage of magnetic flux from the axial end portions of the shied coil is reduced, contributing to prevention MR image quality from being deteriorated. Remaining currents which cannot be covered by all the windings are brought to the axial center range and flow in mutually opposite ways. As a result, magnetic fields in charge of the remaining currents are reduced and leakage of magnetic flux in the axial center are also lowered. Compared with the conventional coil arrangement design (Ic=Is), the leakage of magnetic field will be improved by 1/2.6 in this embodiment.

Still, the winding method according to this embodiment excludes the necessity of adjustment of current of the shield coil by connecting a correction resister to the shield coil in parallel. When such a correction resister is used, the shield coil has changed resistance due to increase in the temperature of the shield coil, causing deviation from a desired shunt state. This will also lead to changes in shield states, resulting in a rise in eddy currents due to magnetic flux leakage. Therefore, it was required to use such correction method employing correction resisters. By contrast, the foregoing winding method of the embodiment enable one to exclude such temperature-affected unstable factors and gain a stable shielding state.

Now, the results of simulation to which the coil winding method of the present embodiment has been applied will be described.

Figure 9:
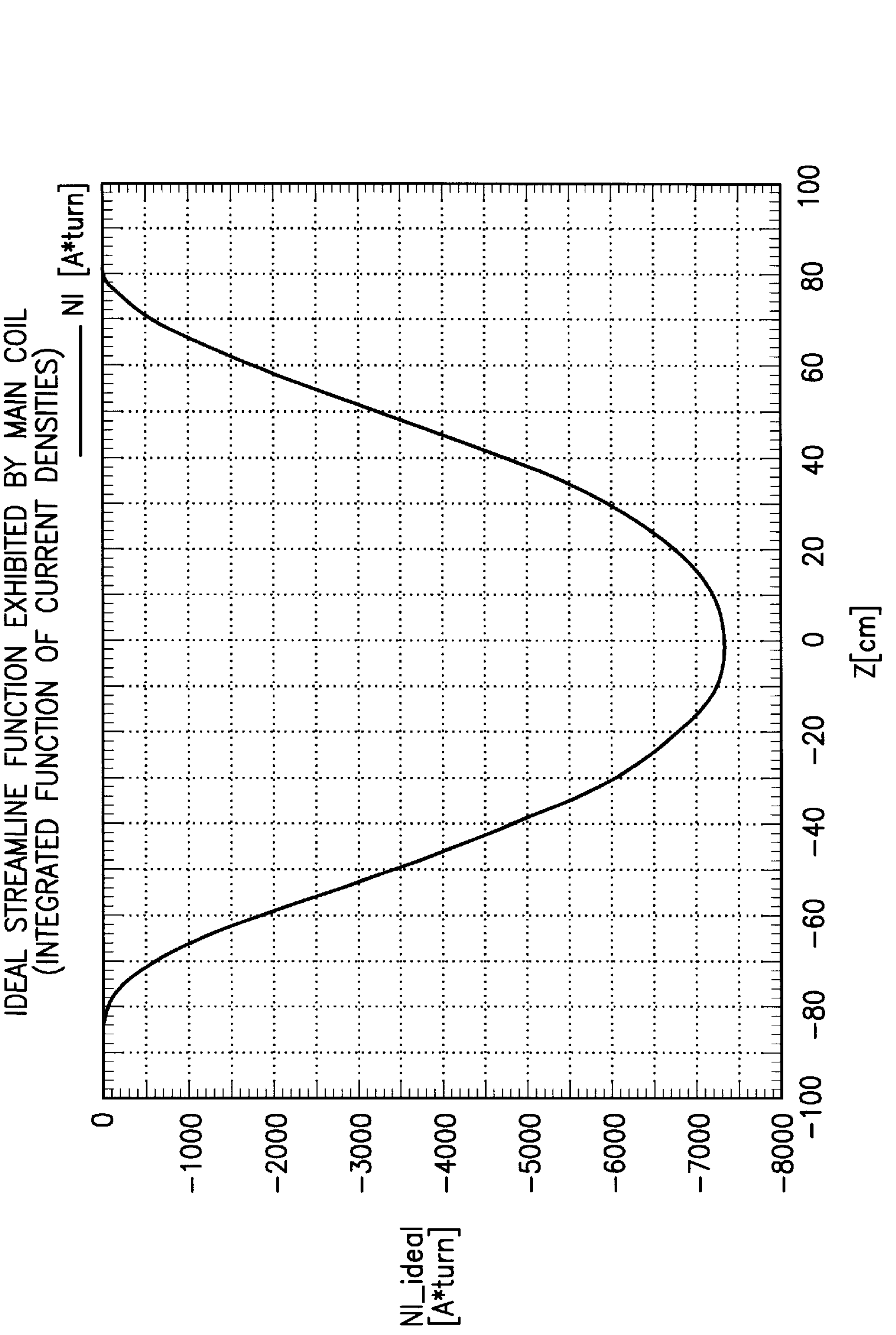
FIG. 9 is a graph showing an example of an ideal streamline function exhibited by the main coil of the Z coil assembly.
Figure 10:
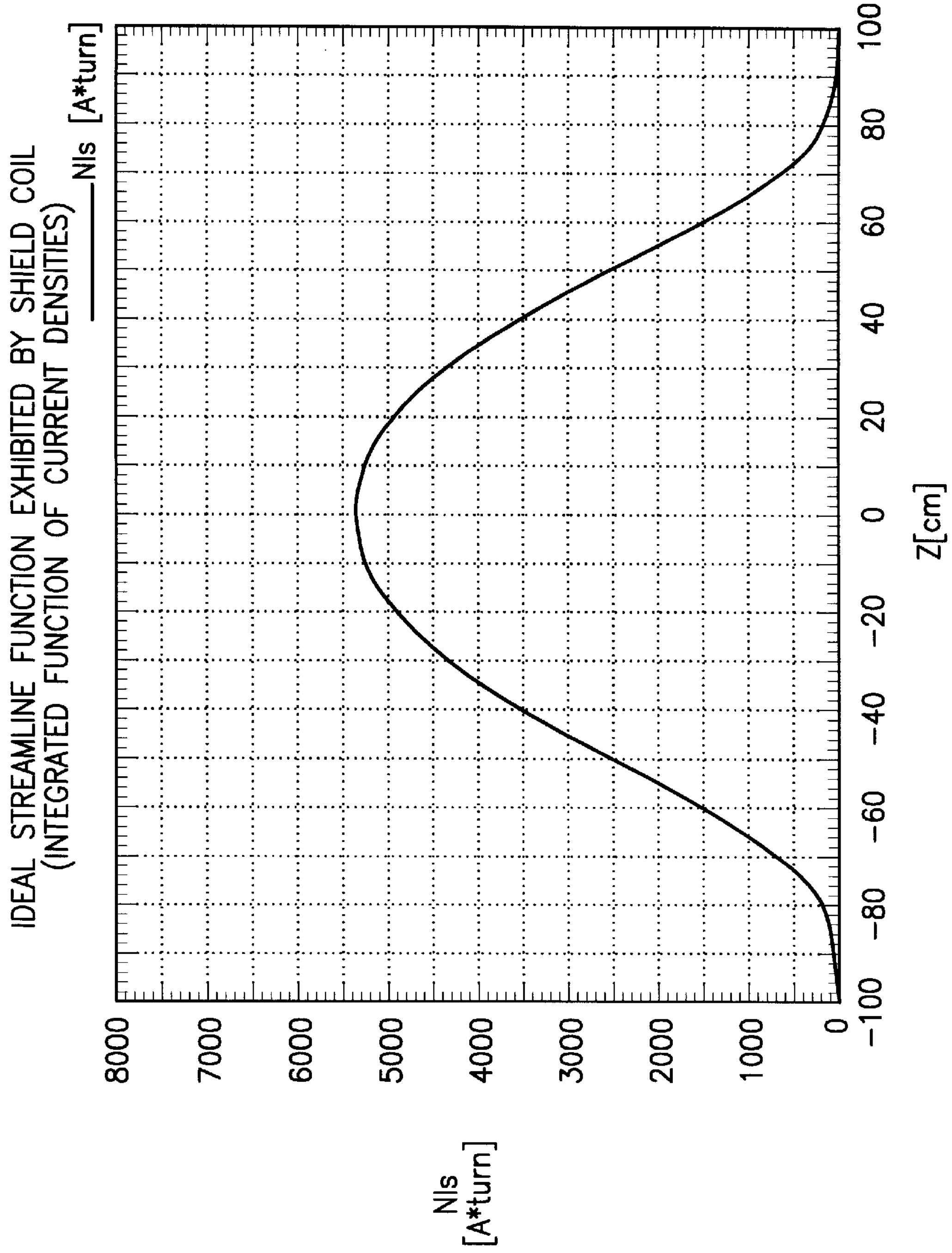
FIG. 10 is a graph showing an example of an ideal streamline function exhibited by the shield coil of the Z coil assembly.

FIGS. 9 and 10 show curves of ideal streamline functions (integrated functions of current densities) exhibited by a Z channel of an ASGC unit which result from simulation performed by the present inventor. The curve shown in FIG. 9 is the curve of a streamline function exhibited by a main coil, and the curve shown in FIG. 10 is the curve of a streamline function exhibited by a shield coil. Both the curves are obtained theoretically using the computation devised by J. W. Carlson et al. Specifically, when streamline functions are plotted as smooth curves assumed ideal values, the generation of magnetic field gradients by the Z channel and the self-shielding performance of the Z channel become ideal (come to desired states).

Next, a desired current I (=Ic=Is) is set to 99.345 A, and the positions of windings forming the main coil and shield coil constituting a Z channel are determined according to the technique proposed by Yoda. The positions are shown in columns (a) and (b) of FIG. 11. The positions of windings in the drawings are positions on the positive side in the Z-axis direction. Actually, a wire is wound at symmetric positions on the negative side. The plus and minus signs in the figure show the directions of windings (current flows) opposite to each other on the circumferential surface of the bobbin.

Figure 12:
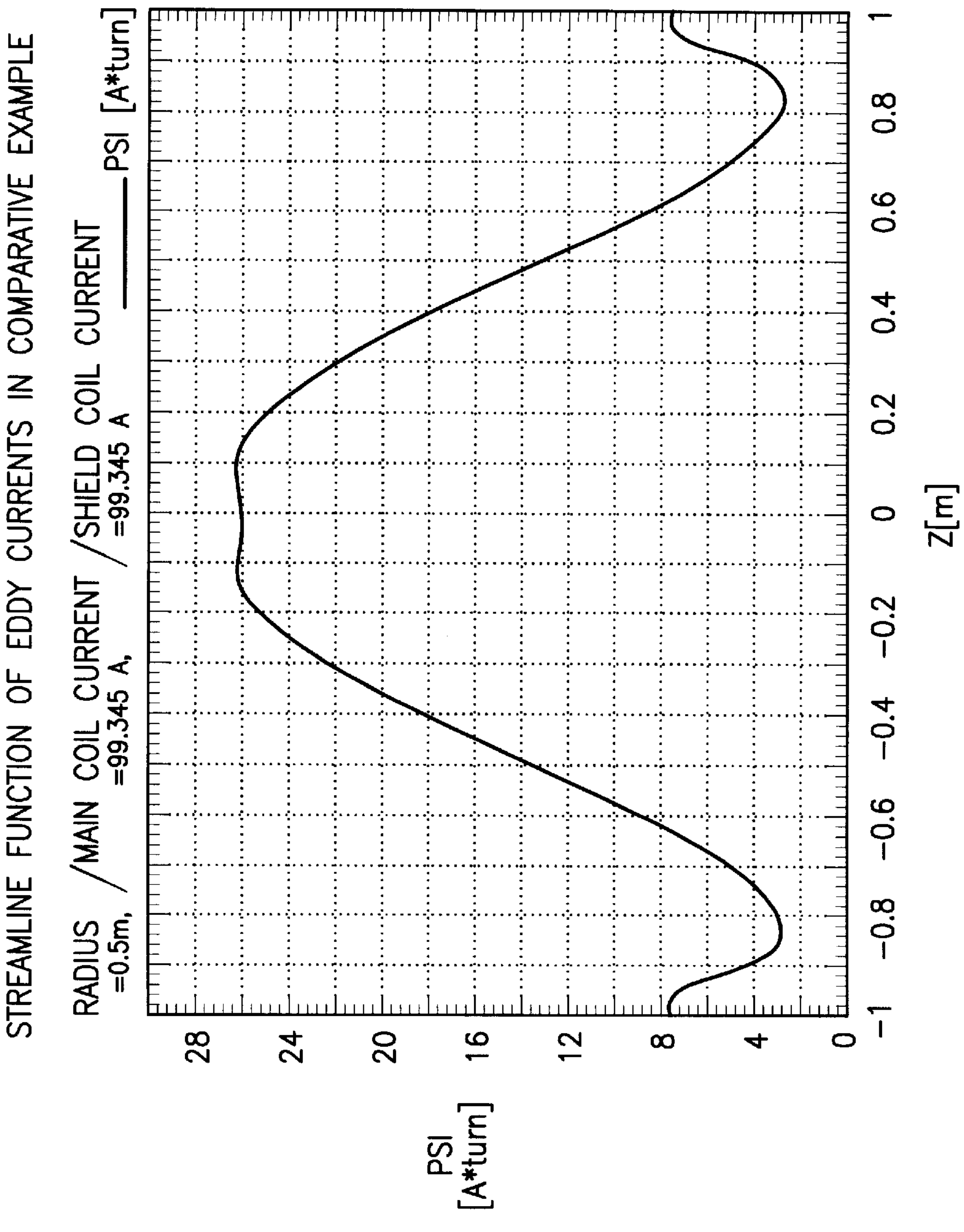
FIG. 12 is a simulated diagram showing a streamline function of eddy currents due to the shield coil of the comparative Z coil assembly.

The less than preferable result is shown in FIG. 12. FIG. 12 shows the results of simulation performed using coils designed according to the positions of windings listed in (a) and (b) of FIG. 11, and shows a streamline function of eddy currents induced by the Z coil assembly. The simulation can be carried out using a finite element method or boundary element method. Eddy currents induced by magnetic leakage occurring at positions within a radius of 0.5 m are calculated. As apparent from FIG. 12, the streamline function of eddy currents rises sharply and broadly at both edges in the Z-axis direction and in the center therein. This is attributable to the fact that a magnetic flux passes through a wide gap between windings of the shield coil. The inner radius of the bore of the static coil unit is usually about 0.5 m. The eddy currents induced at both edges in the Z-axis direction and in the center therein according to the graph shown in FIG. 12 are induced at positions opposed to the conductor of the static coil unit and at surrounding positions. The eddy currents invite, as mentioned above, deterioration of the qualities of MR images, though the coil unit is an ASGC unit.

Figure 14:
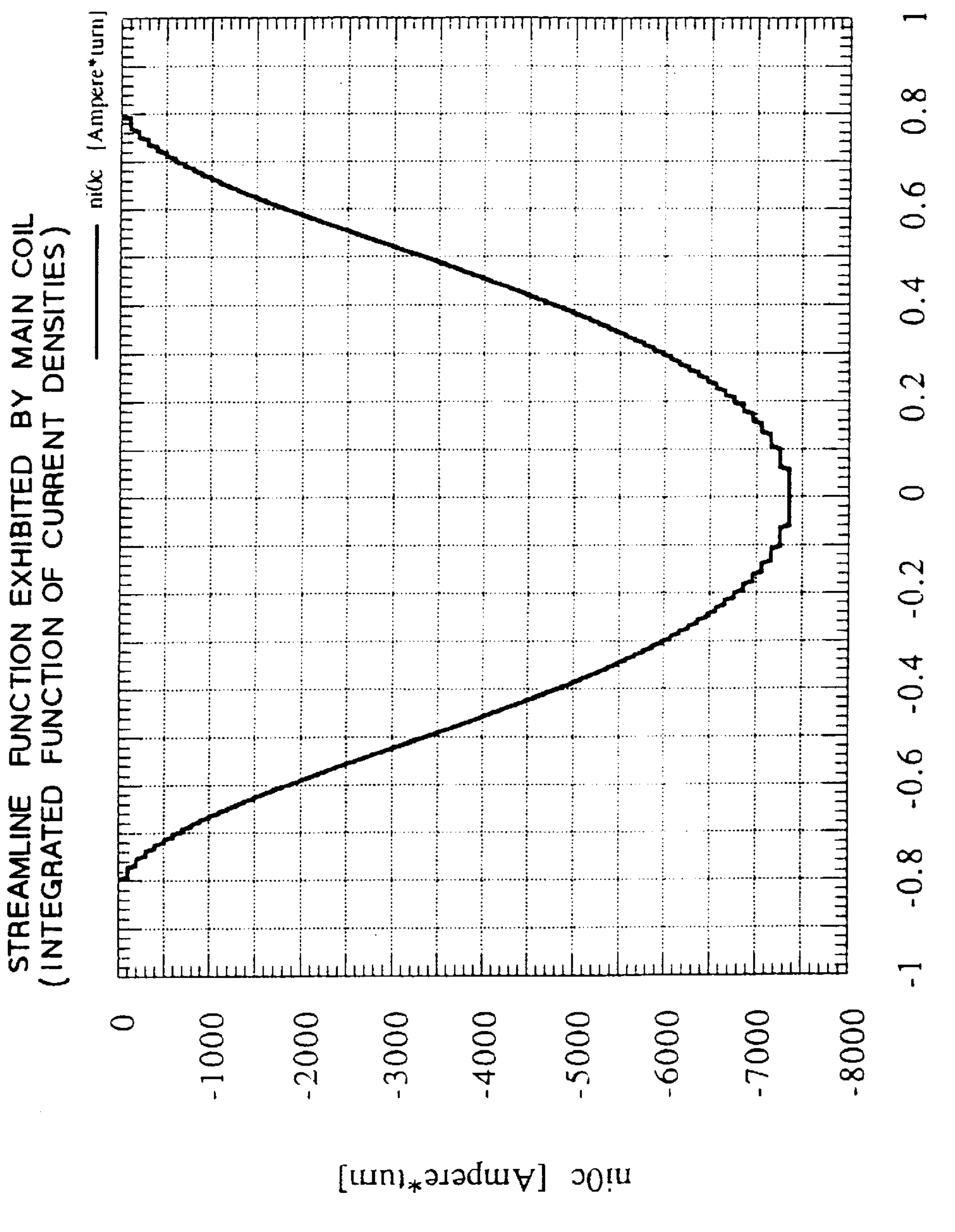
FIG. 14 is a simulated graph for explaining the streamline function characteristic of the main coil of the Z coil assembly of the first embodiment.
Figure 15:
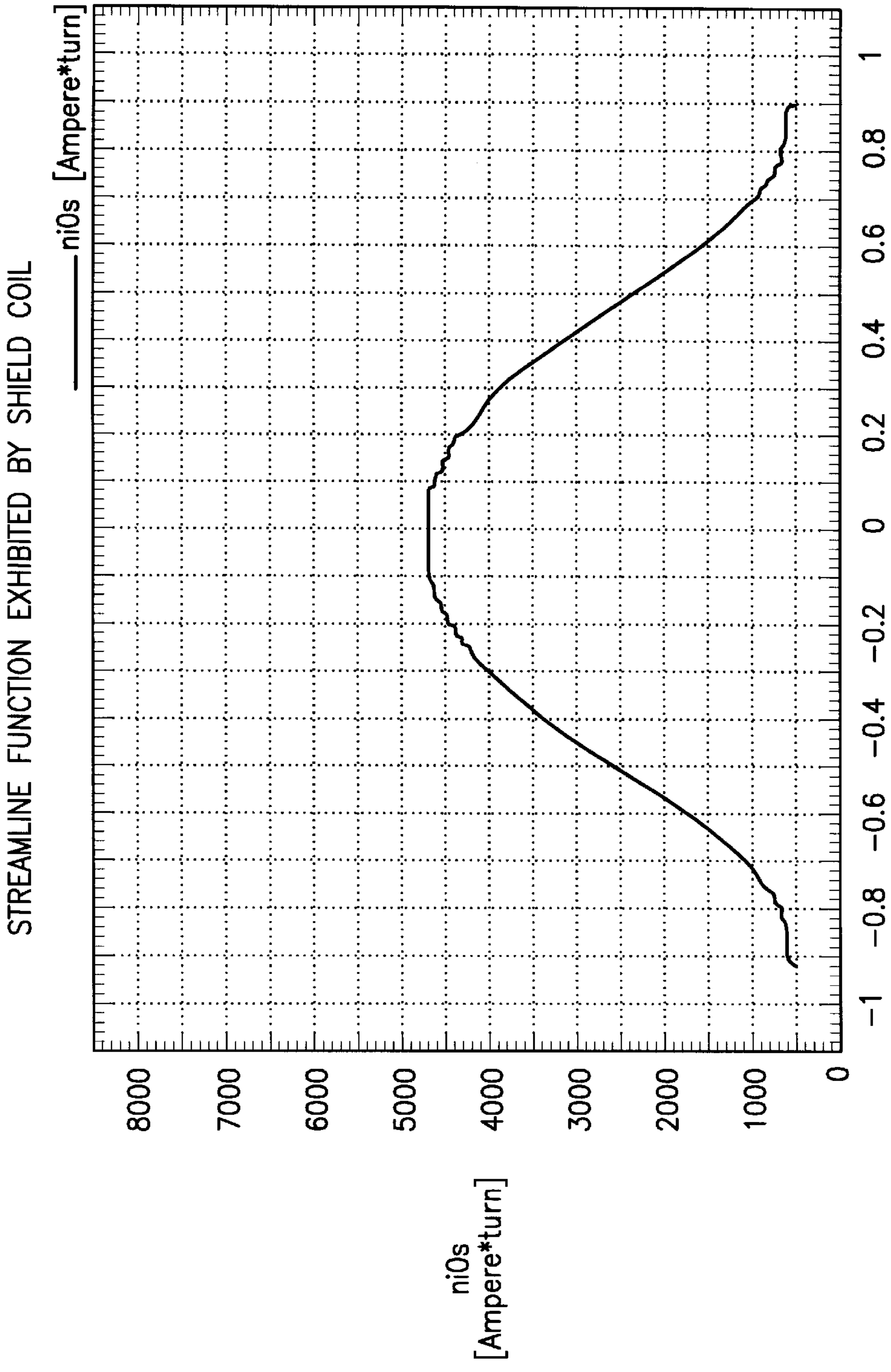
FIG. 15 is a simulated graph for explaining the streamline function characteristics of the shield coil of the Z coil assembly of the first embodiment.

By contrast, the columns (a) and (b) of FIG. 13 show the simulated positions of windings of a main and shield coils to which the winding method of the embodiment is applied, by which determination of their positions is carried out first at each axial outermost position and then goes to its axial center. By using the positions and the same drive conditions as the above comparative example shown in FIGS. 11 and 12, the actual streamline functions of the main and shield coils are shown by FIGS. 14 and 15 which closely approximate to the ideal streamline functions shown in FIGS. 9 and 10.

Figure 16:
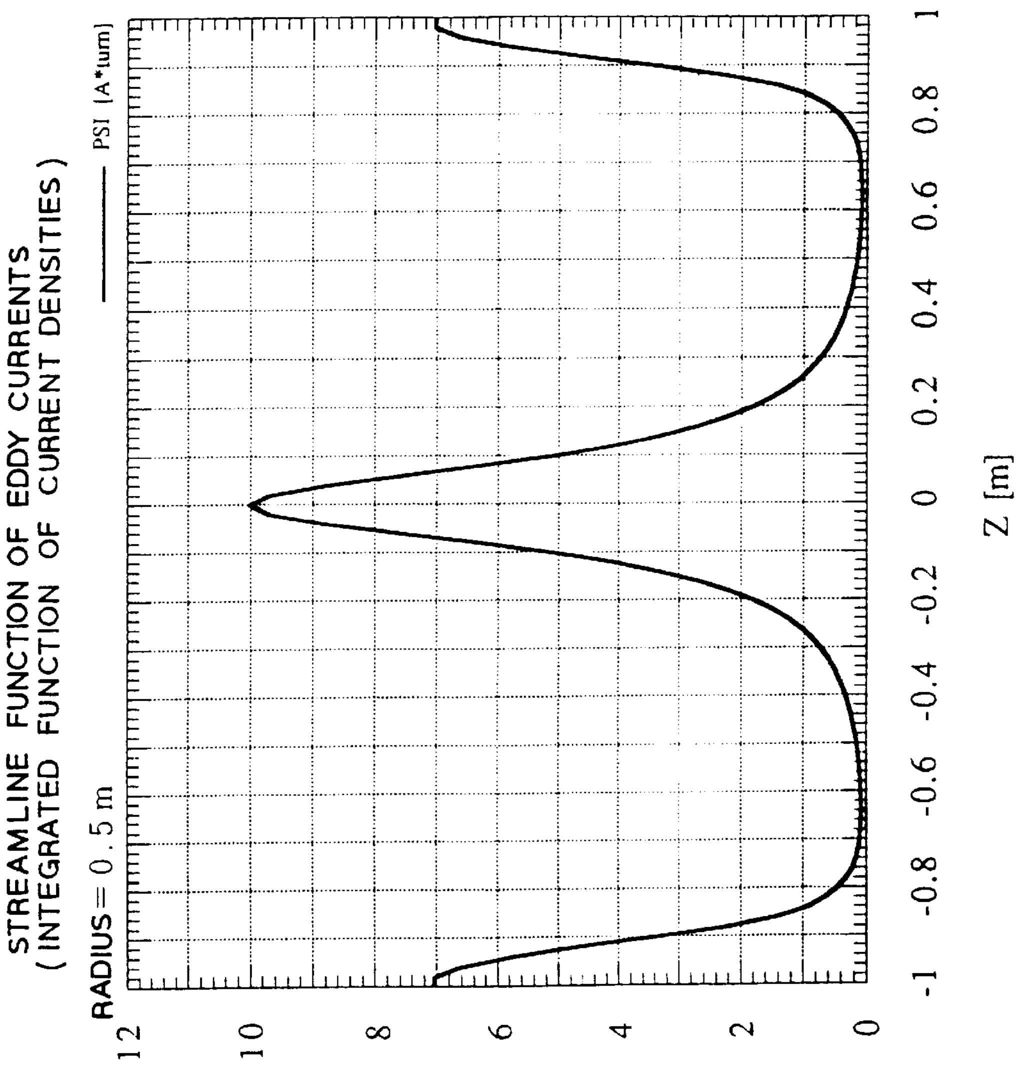
FIG. 16 is a simulated diagram showing a streamline function of eddy currents due to the shield coil of the Z coil assembly of the first embodiment.

In simulation based on this improved winding method, a streamline function of eddy currents caused by magnetic leakage has been resulted in FIG. 16, which should be comparative to FIG. 12. As understood from comparing both the curves, FIG. 16 shows noticeably decreased levels of eddy currents over the entire range

Second Embodiment

A magnetic-field generation coil unit in accordance with the second embodiment of the present invention will be described in conjunction with FIGS. 17 to 22. In the magnetic-field generation coil unit in this embodiment, like that in the first embodiment, the present invention is implemented in a shield coil 12Z having shield coil segments 12Z-3 and 12Z-4 included in a cylindrical z coil assembly that is one of coil assemblies constituting an ASGC unit. Herein, components identical or similar to those in the first embodiment will be assigned the same reference numerals. The description of the components will be omitted or briefed.

The second embodiment is to employ the same winding method as one described by the first embodiment and to make sure that the magnetic leakage is more deeply suppressed. In order to achieve this, a winding technique called "fractional turn" is introduced.

Figure 17A:
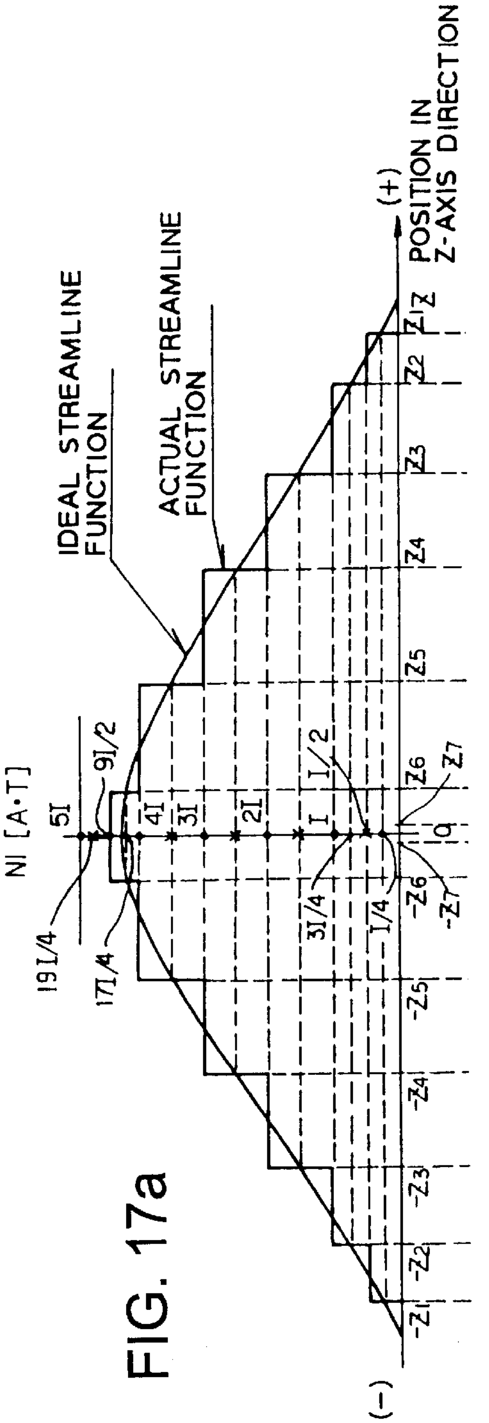
FIG. 17 is a diagram for explaining the second embodiment by showing streamline functions exhibited by the shield coil and positions of windings in the Z-axis direction of the shield coil.
Figure 17B:
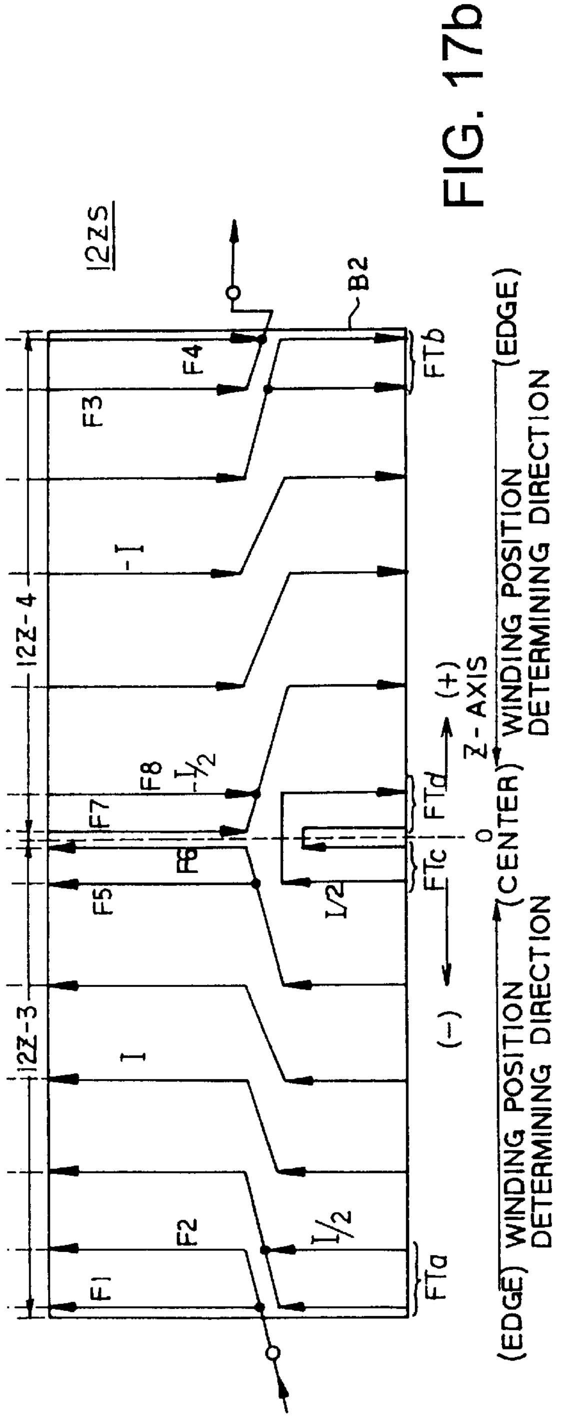

For an ideal streamline function shown in (a) of FIG. 17, the positions of windings are sequentially determined, like the first embodiment, from each outermost position in the axial direction of the bobbin B2 to the center therein. Additionally, in this embodiment, for the windings forming the shield coil segments 12Z-3 and 12Z-4 which are located in the center and both edges in the Z-axis direction of the bobbin B2, a way of winding referred to as "fractional turn" whose concept has been introduced by the present inventor is adopted.

The "fractional turn" is a way of winding based on an unprecedented novel concept, wherein a given current I [A] carried by one normal turn is shunted into I/N passing n local windings (where n is an integer equal to or larger than 2). The introduction of the "fractional turn" is intended to smoothen an actual streamline relationship and make it more closely approach an ideal streamline function. A fractional turn employed herein is "I/2 turn" formed in each end in the bobbin axial direction and in the center therein.

To be more specific, as shown in (a) of FIG. 17, when a desired current is I (for example, 100 A), positions –Z1, –Z2, Z1 and Z2 of windings in the axial direction, at which the ideal streamline function curve and current values I/4 and 3I/4 on the longitudinal axis expressing NI (N is the total number of windings and I is coil current) in FIG. 17, are determined as the positions of the "fractional turn I/2" arranged in each axial end range. Then, winding positions –Z3, –Z4, –Z5, Z3, Z4, Z5 which correspond to 3I/2, 5I/2, 7I/2 on the longitudinal axis, which are increased stepwise by the current step value 1, are determined in turn. Then winding positions –Z6, –Z7 (about zero), Z6 and Z7 (about zero) corresponding to 17I/4 and 19I/4 are determined for the fractional turns arranged in the axial center.

First, fractional turns FTa and FTb at both edges will be described. Positions of windings –Z1, –Z2, Z2, and Z1, which are associated with currents I/4 and 3I/4 on the axis of ordinates and into which a current I/2 that is a half of the current I flows, (half current turns, that is, n=2) are determined. The fractional turn FTa at the left-hand edge in FIG. 17 is created by bifurcating a lead extending from a power supply at the positions of windings −Z1 and −Z2, and winding the resultant windings F1 and F2 by one turn. The windings F1 and F2 are then merged into one winding, and linked to a winding at the next position −Z3. The fractional turn FTb at the right-hand edge in the drawing is created by bifurcating a winding extending from a position Z3 at the positions of windings Z2 and Z1, and winding the resultant windings F3 and F4 by one turn. The windings F3 and F4 are then merged into one winding and linked to a lead extending from the power supply.

Fractional turns FTc and FTd for conducting a current I/2 are created as illustrated in the center in the Z-axis direction of the bobbin. Specifically, positions −Z6 and Z6 associated with a current 17I/4 by the streamline functional curve are defined as the positions of ones of windings constituting the fractional turns FTc and FTd which conduct the current I/2. At the same time, the positions of the other windings constituting the fractional turns FTc and FTd which conduct the current I/2 (remaining turns) are determined at positions −Z7 and Z7 of nearly zero which are associated with a current 19I/4 by the streamline functional curve.

The fractional turn FTc that is one of the fractional turns in the center of the bobbin are created by bifurcating a winding extending from a position −Z5 at a position −Z6 and a position −Z7 of a nearly zero on the negative side in the Z-axis direction, and winding the resultant windings F5 and F6 by one turn. The two turned shunt windings F5 and F6 are passed from the negative side in the Z-axis direction to the positive side therein in such a way that the windings will not cross each other. The two crossovers are linked to the other fractional turn FTd. The two crossovers are routed in a direction opposite to the direction in which the windings F5 and F6 are routed, and linked to the windings F8 and F7 at the position Z7 of nearly zero on the positive side in the Z-axis direction and the position Z6 on the positive side therein respectively. The two windings F8 and F7 are then wound by one turn and then merged into one winding. The resultant winding is then linked to a winding at the position Z5.

As a result, in the center in the Z-axis direction on the bobbin, the two adjoining windings F6 and F7 at the positions −Z7 and Z7 are regarded as substantially the same winding. Currents flowing into the two turns or windings are oriented in mutually opposite directions. Magnetic fields generated by the two windings F6 and F7 are canceled out. At both the center positions −Z6 and Z6, it can therefore be thought that a half current turn is realized substantially without the necessity of shunt.

Figure 18:
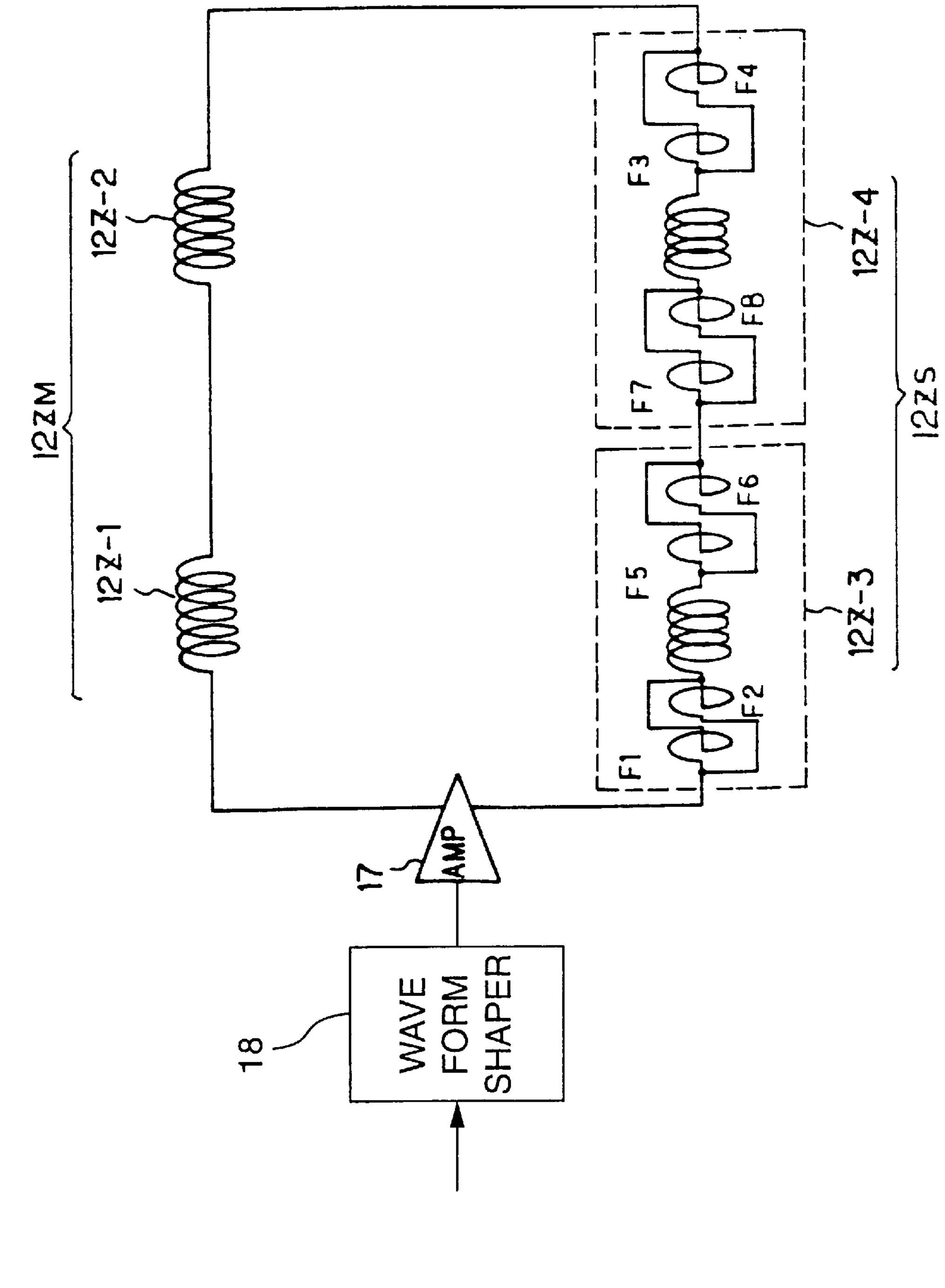
FIG. 18 is a diagram of an equivalent circuit of the Z coil assembly.

FIG. 18 shows a simplified and conceptual circuit of the whole Z coil assembly 12Z. Two main coil segments 12Z-1 and 12Z-2 and two shield coil segments 12Z-3 and 12Z-4 are connected in series respectively. A desired current I is supplied from a single power supply 17 used to generate magnetic field gradients at the same time. In the shield coil segments 12Z-3 and 12Z-4, windings F1 to F8 are equivalent to the aforesaid windings constituting fractional turns (half current turns). A waveform shaper 18 is connected to the power supply 17. The waveform shaper 18 receives waveform data concerning magnetic field gradients to be generated by the Z channel, which reflects a command issued from a sequencer that is not shown, and outputs a waveform control signal proportional to the data to the power supply 17. With the waveform control signal, the power supply outputs a pulsating current I, which is used by the Z channel for generating magnetic field gradients and intended by the sequencer, to the group of coil segments connected in series. The power supply 17 and the waveform shaper 18 are included in the gradient power supply 52.

When the fractional turns FTa to FTd are thus added to the shield coil segment 12Z-3 and 12Z-4, although the shield coil segments are formed by winding a wire in a layer, a streamline function which is desired to be actually exhibited by the shield coil segments 12Z-3 and 12Z-4 can be caused to more closely approach an ideal streamline function. Moreover, the concentration of windings in the center in the Z-axis direction and at both edges therein can be raised.

Figure 19:
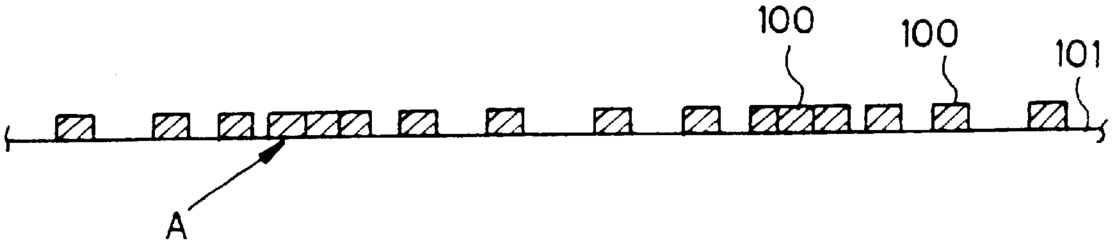
FIG. 19 is a diagram for explaining the positions of windings and the crowded state thereof in a coil created by winding a wire having a certain width in a layer.
Figure 21:
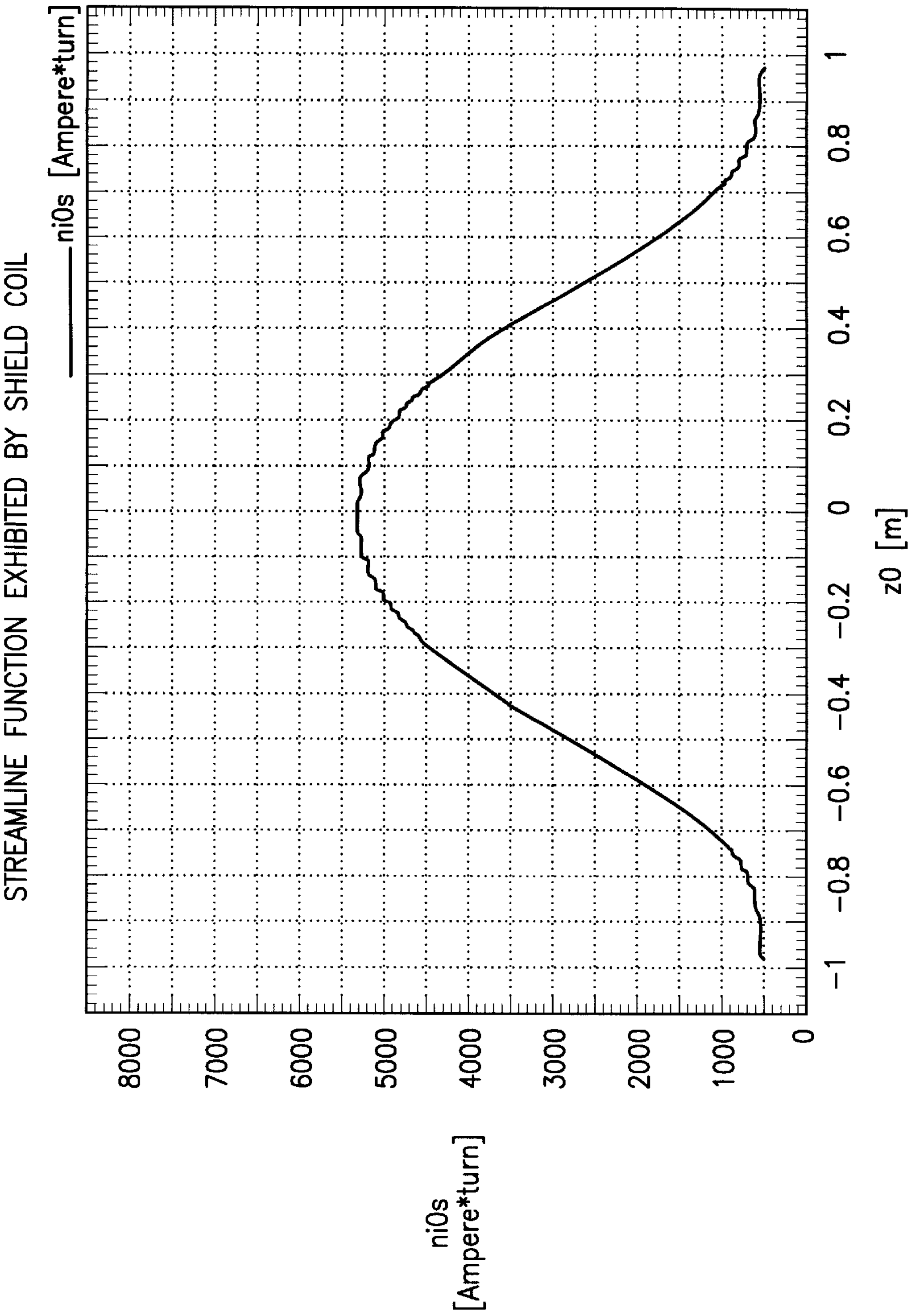
FIG. 21 is a simulated graph for explaining the streamline function characteristics of the shield coil of the Z coil assembly of the second embodiment.
Figure 22:
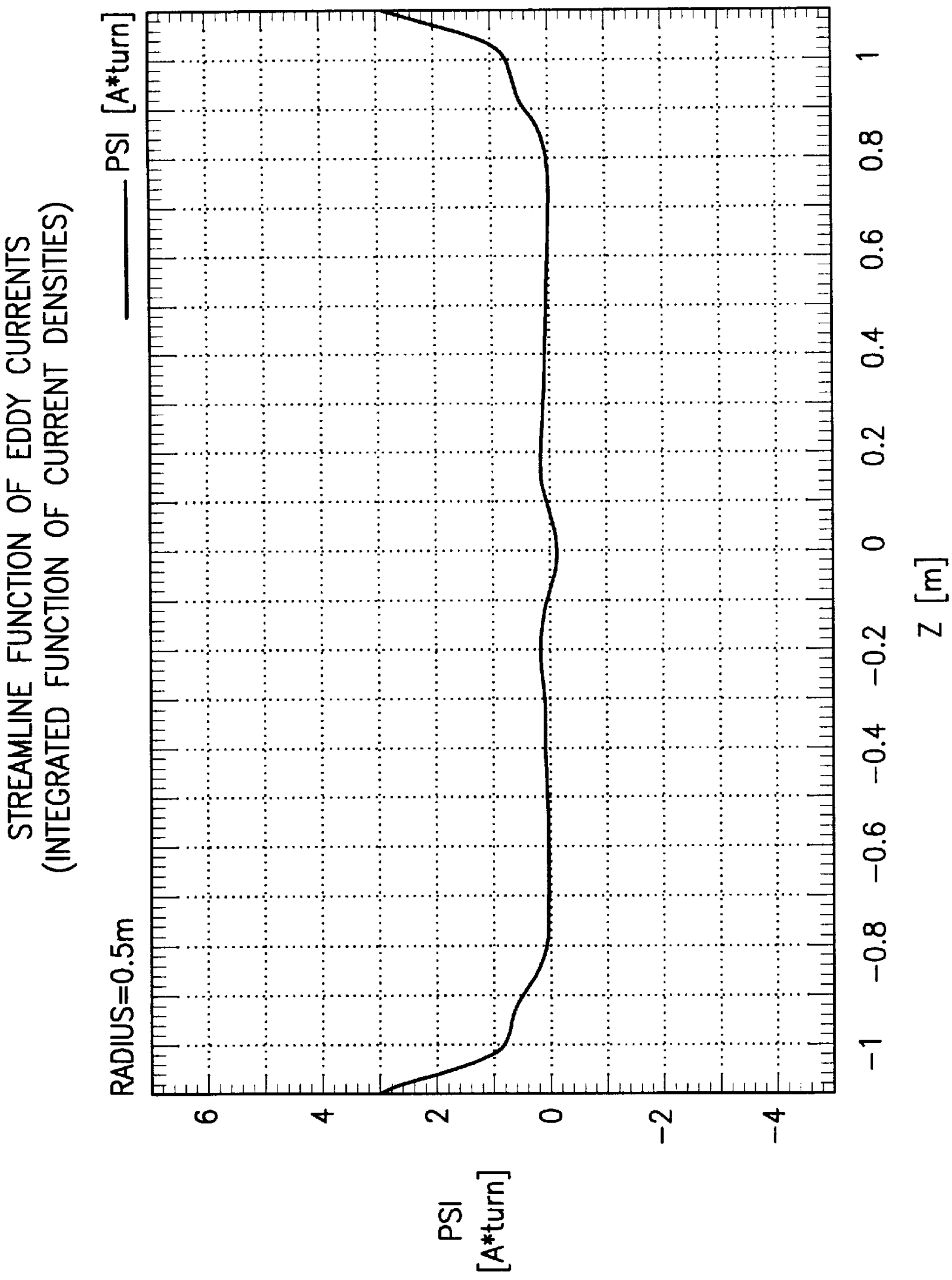
FIG. 22 is a diagram showing a streamline function of eddy currents caused due to the shield coil of the Z coil assembly of the second embodiment.

This will be detailed below. Conventionally, there is a problem in that gaps between windings are formed widely in the ends in the axial direction of the bobbin and in the center therein, since a wire member having a specified width is used. Assuming that, as shown in FIG. 19, a coil is created by winding a wire 100, which has a certain width, about a cylindrical bobbin 101, the actual width of the coil is determined with the width over windings of the area most crowded with windings (turns) (area in which windings are most dense). In other words, there is the restriction that a wire wider than the width over windings of an area A most crowded with windings cannot be used. Because of this restriction, when an ideal continuous distribution of currents is replaced with a discontinuous distribution of currents, a wide gap in which no wire exists is created between windings of a coil.

By contrast, the addition of fractional turns makes it possible to more closely approach the curve plotting a streamline function to an ideal state. Consequently, the state of generating shielding magnetic fluxes better approaches an ideal state. As a result, the performance of shielding magnetic fields improves.

In other words, a streamline functional curve that is smoothly streamlined relative to positions in the Z-axis direction can be obtained. The streamline function is closer to a continuous function. Therefore, in cooperation with the winding method described in the first embodiment, the qualities of MR images produced by the MRI system employing this ASGC unit can be improved outstandingly. The same is applied to MRS system.

Also, an ASGC unit can be designed with a one-layered wound state retained, if desired. It will not take place that the ASGC unit gets thicker in a radial direction thereof and causes a whole gantry to become larger. The introduction of the new concept of the fractional turns makes it possible to still use, as one auxiliary countermeasure, ex post facto correction of magnetic fields affected by eddy currents, such as, optimization of a pulse sequence which has been attempted in the past, or control of the phase of a radio-frequency pulse. This is accompanied by the secondary merit that one can prevent control of a pulse sequence from becoming too complex. The new concept will prove effective for spatial high-order components of magnetic fields affected by eddy currents, which cannot be treated by such ex post facto correction. In other words, the additional use of fractional turns of the present invention makes it possible to suppress eddy currents themselves to a low level. Such high-order magnetic field components themselves can therefore be minimized remarkably. This obviates the need for subsequent correction. Moreover, the resistances and inductances of coils themselves hardly vary. Therefore, even when fractional turns are added, the current-carrying capacity of a power supply used to generate magnetic field gradients need not be increased. A conventional power supply can be used.

Now, the qualitatively described effect of the present invention will be described more quantitatively by showing an example of the results of simulation.

Columns (a) and (b) of FIG. 20 individually show simulated winding positions of a main coil and a shield coil of a Z coil assembly including the fractional turns described above. A desired current I is set to 99.345[A]. The positions of windings in the drawing are positions on the positive side in the Z-axis direction. Actually, a wire is wound at symmetric positions on the negative side. Based on the winding positions, there is provided a streamline function curve of the shield coil shown in FIG. 21. Fractional turns for conducting a current 1/2 (where I equals to 99.345 A) are added to two positions, that is, in the center on the positive side in the Z-axis direction (positions in the Z-axis direction of about zero meter and of 0.0400 m) and at edges (positions of 0.97500 m and 1.03500 m). As apparent from FIG. 21, the streamline function curve is more smoothened and closer to its ideal curve, compared with that in the first embodiment, in the center in the Z-axis direction, that is, a range of Z=−0.3 [m] to 0.3 [m] or thereabout, and at both edges in the Z-axis direction, that is, ranges Z=−0.7 [m] to −1 [m] and Z=0.7 [m] to 1 [m] or thereabout. As a result, a streamline function is plotted in FIG. 22 for eddy currents caused by magnetic leakage. Compared with the curve shown in the first embodiment, induction of eddy currents in the center in the Z-axis direction and at both edges therein within the radius of 0.5 [m] is suppressed markedly and evened over all the positions in the Z-axis direction.

This means that the fractional turns work as expected. Thus, including such ASGC unit into an MRI system or MRS system enables one to increase the qualities of acquired MR data.

In the Z coil assembly in the second embodiment, as described above, fractional turns are implemented in the center in the Z-axis direction and at both edges therein. Alternatively, the fractional turns may be implemented either in the center or at edges. The fractional turns may be added to the shield coils alone of the Z coil assembly. Alternatively, the fractional turns may be added to both the main coils and shield coils. Otherwise, the fractional turns may be added to the main coils alone. Even when the fractional turns are added to the main coils, a streamline function of currents flowing into the main coils can be smoothed. The characteristic relevant to magnetic field gradients can be improved. This eventually contributes to improvement of qualities of MR images or MR data.

In the second embodiment, the technique of calculating a streamline function and determining positions of windings in relation to stepped currents using the function is adopted for determining the positions of windings forming coils. Alternatively, like in the prior art, a function of each current density may be integrated, and the position of a winding may be determined on the basis of the obtained integral of a function of current density.

Third Embodiment

A magnetic-field generation coil unit in accordance with the third embodiment of the present invention will be described in conjunction with FIGS. 23 to 26. In the magnetic-field generation coil unit in this embodiment, like that in the second embodiment, the present invention is implemented in a shield coil 12ZS having shield coil segments 12Z-3 and 12Z-4 included in a cylindrical Z coil assembly that is one of coil assemblies constituting an ASGC unit. Herein, components identical or similar to those in the first embodiment will be assigned the same reference numerals. The description of the components will be omitted or briefed.

The fractional turns described in the second embodiment have been configured such that shunt currents flow through a plurality shunt paths in the same circumferential direction. Hereinafter, such fractional turns are referred to as “non-reversed fractional turns”. In contrast, fractional turns introduced herein are referred to as “reversed fractional turns”, where shunt currents flow in mutually-opposite directions through each shunt path. The winding method may also be additionally applied to the shield coil in this embodiment.

As shown in (b) and (c) of FIG. 23, reversed fractional turns FTi and FTj are formed at the axial outermost ends of shield coil segments 12Z-3 and 12Z-4, respectively, and non-reversed fractional turns FTc and FTd are formed at the center thereof, respectively, in the same way as the second embodiment. In one shield coil segment 12Z-3, a lead extending from a power supply is branched into opposite-directionally wound windings F21 and F22 at specific winding positions −Z1 and −Z2 on one end portion of the bobbin B2, and the windings F21 and F22 are wound around the bobbin by one turn, respectively. After the one turn, the windings F21 and F22 are merged into the next turn wound at a position −Z3. The windings F21 and F22 are set to have the same resistance value. Therefore, currents flowing through the windings F21 and F22 are the same value of I/2, but +I/2 passes one winding and −I/2 passes through the remaining winding, producing two currents flowing in mutually-opposite circumferential directions. In the other shield coil segment, windings F23 and F24 make another reversed fractional turn FTj configured identically to the turn FTi.

With the reversed fractional turns FTi and FTj, an actual streamline function is provided as represented in (a) of FIG. 23. Ampere turn NI is stepwise raised at the position of the winding F21 (F24) by I/2 and then stepwise lowered at the adjoining position of the winding F22 (F23). This ups and downs in an actual streamline function are advantageous to, in particular, a gentle foot curve of -an ideal streamline function, approximating the actual curve closer to the ideal one. Thus, there are obtained the identical operation and advantages to the second embodiment.

The results of simulation carried out the inventor for a shield coil including non-reversed fractional turns (bobbin edges) and reversed fractional turns (bobbin center) which are described in FIG. 23 are shown.

Specifically, columns (a) and (b) of FIG. 24 individually show simulated winding positions of a main coil and a shield coil of a Z coil assembly including the fractional turns described above. For the shield coil, as shown in (b) of FIG. 24 a non-reversed fractional turn is added at the center in the Z-axis plus direction (at Z=appr. zero and 0.0400 [m]), while a reversed fractional turn is added at the edge therein (at Z=0.97500 [m] and 1.03500 [m]). In the Z-axis minus direction the identical turns are symmetrically added, which are not shown. These fractional turns are made up of I/2 turns (I =99.345 [A]). The remaining turns shown in (b) in FIG. 24 are normally-wound non-fractional one turns. Column (a) of FIG. 24, which is the same as (a) of FIG. 20, is listed again for each comparison. A desired drive current I is 99.345 [A].

Figure 25:
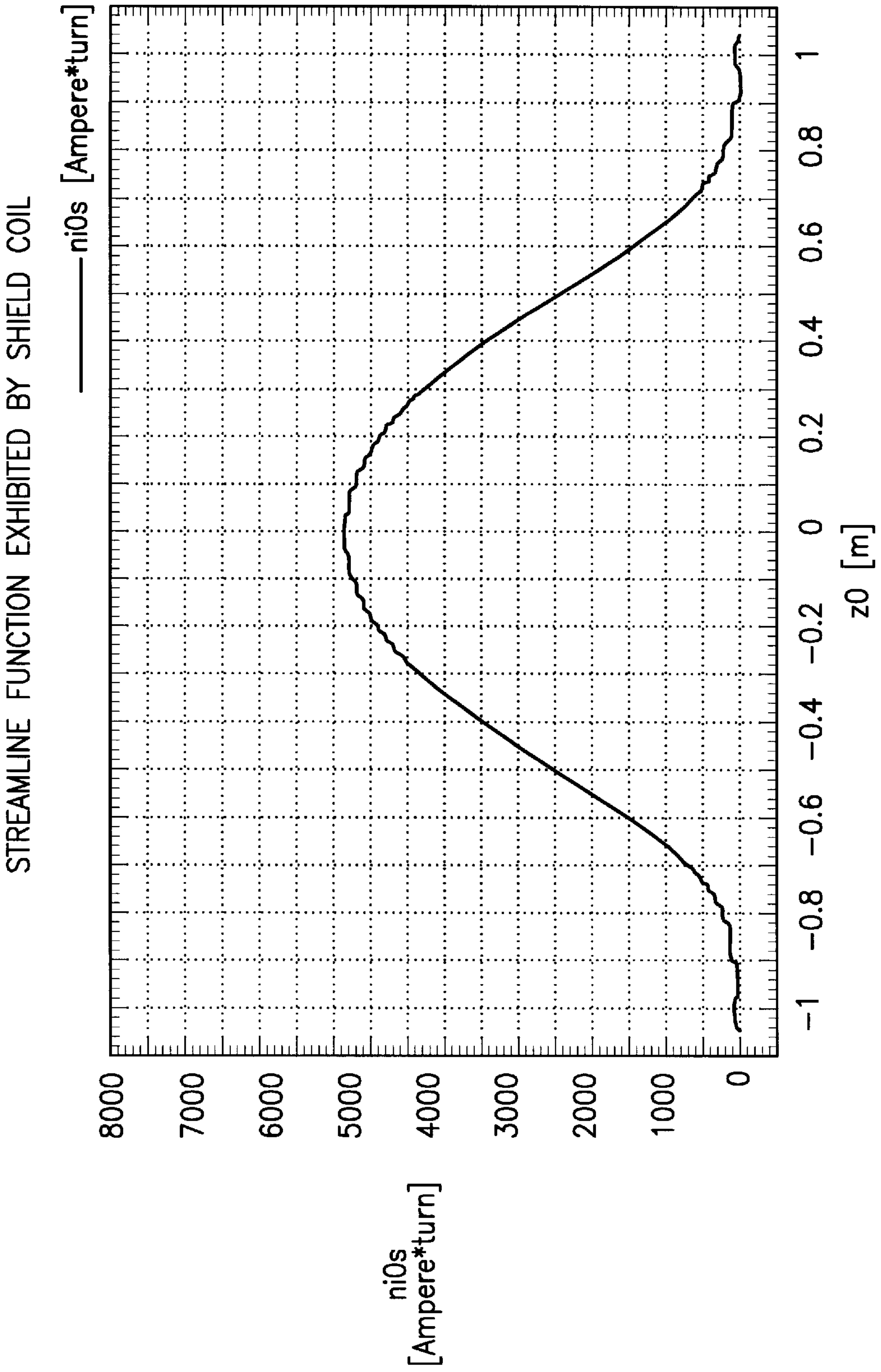
FIG. 25 is a simulated graph explaining the streamline function characteristics of the shield coil of the third embodiment.
Figure 26:
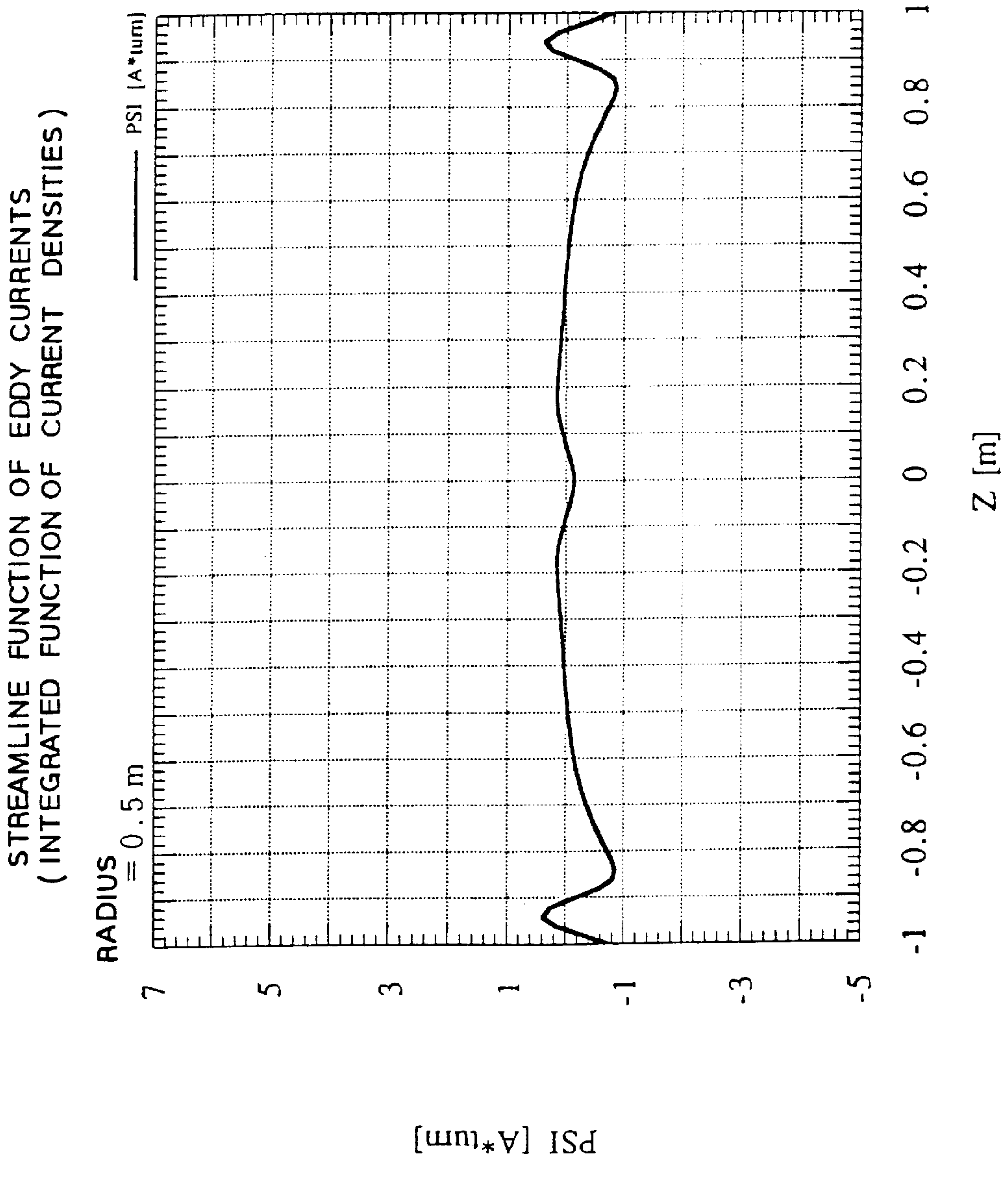
FIG. 26 is a simulated graph showing a streamline function of eddy currents caused due to the shield coil of the third embodiment.

A streamline function curve of eddy currents is simulated based on the foregoing coil winding arrangement and is shown in FIG. 25. As apparent from the figure, the streamline function curve is more smooth and closer to its ideal curve, compared with that in the first embodiment, in the center in the Z-axis direction, that is, a range of Z=−0.3 [m] to 0.3 [m] or thereabout, and at both edges in the Z-axis direction, that is, ranges Z=−0.7 [m] to −1.5 [m] and Z=0.7 [m] to 1.5 [m] or thereabout. As a result, a streamline function is plotted in FIG. 26 for eddy currents caused by magnetic leakage. Compared with the curve shown in the first embodiment, induction of eddy currents in the center in the Z-axis direction and at both edges therein within the radius of 0.5 [m] is suppressed markedly and evened over all the positions in the Z-axis direction.

This means that, like the second embodiment, the non-reversed and reversed fractional turns work as expected. Thus, including such ASGC unit into an MRI system or MRA system enables one to increase the qualities of acquired MR data.

Fourth Embodiment

A magnetic-field generation coil unit in accordance with fourth embodiment of the present invention will be described in conjunction with FIG. 27. In the magnetic-field generation coil unit in this embodiment, like that in the other exemplary embodiments, the present invention is implemented in a shield coil 12Z having shield coil segments 12Z-3 and 12Z-4 included in a cylindrical Z coil assembly that is one of coil assemblies constituting an ASGC unit.

The shield coil in this embodiment employs only one reversed fractional turn FTk arranged in the axial center range of the bobbin B2, in addition to non-reversed fractional turns arranged in both the axial end ranges thereof. The winding method according to the first embodiment, by which the positions of windings are sequentially determined from each of the axial outermost positions of the bobbin toward the axial center thereof, is also applied to the shield coil of this embodiment (The same will be applied to the following embodiments).

The reversed fractional turn FTk is made up of two windings F25 and F26 wound around the bobbin B2 at axially-centered winding positions −Z6 and Z6 thereof. A lead extending from a non-fractional winding around at a position −Z5 branches at the position −Z6 into the winding F25 (wound at the position −Z6) and the winding F26 (wound at the position Z6) of which circumferential winding directions are opposite to each other on the bobbin. Each of the two windings wound by one turn is merged at the position Z6 into a non-fractional adjoining winding wound at a position Z5. This winding structure makes it possible for shunt currents flowing through the two winding F25 and F26 to achieve I/2 current, respectively, and mutually-opposite flowing directions, when both the windings have the same value of impedance.

By the present embodiment, in addition to identical or similar operation and advantages to those described by the above embodiments, there is provided an advantage that the number of fractional turns is reduced to one, for the reversed fractional turn is placed in the axial center range of the bobbin. This is equivalent to a situation that in the foregoing embodiments, shunt currents passing the windings F6 and F7 wound in the axial center of the bobbin are canceled out, while shunts currents passing windings F5 and F8 solely make a contribution to an actual streamline function curve. In this way, arranging one reversed fractional turn in the center range of a bobbin permits a winding structure to be more simplified and winding work to be easier.

In the winding structure shown in FIG. 27, a crossed portion D, at which the two windings F25 and F26 cross each other, is constructed such that two half-thickness plate-like lead wires are laid on each other in an insulated state. This maintains a one-layered configuration of the shield coil.

Additionally, when a reversed fractional turn is placed in the axial center of a bobbin, there is provided an alternative shown in FIG. 28 in which a reversed fractional turn FTk' is formed. In this turn, two windings forming the turn are bridged over between two winding positions −Z6 and Z6 at a half-turn circumferential position on the bobbin. This also achieves an effective reversed fraction turn in a simplified winding configuration and the like.

Fifth Embodiment

A magnetic-field generation coil unit in accordance with the fifth embodiment of the present invention will be described in conjunction with FIGS. 29 to 31. In the magnetic-field generation coil unit in this embodiment, like that in the foregoing exemplary embodiments, the present invention is implemented in a shield coil having shield coil segments 12Z-3 and 12Z-4 included in a cylindrical Z coil assembly that is one of coil assemblies constituting an ASGC unit. Herein, components identical or similar to those in the first embodiment will be assigned the same reference numerals. The description of the components will be omitted or more brief.

The fifth embodiment attempts to exert the same operation and effect as the foregoing embodiments, and to set the resistances and/or inductances of turns (shunt paths) including fractional turns to the same values and achieve shunt of a current to an intended number of paths reliably. The points described below should be noted in creating fractional turns, though they are not referred to in the description of the magnetic-field generation coil unit of the foregoing embodiments.

(1) For shunting a current equally to turns, the resistances of turns (shunt paths) forming a fractional turn must be equalized. In designing a static coil or shim coils into which a steady-state current flows, this condition (1) should preferably be satisfied as a top priority.

(2) In designing a coil into which a pulsating current flows such as a coil for generating magnetic field gradients, the condition (1) must be satisfied, and the inductances of turns (shunt paths) constituting a fractional turn should preferably be set to an equal value.

Figure 29A:
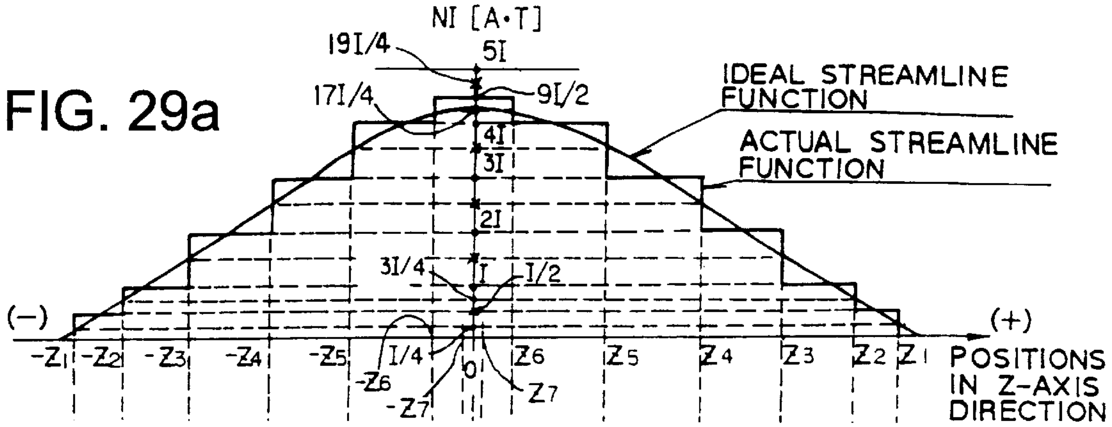
FIG. 29 is a simulated graph showing a streamline function of eddy currents caused due to the shield coil of the fifth embodiment.
Figure 29B:
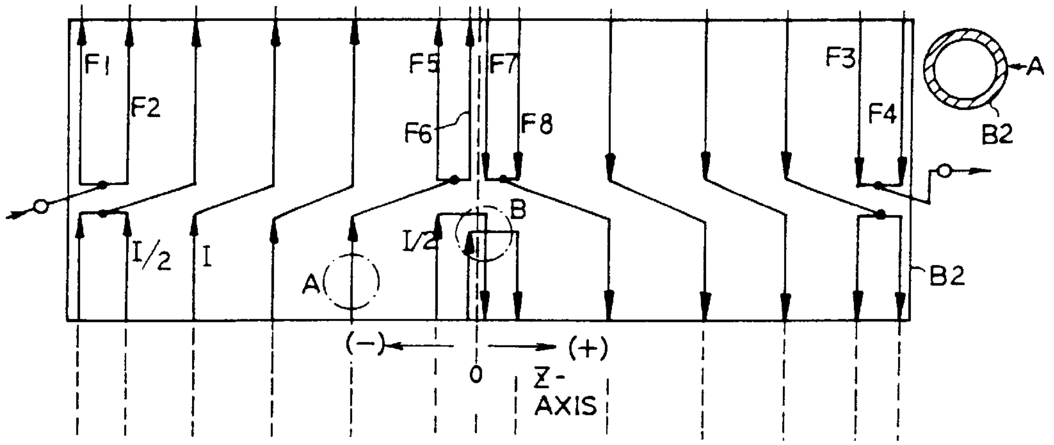
Figure 29C:
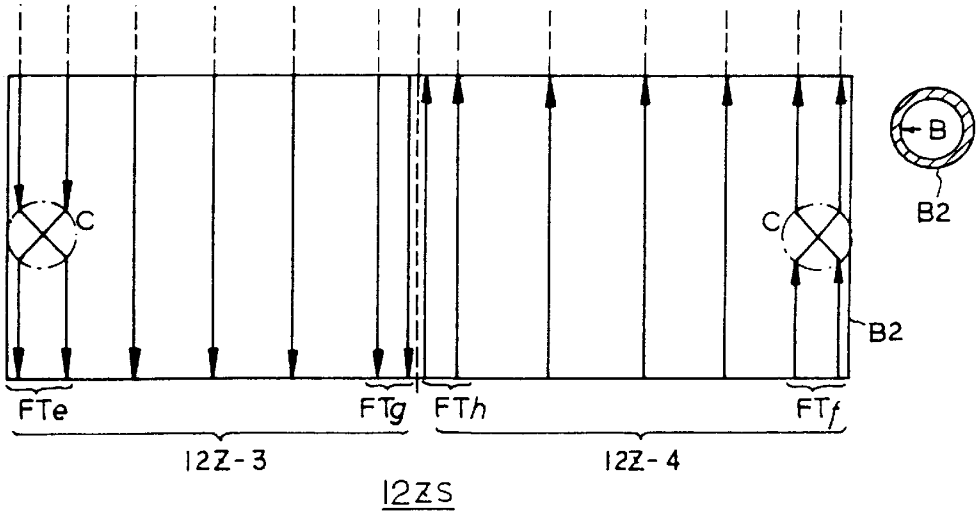
Figure 30:
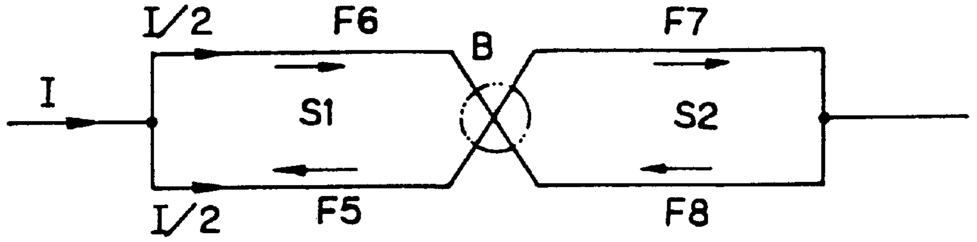
FIG. 30 is a diagram of an equivalent circuit of a fractional turn in the center.

For satisfying the conditions (1) and (2), the arrangement of windings and the way of winding shown in (b) and (c) of FIG. 29 are adopted for the shield coil segments 12Z-3 and 12Z-4 of the Z coil assembly of this embodiment. As illustrated, the technique described in conjunction with FIG. 17 in relation to the second embodiment is adopted for the shield coil segments 12Z-3 and 12Z-4, and non-fractional, fractional turns are created in the center in the Z-axis direction of the bobbin and at both edges therein. (b) and (c) of FIGS. 29 shows the same-direction flanks A and B of the shield coil segments 12Z-3 and 12Z-4.

To begin with, the fractional turns FTg and FTh in the center will be described. One of the fractional turns that is the fractional turn FTg is composed of windings F5 and F6, which are half current turns, located at positions −Z6 and −Z7 near the center on the negative side of the Z axis. The other fractional turn FTh is composed of windings F7 and F8, which are half current turns, located at positions Z7 and Z6 near the center on the positive side of the Z axis.

The positions of windings constituting the fractional turns FTg and FTh are identical to those in the second embodiment. When the windings F5 and F6 of the fractional turn FTg are linked to the other fractional turn FTh, ones of the adjoining windings to be folded back, that is, the windings F5 and F6 (F7 and F8) are crossed with each other (See area B indicated with a dot-dash line). The equivalent circuit is shown in FIG. 30. The lengths of the shunt paths (that is, the windings F5 and F7, or the windings F6 and F8) are set to an equal value. The resistances of the shunt paths are therefore set to the same value.

The orientations of the currents I/2 flowing into the fractional turns FTg and FTh are held to be the same as those in the second embodiment. The ability to cancel out magnetic fluxes generated by the windings F6 and F7 is guaranteed. Since the windings are crossed with each other, the orientations of currents (See arrows in FIG. 30) induced by interlinked magnetic fluxes and flowing into the two closed shunt loops S1 and S2 are the same. The magnetic fluxes generated by the closed loops S1 and S2 are therefore canceled out. The inductances of the shunt paths of the windings F6 and F8 or of the windings F5 and F7 become equal. In other words, the inductances of the windings F6 and F5 are equal to each other, and the inductances of the windings F7 and F8 are equal to each other.

Figure 31A:
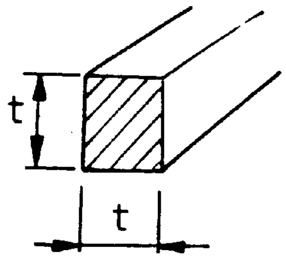
FIGS. 31A to 31C are diagrams for explaining cross sections of a conductor or conductors.
Figure 31B:
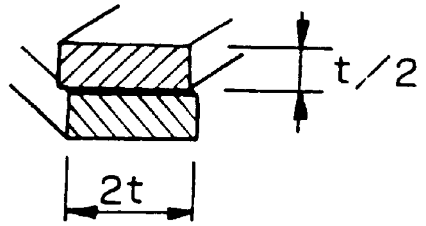

Among the windings forming the shield coil segments 12Z-3 and 12Z-4, a normal winding that is not shunted (into which a current I flows), which is, for example, marked with circle A indicated with a dot-dash line in (b) of FIG. 29, is formed with a wire whose vertical and lateral lengths is t and whose sectional area is $t^2$ as shown in (a) of FIG. 31. Two shunt paths of the windings F5 and F7 or windings F6 and F8 constituting a fractional turn are, as shown in (b) or (c) of FIG. 31, formed with a wire having a vertical length or thickness of t/2 over the whole paths. The thickness of an intersection between the windings F5 (F7) and F6 (F8) is therefore confined to t. The whole shield coil segments 12Z-3 and 12Z-4 may therefore be created by winding a wire in a layer.

Figure 31C:
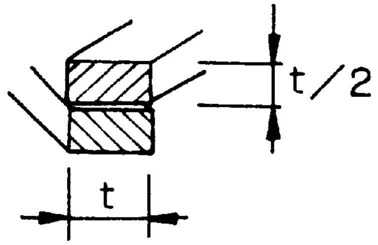

When the cross-sectional shape shown in (b) of FIG. 31 is adopted for the two shunt paths, although the thickness is t/2, since the width is 2t or twice as large as t, the cross-sectional area of each path is the same of the ordinary winding. The resistance per unit length across a fractional turn is a half that of the normal winding (an ampere turn, that is, a turn for conducting a current I). When the cross-sectional shape shown in (b) of FIG. 31 is adopted, the thickness of each of the shunt paths is t/2 and the width thereof is t as shown in FIG. 31*c*. That is a wire whose thickness is half of that of the normal winding is employed. The resistance per unit length across a fractional turn never the less equal to that of the normal winding (I ampere turn) because two wires are connected in parallel.

The fractional turns FTe and FTf at both edges of the bobbin are half current turns, that is, turns for conducting the current I/2 located at the same positions as the second embodiment. In consideration of the conditions (1) and (2), the resistances and inductances of the shunt paths constituting the fractional turn FTe or FTf are equalized. For equalizing the resistances, the lengths of the shunt paths (windings) are made equal with each other. For equalizing the inductances, as shown in circle C indicated with a dot-dash line in (c) of FIG. 29, the windings F1 and F2 (or F3 and F4) are crossed with each other. Thus, the ability to cancel out interlocked magnetic fluxes that induce currents, which is the same as the ability of the fractional turns in the center, is present.

As mentioned above, in the fifth embodiment, not only the operation and effect of the second embodiment can be ensured but also the resistances and inductances of the windings (shunt paths) of a fractional turn are set to the same values. Thus, when a pulsating current (magnetic field) is handled in order to, for example, generate magnetic field gradients, the ability to shunt a current reliably can be ensured owing to the fractional turns.

When the temporal variation of a pulsating current is moderate, the inductances of the windings of a fractional turn need not always be the same. In this case, for example, only the resistances of the windings may be made equal with one another.

The fractional turns in this embodiment can be adapted not only to shield coils but also to main coils. The fractional turns can be adapted not only to the Z channel of a gradient coil unit but also the X or Y channel thereof.

Only the resistances or inductances of the shunt paths constituting a fractional turn may be made equal with one another. Such fractional turns may be adapted to a static coil or shim coils.

In the foregoing second to fourth embodiments, intersecting the windings forming a fractional turn has not been explained. It is, of course, preferable that the fractional turns in those embodiments adopt such winding crossing configuration, if needed.

Figure 45:
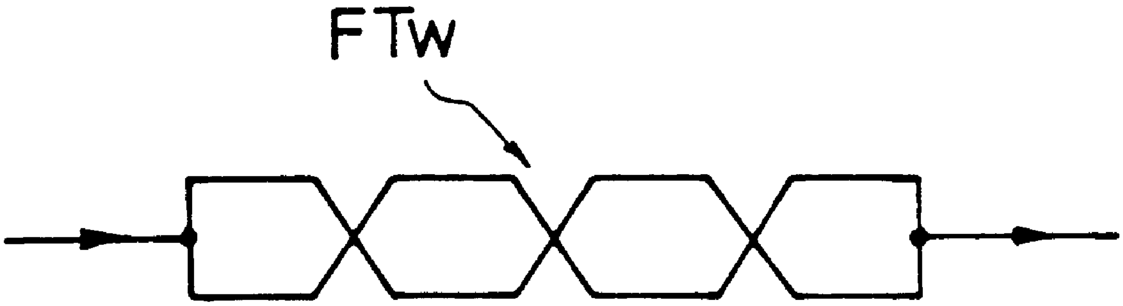
FIG. 45 is a diagram showing a variant of the fractional turn.

Still, the number of intersections formed in one fractional turn is not necessarily limited to one. The number can be determined with reference to a wide range of factors including magnetic flux generated from coils in other channels and can be developed into various modes. As an example, a mode is provided in which the number of intersections should be one for larger magnetic influence from other channels, while the number for larger magnetic influence from other channels and its complicated magnetic spatial distribution (for example, the number of intersections are three like shown by a fractional turn FTw in FIG. 45). On one hand, when such magnetic influence is comparatively fewer, an intersection is not always need.

Figure 32A:
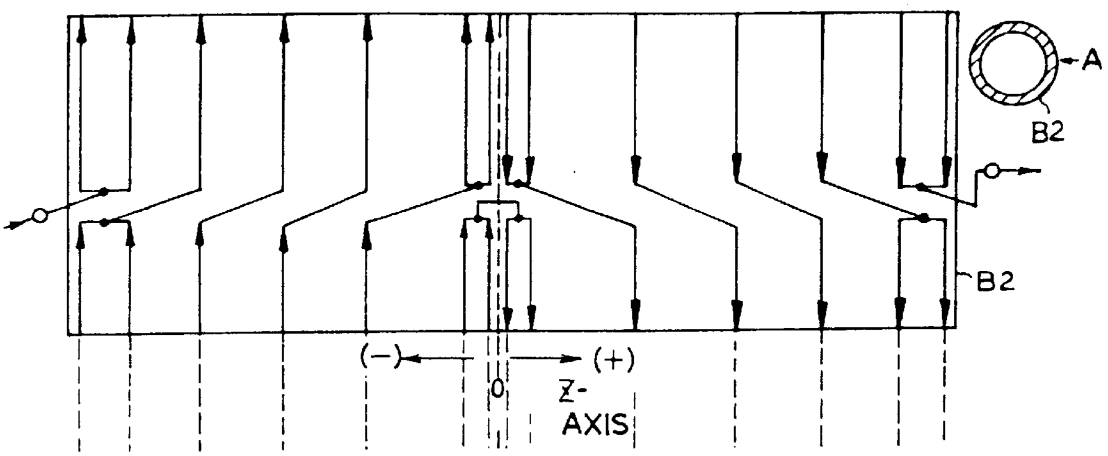
FIG. 32 is a diagram showing the positions of windings forming a shield coil in a variant of the fifth embodiment.
Figure 32B:
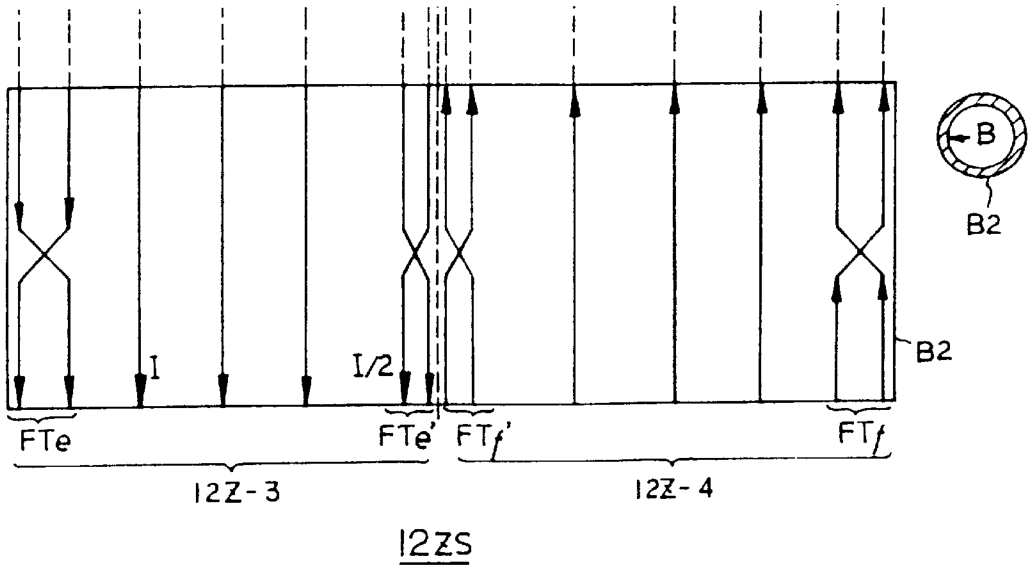

The structure of the fractional turns FTe and FTf implemented at the edges in the Z-axis direction of a bobbin in the fifth embodiment may be adapted to the fractional turns in the center thereof. An example is shown in (a) and (b) of FIG. 32. In this example, fractional turns FTe and FTf and fractional turns FTe' and FTf', which have the same structure, are adopted for the edges and center of the bobbin respectively. The resistances and inductances of the windings that are each a pair of shunt paths constituting each fractional turn are made equal with one another, whereby the ability to cancel out interlocked magnetic fluxes inducing currents can be better achieved. In particular, since all the fractional turns have the same structure, designing can be simplified.

The aforesaid fractional turns are not limited to specific windings positioned in the center in the Z-axis direction of a bobbin and at both edges therein. If desired, any middle winding (turn) may be replaced with a fractional turn. Alternatively, a fractional turn in accordance with the present invention may be additionally interposed between windings. Even when a different shape of a coil unit or a different way of winding for creating a coil is adopted, parts fractional turn can be carried out at any position.

Sixth Embodiment

The sixth embodiment of the present invention will be described in conjunction with FIG. 33. A magnetic-field generation coil unit of this embodiment includes the same shield coil segments 12Z-3 and 12Z-4 as that of the fifth embodiment. In this embodiment, a non-reversed fractional turn is developed into three shunt paths.

Figure 33A:
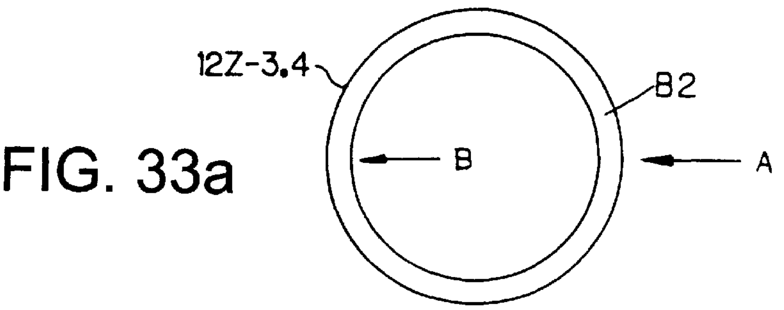
FIG. 33 is a diagram showing the positions of windings of a shield coil of a Z coil assembly in accordance with the sixth embodiment.
Figure 33B:
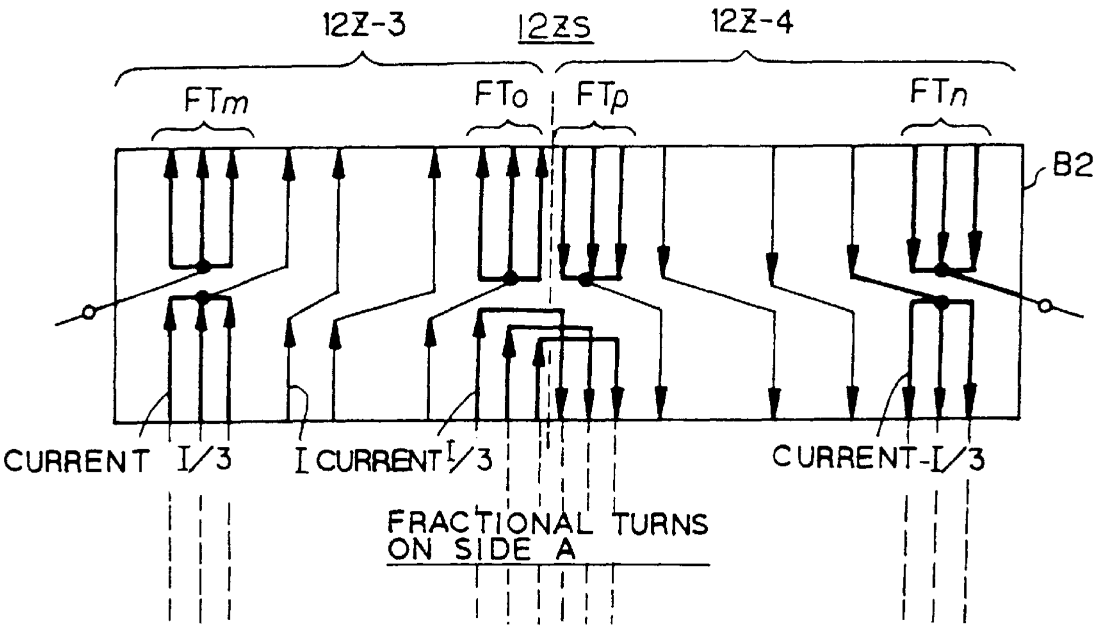
Figure 33C:
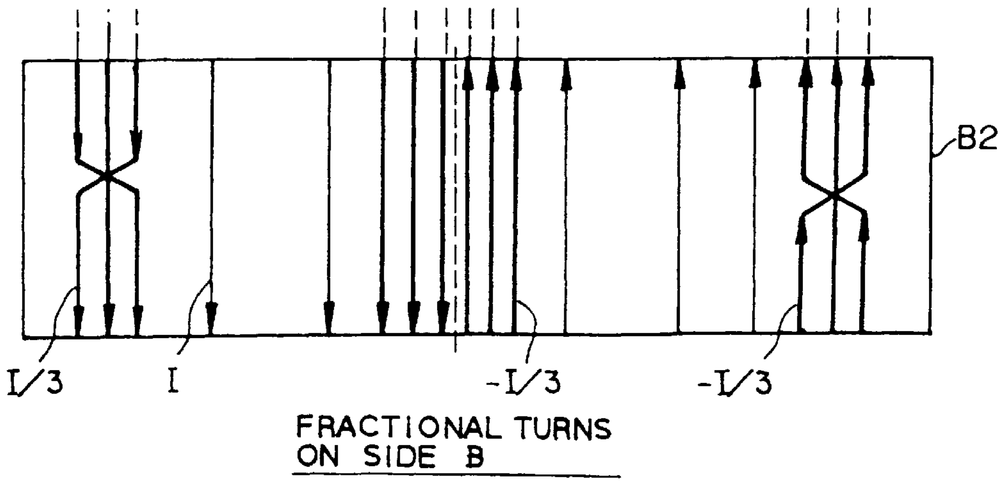

The parts (b) and (c) of FIG. 33 show models of the same-direction flanks A and B of a cylindrical bobbin B2, illustrating the positions of windings.

The shield coil segments 12Z-3 and 12Z-4 are paired to constitute a shielding Z channel. At both edges in the Z-axis direction of the shield coil segments 12Z-3 and 12Z-4, and in the center thereof, "one-third current turns" FTm, FTn, FTo, and FTp, that is, turns for conducting a current I/3 are formed as non-reversed fractional turns. The positions of windings constituting the one-third current turns FTm to FTp are determined according to the method employed in the aforesaid embodiment.

The lengths of the shunt paths (windings) constituting each of the one-third current turns FTm to FTp are made equal with one another and their resistances are set to the same value. Moreover, since the windings intersect one another, the inductances thereof are also made equal with one another. Owing to the one-third current turns, an actual distribution of magnetic fields can be smoothed more finely and caused to better approach an ideal distribution of magnetic fields. Moreover, the same opera ion and effect as the fifth embodiment can be realized for a pulsating current.

Alternatively, when a coil unit has fractional turns at both the axial edges of its cylindrical bobbin and the axial center thereof, it is not always necessary that their fractional turns be the same in shunt paths. For example, a modification is provided that the number of shunt paths is two for each of the fractional turns wound at the axial edges and three for the fractional turn wound in the axial center. Various modifications can be achieved in relation to conditions in designing coils.

Seventh Embodiment

A magnetic-field generation coil unit of the seventh exemplary embodiment of the present invention will be described in conjunction with FIGS. 34 to 37. A Y coil assembly 12Y forming the Y channel of the actively shielded gradient coil unit 12 shown in FIG. 2 will be described as the magnetic-field generation coil unit.

Figure 34:
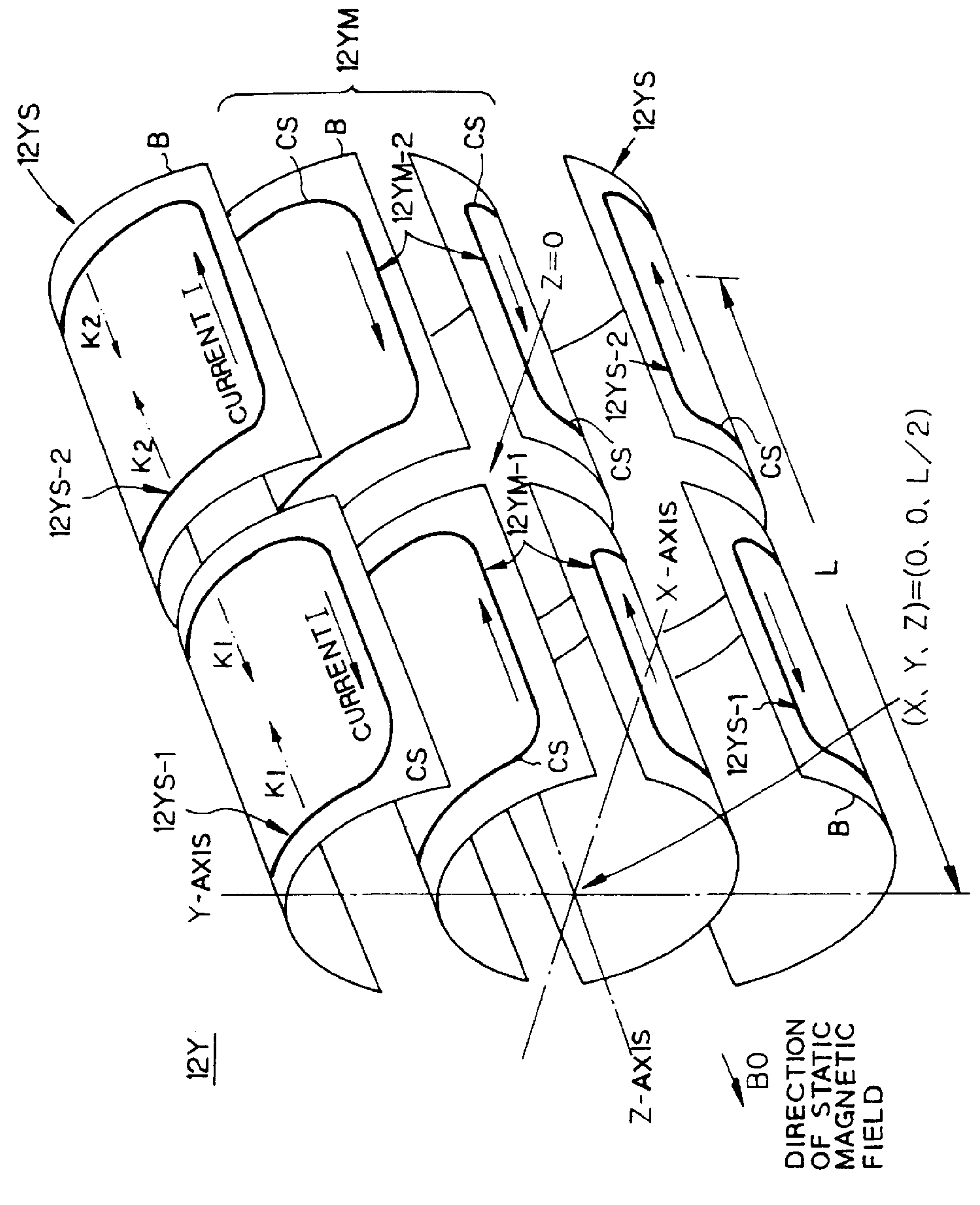
FIG. 34 is a schematic oblique view of a Y coil assembly of an actively shielded gradient coil unit in accordance with the seventh embodiment.

The Y coil assembly 12Y including bobbins is, as shown in FIG. 34, shaped substantially like a cylinder as a whole. The coil unit includes a main coil 12YM and shield coil 12YS. The main coil 12YM are arranged symmetrically with respect to a ZX plane with an origin (X, Y, Z)=(0, 0, 0) in the space as a center. The main coil includes two pairs of (four) semicylindrical bobbins B and two pairs of main coil segments 12YM-1 and 12YM-2 placed on the bobbins B. Each pair of main coil segments 12YM-1 (or 12YM-2) are formed with two coil segments CS that are patterned in the form of a saddle on the bobbins B and that are opposed to each other with the XZ plane between them.

The shield coil 12YS is located around the outer circumferences of the main coil 12YM while separated from the main coil by a given length in a radial direction, and shaped like a cylinder covering the main coil 12YM entirely. The shield coil 12YS has the same structure as the main coil 12YM, though they have a different diameter. Specifically, the shield coil 12YS includes two pairs of semicylindrical bobbins B, which are juxtaposed in the Z-axis direction with the original (X, Y, Z)=(0, 0, 0) in the space between them, and two pairs of shield coil segments 12YS-1 and 12YS-2 placed on the bobbins B. Each pair of shield coil segments 12YS-1 (or 12YS-2) are formed with two coil segments CS that are patterned in the form of a saddle on the bobbins and that are opposed to each other with the XZ plane between them.

The coil patterns on the coil segments CS of the main coil 12YM and shield coil 12YS are spiral patterns each of which looks like it contains multiple spiral turns in development. The coil patterns may be produced using known techniques.

Figure 35:
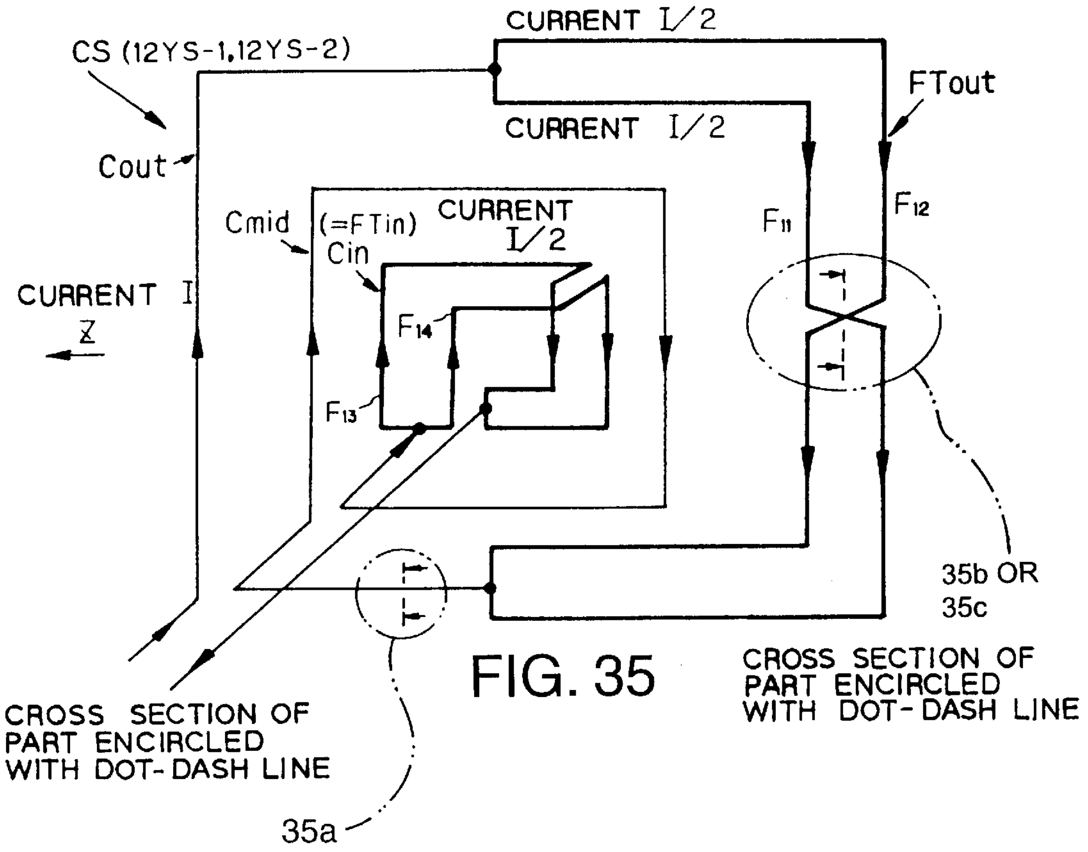
FIG. 35 is a diagram showing a model of fractional turns on a coil segment of the Y coil assembly.
Figure 35A:
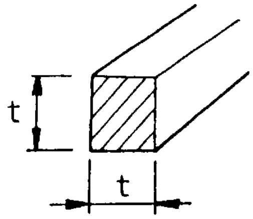
Figure 35B:
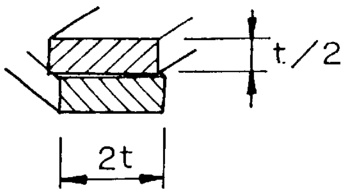
Figure 35C:
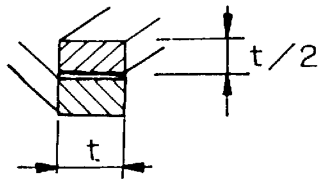

In this embodiment, fractional patterning of the present invention is performed on the coil segments CS included in the Y channel. The patterning is illustrated in the form of a model in FIG. 35. In FIG. 35, for a better understanding, one coil segment CS is shown as a saddle coil having only three spiral turns. Still, the positions of windings of the shield coil of Y channel in this embodiment are determined based on the method described by the first embodiment. In other words, for each coil segment CS, the winding positions are determined in the direction starting at each edge in the Z-axis direction and advancing toward the center portion of the coil segment, as shown by an arrows K1 or K2 in FIG. 34.

In FIG. 35, the three turns of current paths shall be referred to as paths Cout, Cmid, and Cin orderly from the outer path. The outermost path Cout has a fractional turn FTout inserted partly in the middle thereof. The fractional turn FTout is composed of shunt paths F11 and F12 bifurcating from the current path Cout at a given position on the current path Cout. The shunt paths F11 and F12 are crossed at a given middle position (however, mutually isolated), and merged into the current path Cout at a given position on the current path Cout.

The remaining part of the outer current path Cout other than the fractional turn FTout is formed with one wire having a thickness t (width t). The aspect ratio of the wire may be determined arbitrarily. By contrast, the shunt paths F11 and F12 of the fractional turn FTout are each formed with a wire having a thickness t/2 (width 2t or t). The lengths of the shunt paths F11 and F12 along the current path are set to the same value. The resistances of the shunt paths F11 and F12 are therefore equal to each other. Since the shunt paths F11 and F12 are crossed with each other, electromotive forces of the closed loops causing eddy currents can be canceled out. Consequently, the inductances of the shunt paths F11 and F12 are equal to each other. The total thickness of the wires at the intersection is t (=t/2+t/2).

The middle current path Cmid is formed with one wire (having a thickness t and width t) over the whole circumference thereof.

The innermost current path Cin is formed with a fractional turn FTin over the whole circumference thereof. Specifically, the inner current path Cin (=FTin) is bifurcated into shunt paths F13 and F14 at the start point. The shunt paths F13 and F14 are crossed each other at a given position in the middle of the current path, and merged into the current path at the end point after making one turn. In the case of the fractional turn FTin formed over the whole circumference of the current path, the shunt paths F13 and F14 are formed by turning a wire having a thickness t/2 (width 2t or t) according to a given pattern from beginning to end. Even in this case, the resistances and inductances of the shunt paths F13 and F14 are equal to each other. The total thickness of the wires at the intersection is retained at t.

Figure 36:
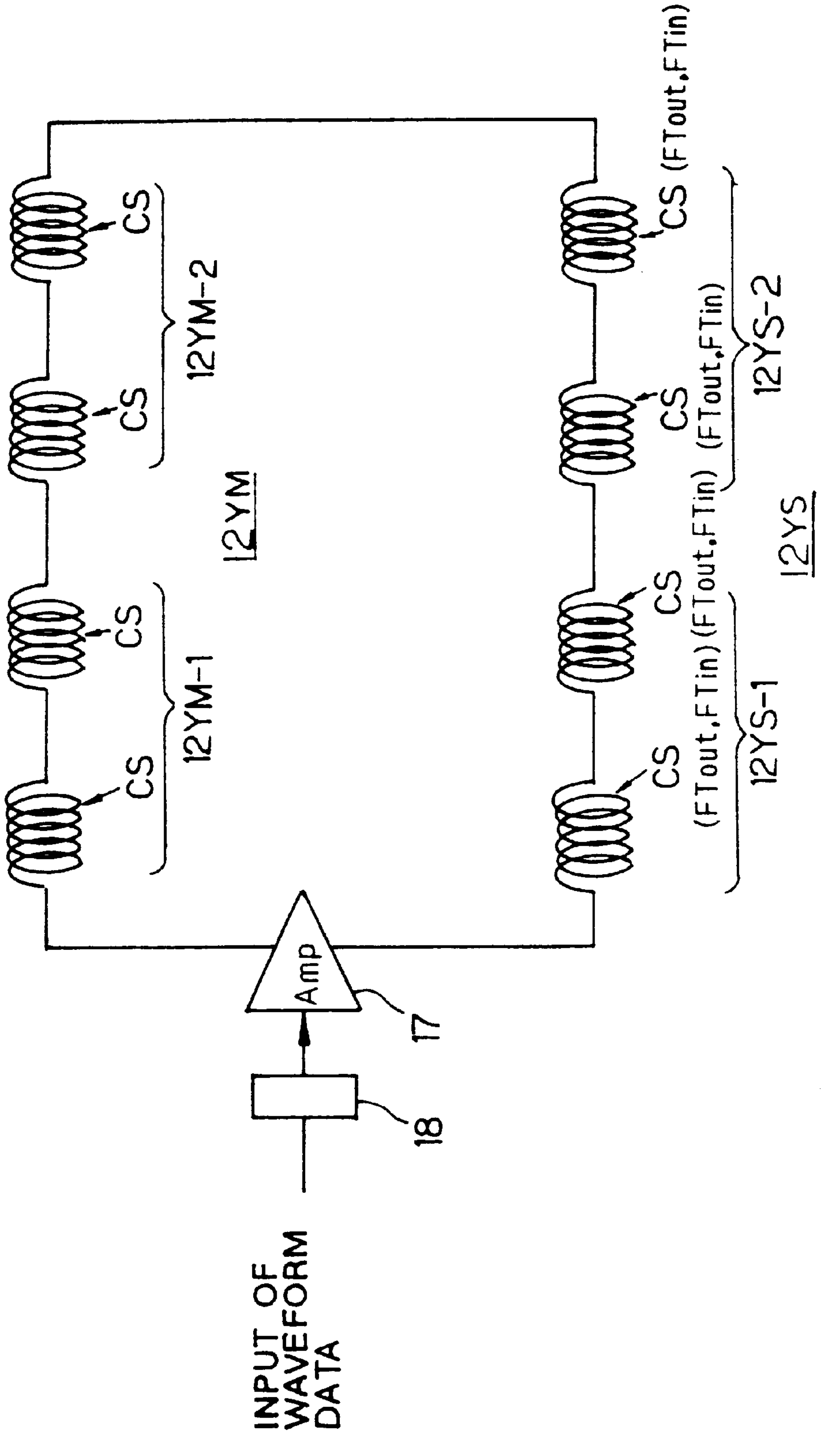
FIG. 36 is a diagram of an equivalent circuit of the Y coil assembly.

A pulsating current I fed to a feed terminal of the outer current path Cout is bisected exactly into currents I/2 by the shunt paths F11 and F12, and merged into the current I. The current I flows along the middle current path Cmin and then enters the innermost current path Cin. In the current path Cin, the exactly bisected currents I/2 flow into the shunt paths F13 and F14 from the beginning, makes a turn, and then flow into a subsequent coil segment through another feed terminal. FIG. 36 shows an equivalent circuit of the Y channel in which the coil segments CS of the main coil and those of the shield coil are connected in series respectively, and into which the pulsating current I flows. Fractional turns are not shown to be included in the coils of the shield coil 12YS in FIG. 36. However, the coil segments CS each include fractional turns FTout and FTin.

Figure 37:
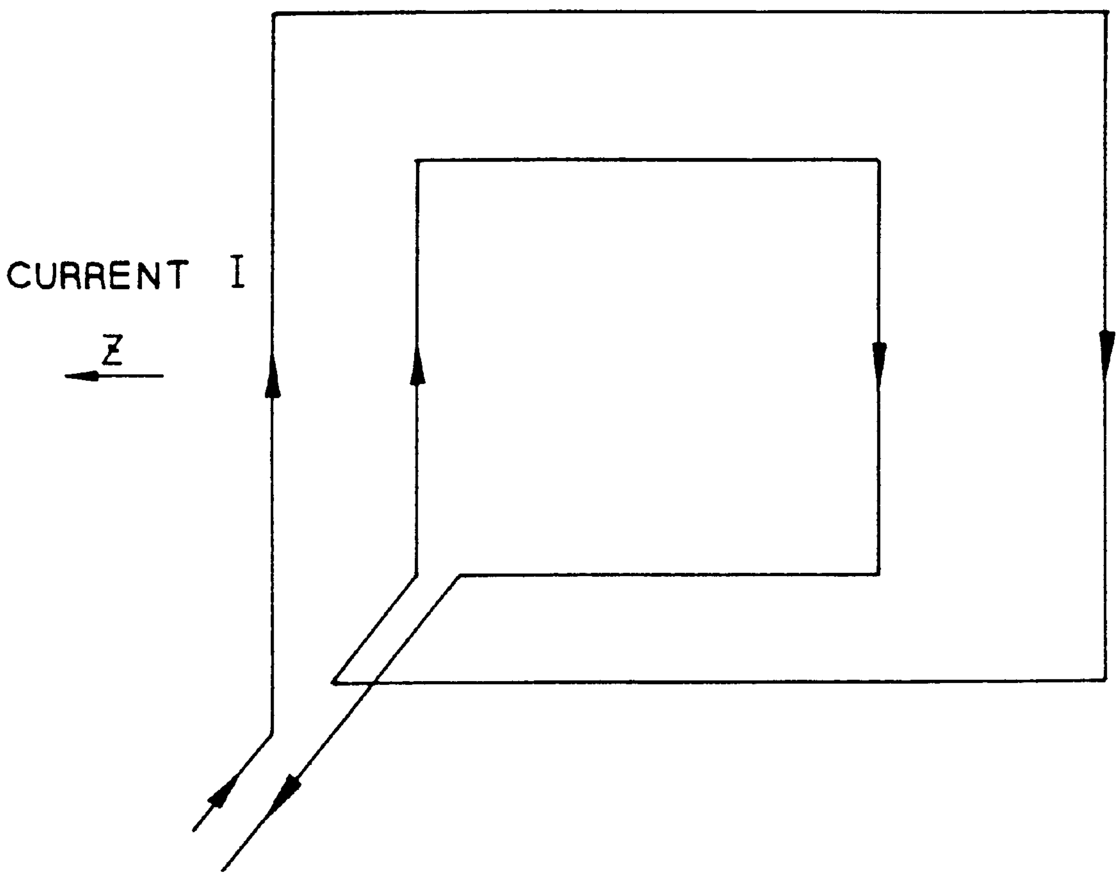
FIG. 37 is a diagram of a model of a coil segment of a Y coil assembly referred to for comparison with and explanation of the operation and effect of the seventh embodiment.

The coil segments CS are placed on the bobbins shown in FIG. 34. When fractional turns are not employed, as shown in FIG. 37, a gap is, as mentioned previously, created between wires in the center in the Z-axis direction of a spiral coil segment and at edges thereof. Using the fractional turns of this embodiment, the gaps can be filled up. Consequently, the curve of a streamlined function exhibited by shield coils can be smoothed and approaches more closely to an ideal curve. Magnetic fields leaking out from the gaps can be shielded properly. This enables, as described previously, suppression of eddy currents. The original object of an ASGC can be achieved and image quality can be improved. Moreover, the compactness of a coil unit in a radial direction will not be impaired while a one-layered wound state is retained.

Furthermore, the resistances and inductances of shunt paths constituting a fractional turn are equal to each other. Even a pulsating current can be shunted exactly. A high-precision shielding ability can be provided reliably.

In the foregoing embodiment, both the resistances and inductances of paths constituting a fractional turn are made equal with each other. For a structural reason or the like, either of the resistances and inductances may be made equal with each other. Fractional turns may also be performed on the main coil of the Y channel or may be performed only on the main coil.

The number of fractional turns FTout and FTin and the positions thereof (to which turn the fractional turns are inserted) can be determined arbitrarily. As far as an actual streamline function can be smoothed to approach to an ideal streamline function as closely as possible, the number of fractional turns and the positions thereof may be determined in consideration of actual physical conditions. In the above description, the outer fractional turn FTout is inserted partly in the middle of the current path Cout. Alternatively, like the inner fractional turn FTin, the outer fractional turn FTout may be formed along the whole length thereof.

Furthermore, the fractional turns may be implemented in the X coil assembly 12X for producing magnetic field gradients that change in the X-axis direction. The X coil assembly 12X is equivalent to a coil assembly made by turning the Y coil assembly 12Y by 90° about the Z axis. The fractional turns can be adapted in appropriate forms to the main coil of the X coil assembly or/and the shield coil thereof.

Still, in the winding structure exemplified by FIG. 35, the position of the crossed point of windings formed in each of the fractional turns FTout and FTin is changeable in the whole length of each turn, not necessarily fixed at the center position therein. In the case that, for example, magnetic flux generated from another channel intersects the loop of shunt paths in a way that magnetic imbalance occurs therein, the position of the crossed point of windings in a fractional turn can be adjusted to exclude effects caused by the magnetic imbalance. This adjustment is particularly preferable to a coil unit used for generating an asymmetric gradient.

Figure 38:
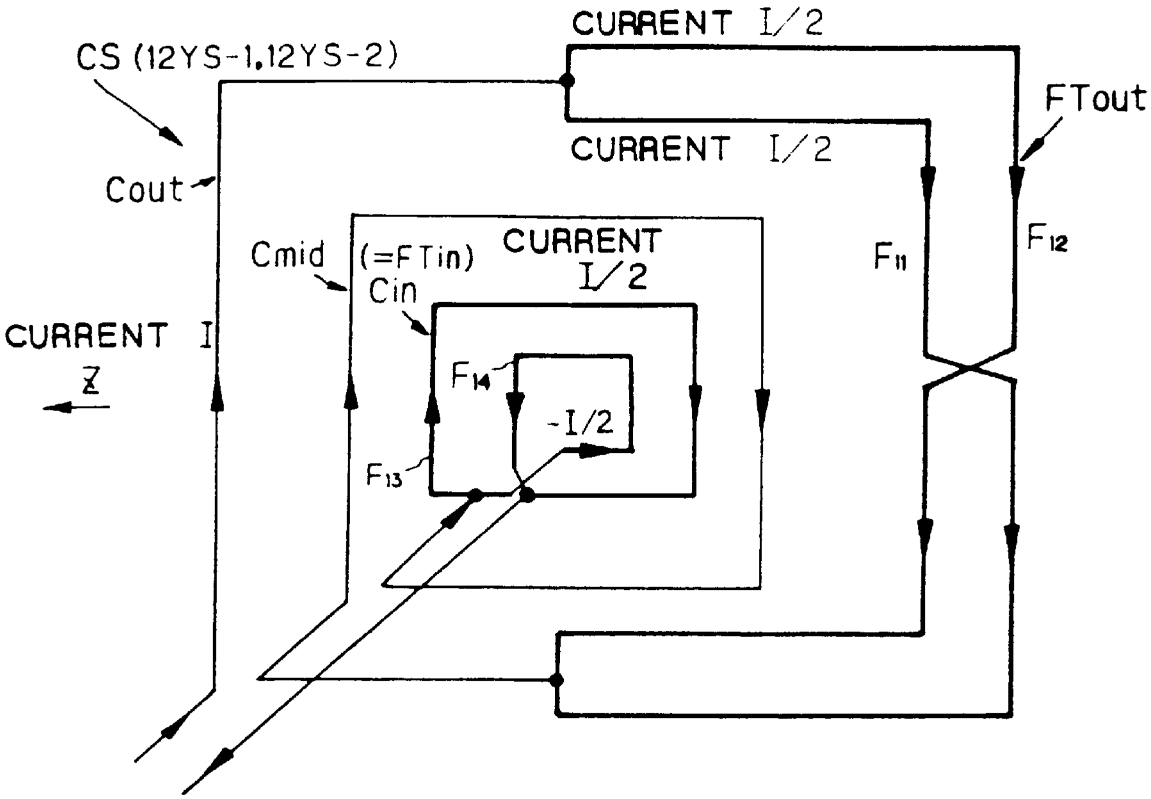
FIG. 38 is a diagram showing a reversed fractional turn on a coil segment of the Y coil assembly in a variant of the seventh embodiment.

Still further, although the foregoing inner fractional turn FTin employs a non-reversed fractional turn, this fractional turn may be replaced by a reversed fractional turn, which is exemplified in FIG. 38.

Eighth Embodiment

The eighth embodiment of the present invention will be described in conjunction with FIG. 39. In this embodiment, like the seventh embodiment, the present invention is implemented in the shield coil segment pairs 12YS-1 and 12YS-2 of the Y coil assembly 12Y of the actively shielded gradient coil unit 12. Each non-reversed fractional turn is developed into a one-third current turn, that is, a turn for conducting a current I/3.

Figure 39:
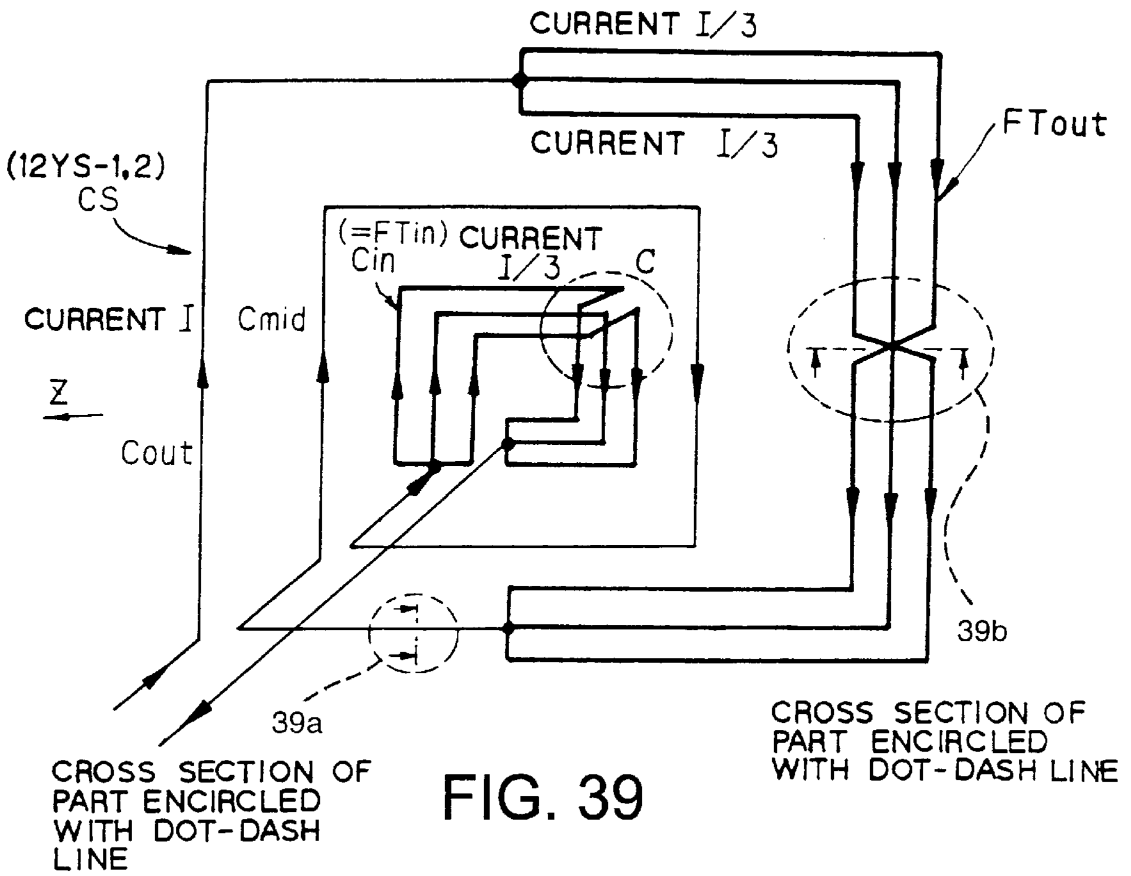
FIG. 39 is a schematic oblique view showing the positions of windings of a coil segment of a Y coil assembly in accordance with the eighth embodiment.
Figure 39A:
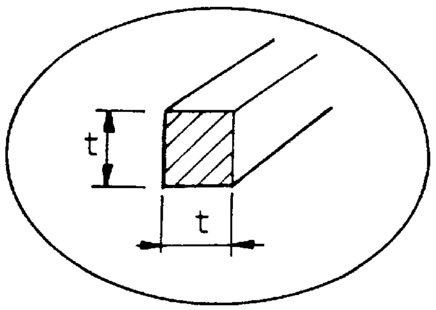
Figure 39B:
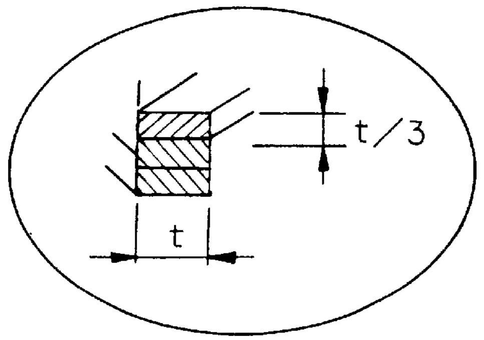

Each shielding coil segment CS (shield coil) of the Y coil assembly 12Y has, as shown in FIG. 39, three turns of current paths Cout, Cmid, and Cin. Among the current paths, the current path Cout turning on the outside has a fractional turn FTout, which is a one-third current turn for branching the current path into three paths and conducting the current I/3, formed partly in the middle thereof. The inner current path Cin has a fractional turn FTin, which is a one-third current turn for conducting the current I/3, formed along the whole length thereof.

Three branch wires (shunt paths) of the outer fractional turn FTout each have the same width t as one unbranched wire but have a thickness t/3 (See sectional explanatory insets (a) and (b) of FIG. 39). The cross-sectional area of one branch wire is one-third of that of the unbranched wire. Since the three wires are connected in parallel, the three wires have the same resistance as an ampere turn that is a turn for conducting the current I.

The lengths of the three branch wires of the outer fractional turn FTout are equal to one another. The three branch wires are intersected at a given middle position. The resistances and inductances of the shunt paths are therefore equal to one another. Not only a steady-state current but also a pulsating current can be shunted exactly by the one-third current turn. At an intersection, since the thickness of each wire is set to t/3, a one-layered wound state can be maintained for the whole of a shield coil included in the Y coil assembly 12Y even at the intersection of the wires. The compactness of the Y coil assembly in the radial direction can be maintained. Incidentally, the thickness of each of the three branch wires is not limited to t/3. When the thickness of one layer of a shield coil can be increased, the branch wires may be made thicker (the thicknesses may be set to a larger absolute value).

By the way, the three branch wires (shunt paths) of the inner fractional turn FTin are intersected at a given middle position. The inner fractional turn FTin thus serves as a one-third current turn. However, as shown in circle C drawn with a dashed line in FIG. 39, the branch wires are intersected one another at three positions by crossing twos of the branch wires. Even when the thickness of each branch wire is set to t/2, the one-layered wound state can be retained. The resistances and inductances of the shunt paths constituting the inner fractional turn FTin are set to equal values. Consequently, a shunt ability can be provided reliably.

Ninth Embodiment

The ninth embodiment of the present invention will be described in conjunction with FIG. 40. This embodiment results from further exploitation of the eighth embodiment, wherein a one-n-th current turn, that is, a turn for conducting a current I/n (where n is an integer larger than 3) is implemented in the aforesaid shield coil 12YS.

Figure 40:
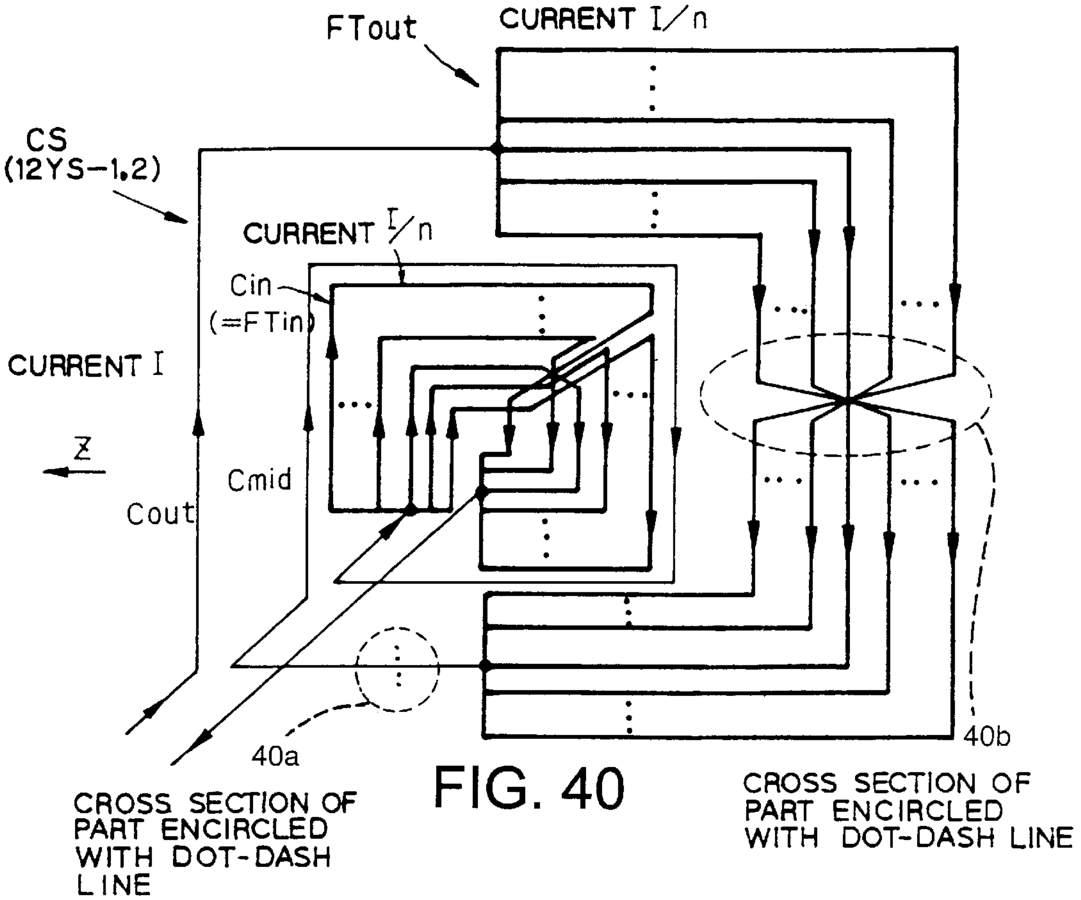
FIG. 40 is a schematic oblique view showing the positions of windings of a coil segment of a Y coil assembly in accordance with the ninth embodiment.
Figure 40A:
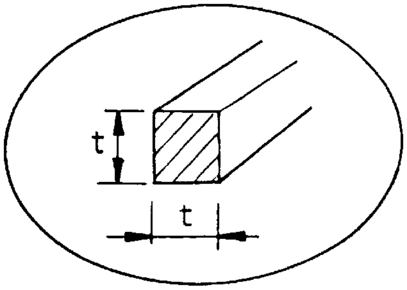
Figure 40B:
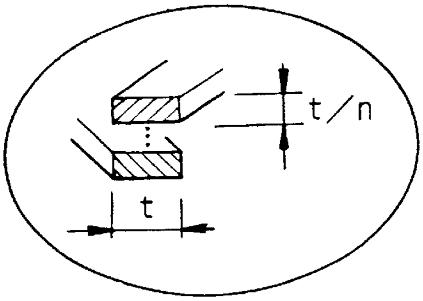

Each shielding coil segment CS (shield coil) of the Y coil assembly 12Y is, as shown in FIG. 40, composed of three current paths Cout, Cmid, and Cin, for example. Among the current paths, the current path Cout turning on the outside has a fractional turn FTout, which is a one-n-th current turn for branching the current path into n paths, formed partly in the middle thereof. The inner current path Cin has a fractional turn FTin, which is a one-n-th current turn, formed along the whole length thereof.

Each of the fractional turns FTout and FTin is composed of n branch wires (shunt paths) and has the structural characteristics of the aforesaid one-third current turn. Since the thickness of one branch wire is set to, for example, t/n, the one-layered wound state is retained for the whole of the shield coil even at the intersection of the n branch wires.

Consequently, the operation and effect equivalent to the aforesaid ones can be provided. Moreover, since the number of branches is increased, a stepwise streamlined function exhibited by the coil structure can be smoothed more precisely and approach more closely to a continuous ideal streamlined function.

Tenth Embodiment

A magnetic-field generation coil unit of the tenth embodiment will be described in conjunction with FIGS. 41 and 42. As the magnetic-field generation coil unit, a shim coil 8 (for correcting a static magnetic field) for producing magnetic fields directed in the Z-axis direction (Z channel) will be exemplified.

Figure 41A:
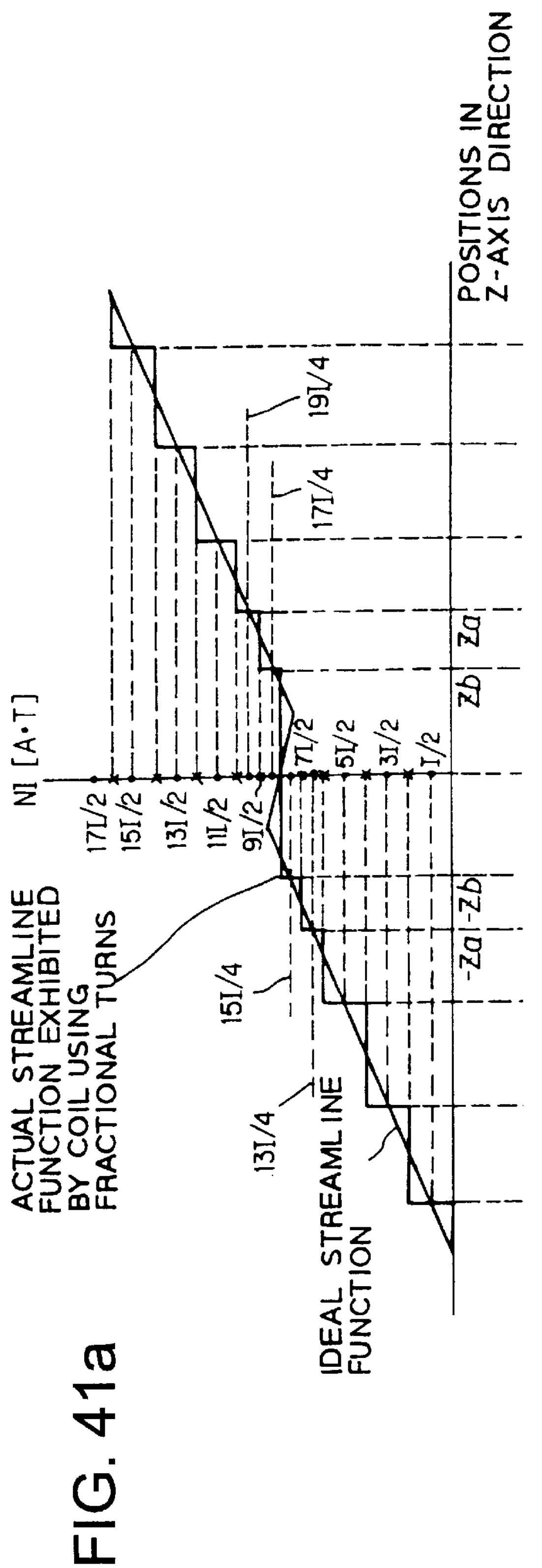
FIG. 41 is a diagram showing a streamline function exhibited by a shim coil for producing magnetic fields directed in the Z-axis direction in accordance with the tenth embodiment.
Figure 41B:
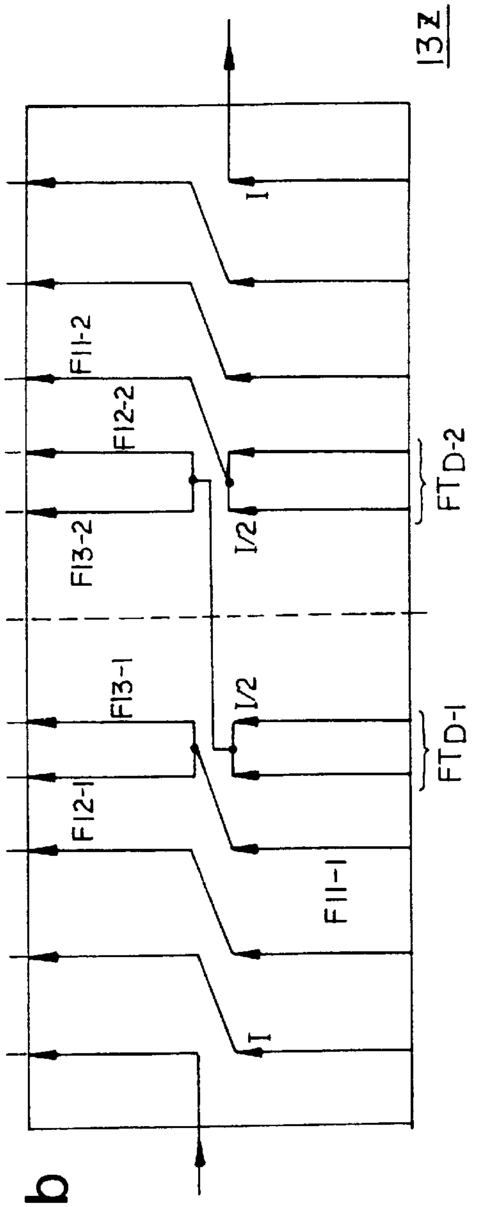
Figures 42A, 42B:
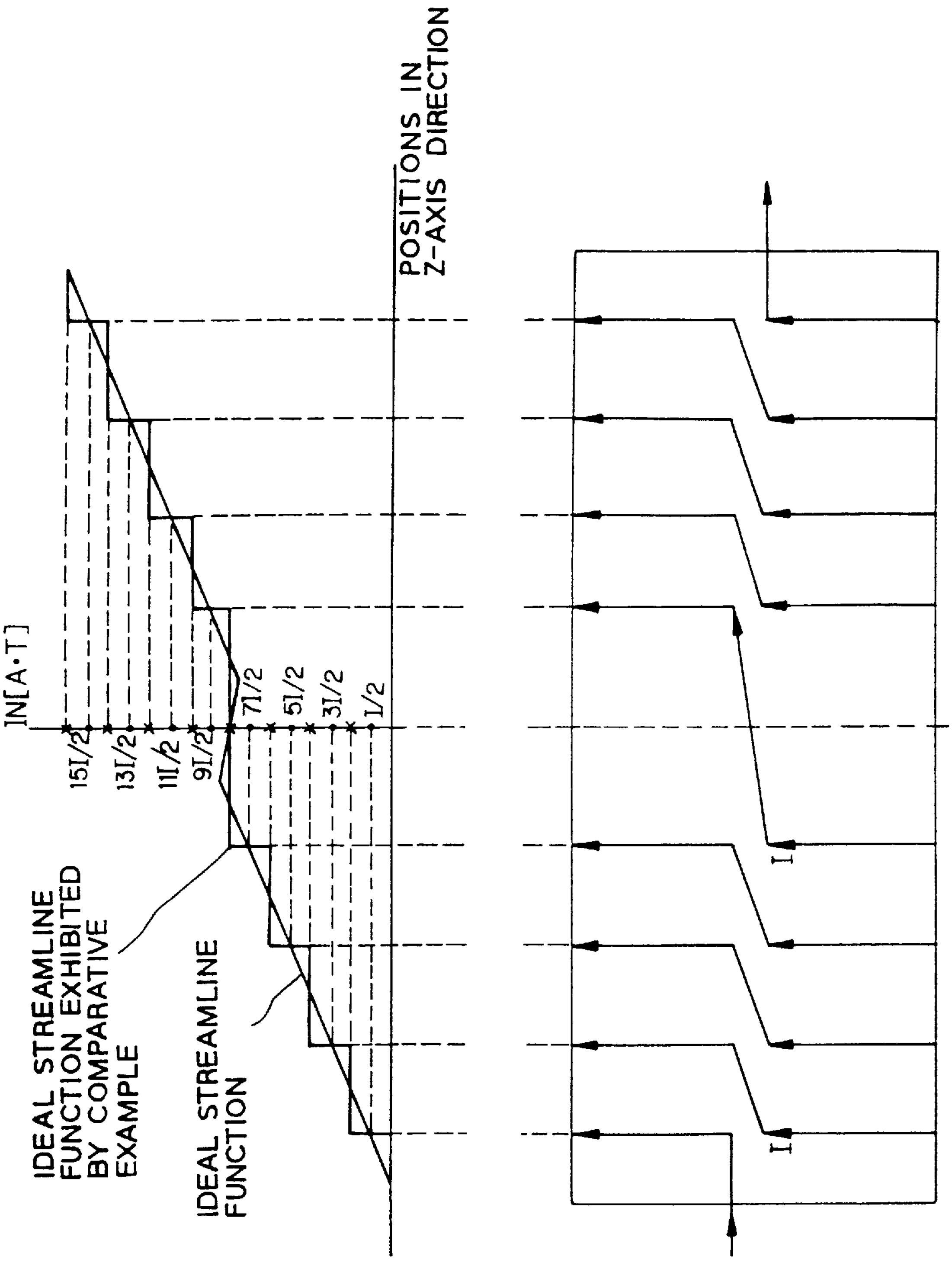
FIG. 42 is a diagram showing a streamline function exhibited by a shim coil for producing magnetic fields directed in the Z-axis direction and the positions of windings forming the coil for comparison with and explanation of the structure shown in FIG. 41.

FIG. 41 shows a model indicating the positions of windings forming a shim coil 13Z for producing magnetic fields directed in the Z-axis direction. As illustrated, fractional turns $FT_{D-1}$ and $FT_{D-2}$ in accordance with the present invention are formed in the center in the Z-axis direction. Specifically, the fractional turn $FT_{D-1}$ on the left side in the Z-axis direction in (b) of FIG. 41 is composed of shunt windings F12-1 and F13-1 located at positions −Za and −Zb in the Z-axis direction which are associated with currents 13I/4 and 15I/4 by a streamline function. The fractional turn $FT_{D-2}$ on the right side in the Z-axis direction is composed of shunt windings F13-2 and F12-2 located at positions Zb and Za in the Z-axis direction which are associated with currents 17I/4 and 19I/4 by the streamline function. A left-hand winding F11-1 associated with a current 5I/2 associated with a current 5I/2 by the streamline function is linked to one fractional turn $FT_{D-1}$. The fractional turn $FT_{D-1}$ is linked to the other fractional turn $FT_{D-2}$ by way of a crossover running in the Z-axis direction. The fractional turn $FT_{D-2}$ reaches a right-hand winding F11-2 associated with a current 11I/2 by the streamline function. The lengths of the shunt windings F12 and F13 of the fractional turn $FT_{D-1}$ or $FT_{D-2}$ should preferably be set to the same value, and the resistances thereof should preferably be set to the same value.

By thus replacing part of turns with fractional turns $FT_D$, as shown in (a) of FIG. 41, the transition of the streamline function NI from a point 13I/4[A·T] to a point 19I/4[A·T] becomes smoother than that of a function exhibited by coils having known windings. The streamline function approaches more closely to an ideal (desired) streamline function. When a state of windings shown in (b) of FIG. 42 (identical to the state shown in (b) of FIG. 41 except that normal turns for conducting the current I are substituted for the fractional turns $FT_{D-1}$ and $FT_{D-2}$) is expressed using a streamline function as shown in (a) of FIG. 42 for comparison, it will be apparent that the streamline function is improved with addition of the fractional turns. Consequently, the performance of the shim coil 13Z, which is an integrant part of the Z channel, for homogenizing a static magnetic field can be improved.

A given number of fractional turns may be formed at any positions in the Z-axis direction. Moreover, the fractional turns can be added irrespective of the order of a shim coil unit, that is, the number of inhomogeneities to be shimmed by the shim coil unit, and can be adapted to any of channels XY, $X^2-Y^2$, $Z^3$, Z, X, Y, ZXY, $Z(X^2-Y^2)$, and so on.

Various embodiments have been described by exemplifying various coils employed in a horizontal magnetic field system in which a static magnetic field is generated in a horizontal direction. The present invention is not limited by the system of generating the static magnetic field. The present invention can be implemented in various coils (static coil, shim coils, gradient coils, and radio-frequency coil) employed in, for example, a vertical magnetic field system in which the static magnetic field is, as shown in FIGS. 43 and 44, generated in a vertical direction.

Figure 43:
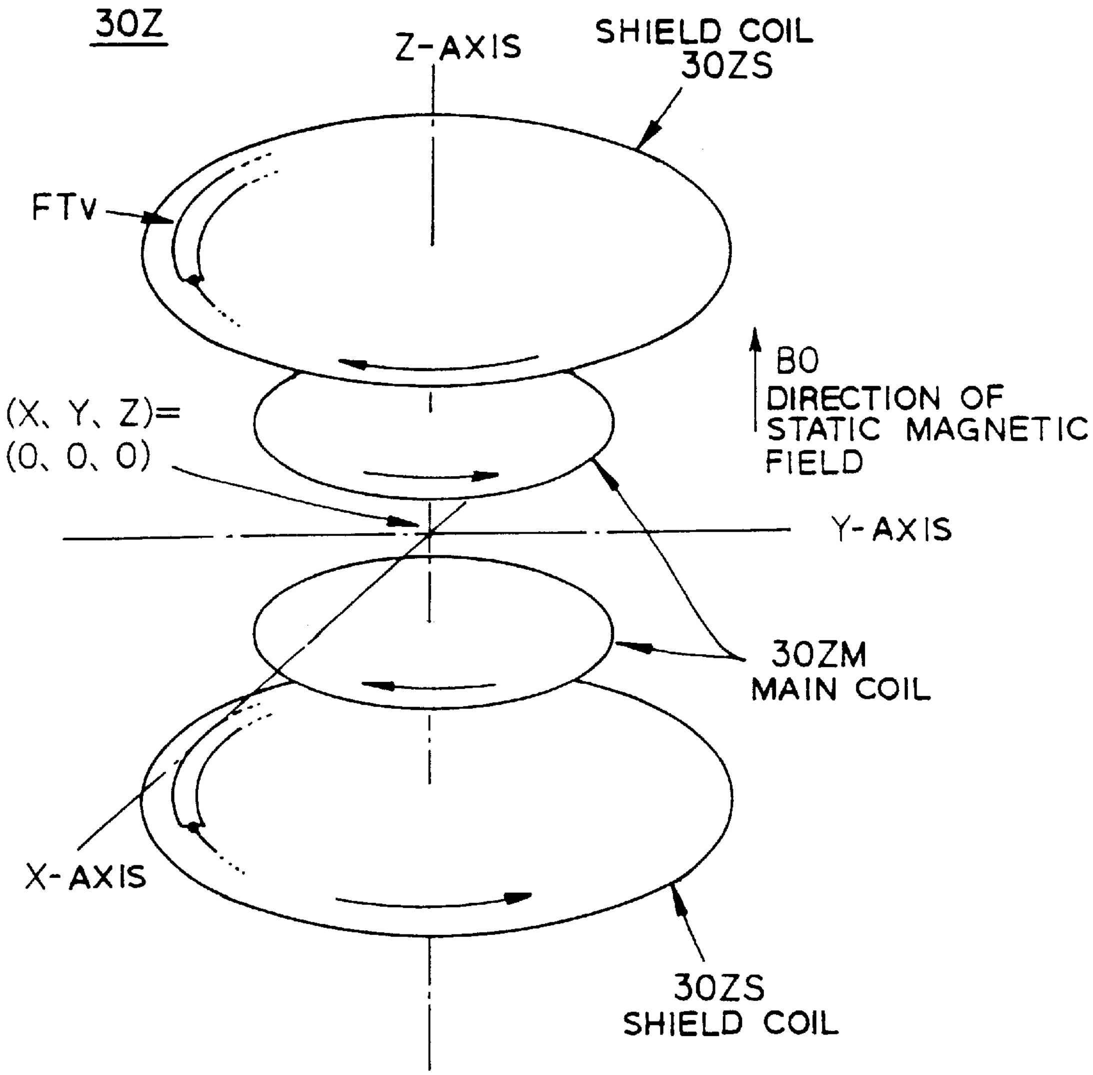
FIG. 43 is a schematic view of a model of a Z channel of an ASGC unit employed in a vertical magnetic field system, showing another embodiment.
Figure 44:
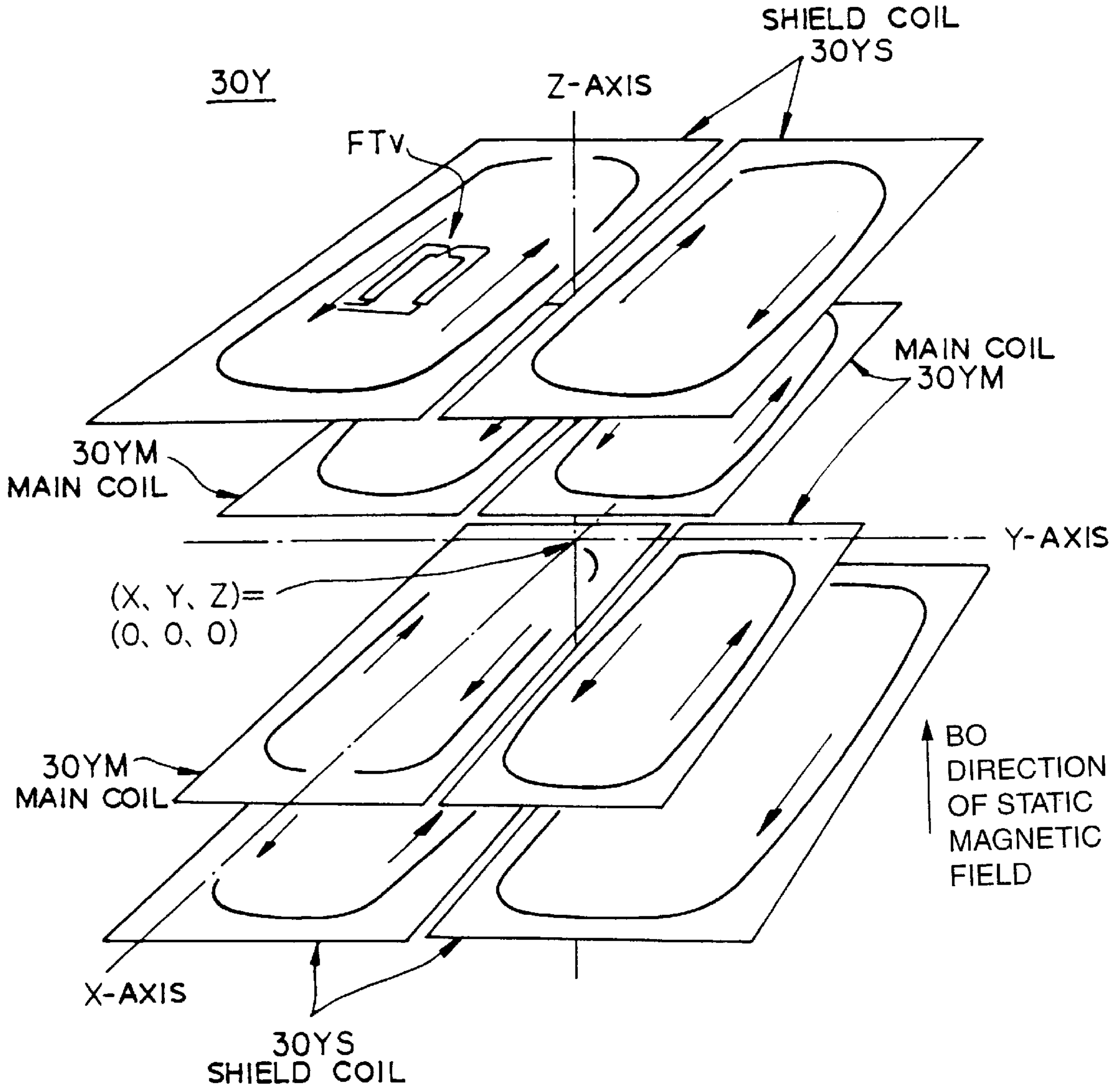
FIG. 44 is a schematic view of a model of a Y channel of the ASGC unit employed in a vertical magnetic field system, showing another embodiment.

FIG. 43 shows the outline structure of a Z coil assembly 30Z of an ASGC unit employed in the vertical magnetic field system, and FIG. 44 shows the outline structure of a Y coil assembly 30Y thereof. In FIG. 43, there are shown a main coil 30ZM and a shield coil 30ZS. In FIG. 44, there are shown a main coil 30YM and a shield coil 30YS. Fractional turns $FT_v$ similar to the aforesaid fractional turns are implemente in at least part of the coil segments of the main coils and/or shield coils, whereby the same operation and effect as the aforesaid ones can be exerted.

In the case of a method of creating a coil by corroding a copper plate, such as, by performing etching, a portion of a conductor having a larger width is created. In general, therefore, as far as an MRI system of an EPI type which requires fast switching is concerned, eddy currents induced in a conductor cannot be ignored. Such a coil created by performing etching is therefore unacceptable. Even in this case, a distribution of currents can approach an ideal distribution by adopting the aforesaid method (for example, when a litz wire made by twisting thin wires is used as a wire, eddy currents induced in the wire itself due to fast switching or the like will pose no problem). In other words, even when a coil is created by performing etching, part of turns forming the coil can be regarded as a straight angle wire having a large width. A turn can therefore be divided into portions in the same manner as mentioned above. Specifically, for example, the width of a turn located at an edge can be narrowed and the number of turns forming a spiral can be reduced. For realizing crossings of windings according to the present invention in the course of creating a coil through etching, the copper in, for example, a circular portion drawn with a dot-dash line in FIG. 35 is corroded in advance, and the conductors are linked by two wires having a thickness t/2 in the same manner as shown in FIG. 35. Even when such a coil creating method as etching or milling is adopted, a coil pattern closer to an ideal pattern can be created by adopting fractional turns of the present invention.

In the aforesaid embodiments and their variants, fractional turns have been described as turns for conducting a current I/n (n is equal to or larger than 2). However, the present invention is not limited to this form. Assuming, for example, that the current is divided into two portions, the width of one turn is made twice as large as that of the other turn (the thickness is the same), and the ratio of the sectional areas S of the wires (or conductors) of the windings are set to 2:1 (the ratio of resistances is 1:2). Thus, although the number of turn divisions, n, is 2, the currents flowing through the turns are 2I/3 and I/3. Namely, fractional turns one of which carries a larger amount of current can be created. This leads to higher freedom in designing a coil using fractional turns. A desired distribution of magnetic fields can be attained readily.

Figure 3:
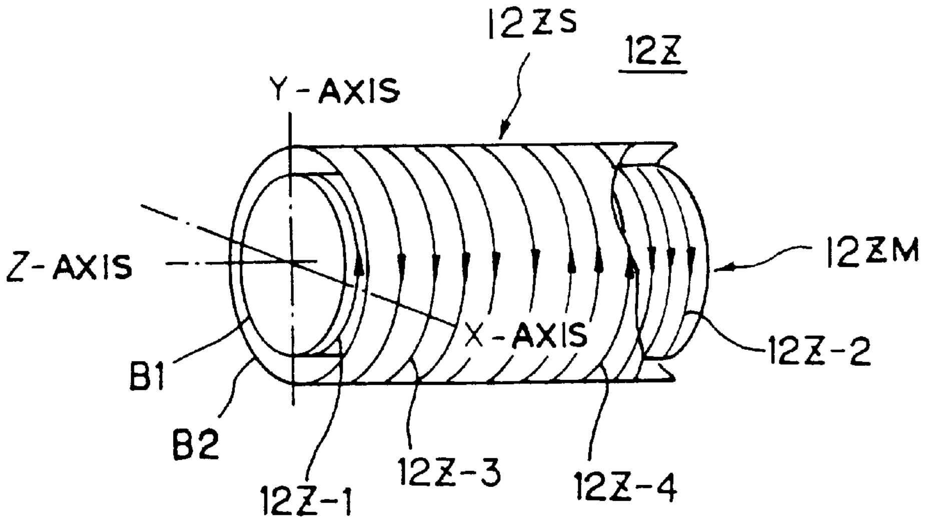
FIG. 3 is an oblique view showing the schematic structure of a Z coil assembly of an actively shielded type included in the gradient coil unit.
Figure 4:
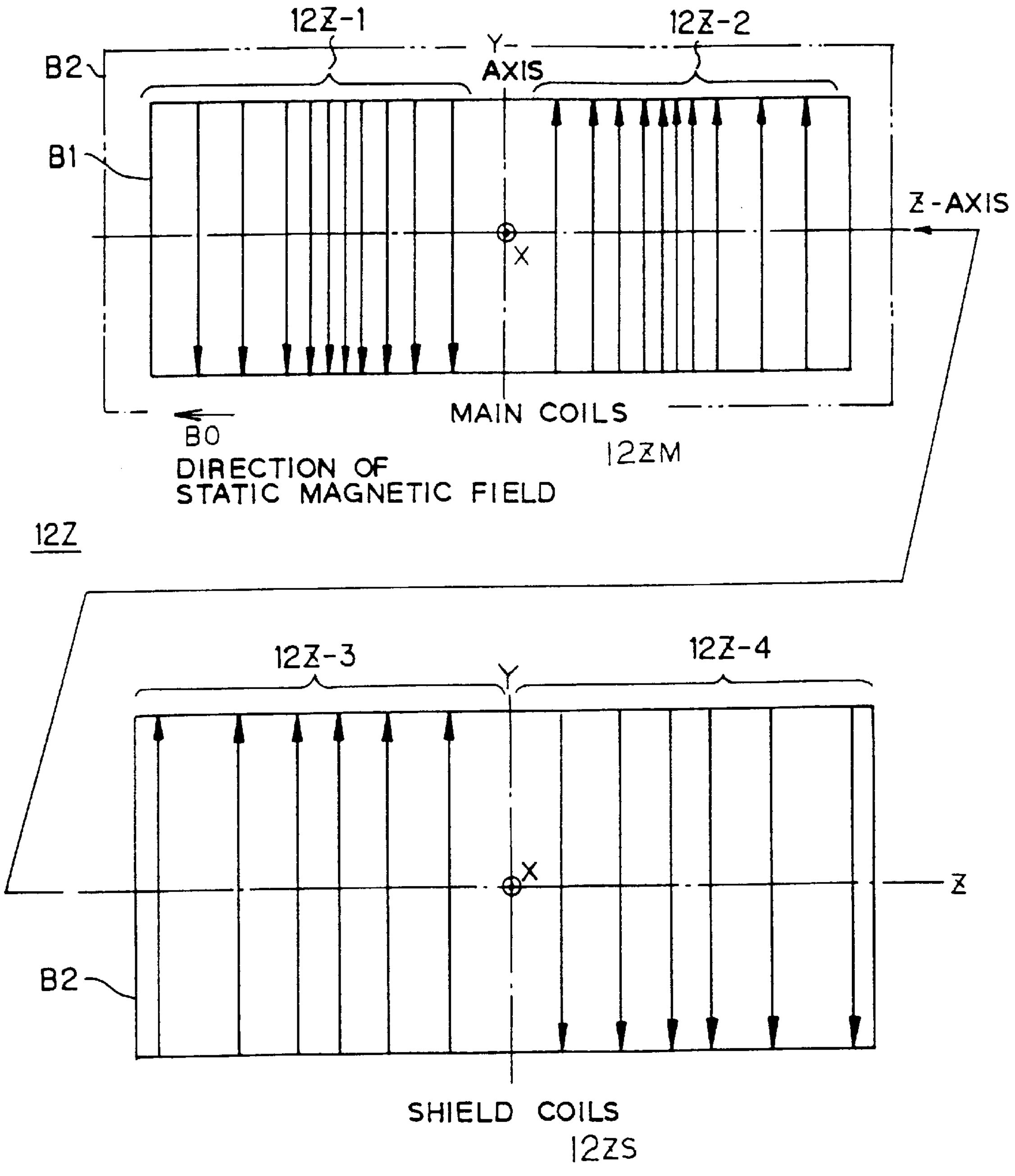
FIG. 4 is a diagram showing the arrangement of windings in the Z-axis direction of a main coil and a shield coil of a Z coil assembly in accordance with the first embodiment.

Still, in the foregoing embodiments and their variations, the gradient coil unit is formed into an integrated type of unit, as shown in FIGS. 1 to 3, in which the main and shield coils are integrated as one unit. Application of the present invention, however, is not limited to such integrated type of gradient coil unit. For example, the present invention can suitably applied to a gradient coil unit formed such that a main and shield coils are physically separated to be installed at spatially separated positions set in a gantry.

Still further, the coil units having the fractional turn, which have been described in the second to tenth embodiments and their variations, may form based on conventional winding methods by which the winding positions are sequentially determined from the center in the Z-axis direction of a bobbin to each edge therein for a Z-channel gradient coil assembly, for example, instead of employing the winding method described in the first embodiment.

As described so far, for winding a conductor around a bobbin to coil segment, the winding positions on the bobbin may be sequentially determined from the outermost end position in the axial direction of the bobbin toward the axial center therein with a given current step value such as main coil drive current. Further, a magnetic-field generation coil unit may include coil segments on which a conductor makes turns, and generates magnetic fields when a current is fed to the conductor. Shunt conductors for shunting a current, which is carried by the conductor, into a plurality of paths as a non-reversed or reversed fractional turn are included in the coil segments in relation to the pattern of turns of the conductor. A structure in which windings (wire) are distributed discontinuously can be maintained. Moreover, a distribution of magnetic fields to be generated actually can approach a desired continuous distribution, which is defined analytically, as closely as possible. Consequently, magnetic fields that are very precisely distributed spatially can be generated.

A power supply having a current-carrying capacity of a level accepted at present can be employed without the necessity of increasing the current-carrying capacity of the power supply for feeding a current to a coil unit. Under the conditions of the power supply, a structure in which windings (wire) are arranged in a layer and distributed discontinuously can be maintained, and a distribution of magnetic fields to be generated actually approach a desired continuous distribution, which is defined analytically, as closely as possible.

Furthermore, when a coil unit is provided with a shielding ability, the shielding ability can be fulfilled by suppressing magnetic leakage and magnetostriction, and unwanted eddy currents induced in surrounding metals can be minimized. A distribution of magnetic fields to be generated actually approaches to a desired distribution of magnetic fields, and induction of unwanted eddy currents in surrounding metals is suppressed. Thereby, ex post facto data correction for eliminating adverse effects of the eddy currents may still be carried out as an auxiliary countermeasure.

When the coil unit is adapted, for example, to a gradient coil unit, static coil unit, shim coil unit, or radio-frequency coil unit for, for example, an MRI system or MRS system, high-precision and high-quality MR images or MR data can be produced owing to such direct effects as nullified irregular sensitivity, improved linearity, and improved homogeneities.

What is claimed is:

1. A system for magnetic resonance imaging having:

a coil including a coil segment with a plurality of turns formed by winding a conductor on a bobbin having an axial direction in an elongated direction thereof, a magnetic field being generated by supplying current to the conductor, wherein a winding position for each turn on the bobbin has been determined sequentially from the turn positioned at an outermost end of the coil segment in the axial direction using a predetermined current step value to approximate an idealized continuous spatial distribution of current corresponding to a desired spatial distribution of magnetic field.

2. The system of claim 1, comprising an actively shielded gradient coil (ASGC) incorporating therein a Z coil having main and shield coils generating a magnetic field gradient in a Z-direction defined by an XYZ-coordinate set for the system, wherein the coil segment is installed in the shield coil.

3. The system of claim 2 wherein:

the shield coil includes at least two of the coil segments wound around the bobbin series electrical connection and disposed sequentially on the bobbin along the Z-direction wherein winding positions of the turns of such coil segments have been sequentially determined from each of axially outermost ends of the bobbin toward the axially center of the bobbin.

4. The system of claim 3, wherein the predetermined current step value equals the current being supplied to the main coil.

5. The system of claim 1, comprising a shunt element for shunting current carried by a turn of the wound conductor into a plurality of current path passing through a plurality f shunt paths in the coil segment.

6. The system of claim 5, comprising a static coil unit generating a static magnetic field, the static coil unit including the shunt element.

7. The system of claim 5, comprising a shim coil unit generating a magnetic field for correcting a static magnetic field, the shim coil unit including the shunt element.

8. The system of claim 5, wherein the plurality of shunt paths are formed so as to carry shunt current produced by evenly dividing current carried by the conductor by the number of shunt paths.

9. The system of claim 5, wherein the plurality of shunt paths are formed so as to carry different amounts of shunt current produced by unevenly dividing current carried by the conductor.

10. The system of claim 5, comprising means for generating a static magnetic field in which an object is placed;

means for generating a gradient magnetic field superposed on the static magnetic field;

means for transmitting an RF signal into the object and receiving a magnetic resonance (MR) signal from the object;

means for processing the MR signal into the MR data; and means for outputting the MR data, wherein the coil segment is included in at least one of the static magnetic field generating means and the gradient magnetic field generating means.

11. The system of claim 5, wherein each of the plurality of shunt paths is a parallel part of one complete turn of the coil.

12. The system of claim 5, wherein the plurality of shunt paths each have substantially equal impedance values.

13. The system of claim 12, wherein the shunt paths include a crossed structure in which the plurality of shunt paths cross with respect to each other in an insulated state.

14. The system of claim 12, wherein the plurality of shunt paths each have the same length.

15. The system of claim 14, wherein the plurality of shunt paths each have the same cross sectional area.

16. The system of claim 12, wherein the shunt paths include a crossed structure in which the plurality of shunt paths cross with respect to each other in an insulated state and each have the same length.

17. The system of claim 13, wherein the coil including the coil segment is incorporated in at least one of X, Y, and Z coil assemblies as an actively shielded gradient coil (ASGC) unit, the at least one coil assembly having a main coil generating a gradient field and a shield coil generating a shielding field for shielding the gradient field.

18. The system of claim 17, wherein the at least one coil assembly is the Z coil assembly and the shield coil of the Z coil assembly includes said coil segment.

19. A system for magnetic resonance imaging, said system comprising:

a coil including a coil segment having plural turns of a conductor on a bobbin having an axially elongated direction, a magnetic field being generated by supplying current to the conductor, wherein at least one turn of the coil includes a shunt element for shunting current carried by the wound conductor into a plurality of current flows passing through a plurality of shunt paths.

20. The system of claim 19 wherein two of said shunt paths are branched within a turn at a first position in the conductor and joined together at another second position in the conductor.

21. The system of claim 20, wherein the two shunt paths are wound so as to produce two shunt current flows passing in the same turn direction.

22. The system of claim 20, wherein the two shunt paths are wound so as to produce two shunt current flows passing in mutually-opposite directions.

23. The system of claim 19 wherein the shunt element is serially inserted into the conductor as an alternative to its nominal path if wound in agreement with a calculated pattern of turns without the shunt element.

24. The system of claim 23, wherein the conductor of the coil segment is wound in a one layer thickness on the bobbin.

25. The system of claim 24, wherein a plurality of said coil segments which provide a saddle type coil.

26. The system of claim 19 wherein the shunt element is additionally attached to the coil segment as part of a turn of the conductor.

27. The system of claim 26, wherein the coil segment is formed into a solenoidal coil segment.

28. The system of claim 19 wherein a gradient coil unit incorporates said coil segment.

29. The system of claim 28, wherein the gradient coil unit comprises X, Y, and Z coil assemblies generating gradients in X-, Y-, and Z-directions respectively, and at least one of the coil assemblies includes the coil segment.

30. The system of claim 29, wherein the gradient coil unit is an actively shielded gradient coil (ASGC) unit and the at least one coil assembly comprises a main coil generating a gradient and a shield coil generating a magnetic field for shielding the gradient.

31. The system of claim 30, wherein the at least one coil assembly is a Z coil assembly having main and shield coils and at least one of the main and shield coils includes the coil segment.

32. The system of claim 31, wherein the shield coil includes the coil segment.

33. The system of claim 32, wherein each of the main and shield coils are formed into a solenoidal coil comprising two solenoidal coil segments arranged in series on the bobbin and the shunt element is within the shield coil at at least one axial end portion and an axial center portion of the bobbin.

34. The system of claim 33, wherein the shunt element includes two shunt paths branched from the conductor at a first position and joined together at another second position along the conductor.

35. The system of claim 33 wherein the shunt element is positioned in the shield coil at an axial center portion of the coil, the shunt element including a first shunt element included in one of the two solenoidal coil segments and wound around the bobbin toward a first circumferential direction thereof and a second shunt element attached to the remaining one of the two solenoidal coil segments and wound around the bobbin along a second circumferential direction thereof opposed to the first circumferential direction, the first shunt element bridging over an axial center position to the second shunt element on the bobbin.

36. The system of claim 35, wherein one of the plurality of shunt paths is wound at approximately the axial center.

37. The system of claim 30, wherein at least one coil assembly is either an X coil assembly or a Y coil assembly having main and shield coils and wherein at least the shield coil includes the coil segment, each of the main and shield coils including two pairs of saddle-type coil segments wound on the bobbin, and a pattern of the coil segment turns are disposed in a spiral shape and the shunt element as at least part of a turn of the spiral shape.

38. The system of claim 19, wherein the plurality of shunt paths have substantially equal impedance values.

39. The system of claim 38 wherein the plurality of shunt paths intersect each other in an insulated state.

40. The system of claim 38 wherein the plurality of shunt paths are the same in length.

41. The system of claim 38 wherein the plurality of shunt paths are the same in length and intersect each other in an insulated state.

42. The system of claim 41, wherein each of the plurality of shunt paths is reduced to a half of the conductor in thickness.

43. The system of claim 38 wherein both the conductor and the shunt paths are formed from a flat-plate-like wire of rectangular cross section, the wire being wound around the bobbin in a single layer.

44. The system of claim 19, comprising a static coil unit for generating a static magnetic field serving as the magnetic field and wherein the static coil unit includes the shunt element.

45. The system of claim 19, comprising a shim coil unit for generating a shimming magnetic field correcting a static magnetic field, the shim coil unit including the shunt element.

46. An electromagnetic coil for use in a magnetic resonance imaging or spectroscopy system, said electromagnetic coil comprising:

a plurality of conductive turns disposed in discrete positions within a single layer thickness on a bobbin structure having an axial dimension;

the discrete position on the bobbin of each conductive turn from a first end turn position along the axial dimension toward a center turn position having been successively determined so as to approximate a desired predetermined continuously distributed current distribution.

47. An electromagnetic coil as in claim 46 wherein at least a portion of at least one said turn of the coil comprises plural discrete parallel-connected shunt conductors spatially spaced apart on said bobbin so as to more accurately approximate the predetermined continuously distributed current distribution.

48. An electromagnetic coil as in claim 46 which constitutes at least part of a static polarizing magnet.

49. An electromagnetic coil as in claim 46 which constitutes at least part of a gradient magnet.

50. An electromagnetic coil as in claim 46 which constitutes at least part of an actively shielded gradient coil.

51. An electromagnetic coil as in claim 46 which constitutes at least part of a shim coil.

52. An electromagnetic coil as in claim 47 which constitutes at least part of a static polarizing magnet.

53. An electromagnetic coil as in claim 47 which constitutes at least part of a gradient magnet.

54. An electromagnetic coil as in claim 47 which constitutes at least part of an actively shielded gradient coil.

55. An electromagnetic coil as in claim 47 which constitutes at least part of a shim coil.

56. An electromagnetic coil as in claim 47 wherein said parallel-connected shunt conductors comprise a fractional turn.

57. An electromagnetic coil as in claim 47 wherein said parallel-connected shunt conductors comprise a reversed fractional turn.

58. An electromagnetic coil as in claim 47 wherein said parallel-connected shunt conductors are of reduced thickness compared to the other conductor in at least one area whereat they are spatially crossed over and under each other in an insulated state between different discrete positions on the bobbin.

59. A magnetic resonance imaging system including an electromagnetic coil as in claim 46.

60. A magnetic resonance imaging system including an electromagnetic coil as in claim 47.

61. An electromagnetic coil for use in a magnetic resonance imaging or spectroscopy system, said electromagnetic coil comprising:

a plurality of conductive turns disposed in discrete positions within a single layer thickness on a bobbin structure having an axial dimension;

wherein at least a portion of at least one said turn of the coil comprises plural discrete parallel-connected shunt conductors spatially spaced apart on said bobbin so as to more accurately approximate the predetermined continuously distributed current distribution.

62. An electromagnetic coil as in claim 61 which constitutes at least part of a static polarizing magnet.

63. An electromagnetic coil as in claim 61 which constitutes at least part of a gradient magnet.

64. An electromagnetic coil as in claim 61 which constitutes at least part of an actively shielded gradient coil.

65. An electromagnetic coil as in claim 61 which constitutes at least part of a shim coil.

66. An electromagnetic coil as in claim 61 wherein said parallel-connected shunt conductors comprise a fractional turn.

67. An electromagnetic coil as in claim 61 wherein said parallel-connected shunt conductors comprise a reversed fractional turn.

68. An electromagnetic coil as in claim 61 wherein said parallel-connected shunt conductors are of reduced thickness compared to the other conductor in at least one area whereat they are spatially crossed over and under each other in an insulated state between different discrete positions on the bobbin.

69. A magnetic resonance imaging system including an electromagnetic coil as in claim 61.

70. A magnetic resonance imaging system including an electromagnetic coil as in claim 61.

* * * * *